(12) United States Patent
Kim et al.

(10) Patent No.: US 12,433,130 B2
(45) Date of Patent: Sep. 30, 2025

(54) COLOR CONVERTING SUBSTRATE AND DISPLAY DEVICE COMPRISING SAME

(71) Applicant: Samsung Display Co., LTD., Yongin-si (KR)

(72) Inventors: In Ok Kim, Osan-si (KR); Keun Chan Oh, Hwaseong-si (KR); Sun Kyu Joo, Suwon-si (KR); Jang Soo Kim, Asan-si (KR); Jae Cheol Park, Hwaseong-si (KR); Jae Min Seong, Suwon-si (KR); You Sik Shin, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 440 days.

(21) Appl. No.: 18/016,970

(22) PCT Filed: Oct. 13, 2020

(86) PCT No.: PCT/KR2020/013893
§ 371 (c)(1),
(2) Date: Jan. 19, 2023

(87) PCT Pub. No.: WO2022/019379
PCT Pub. Date: Jan. 27, 2022

(65) Prior Publication Data
US 2023/0284501 A1 Sep. 7, 2023

(30) Foreign Application Priority Data
Jul. 22, 2020 (KR) .................. 10-2020-0091084

(51) Int. Cl.
*H10K 59/38* (2023.01)
*H10K 59/80* (2023.01)
*G02B 5/20* (2006.01)

(52) U.S. Cl.
CPC ............ *H10K 59/38* (2023.02); *H10K 59/879* (2023.02); *H10K 59/8792* (2023.02); *G02B 5/201* (2013.01); *H10K 59/877* (2023.02)

(58) Field of Classification Search
None
See application file for complete search history.

(56) References Cited

U.S. PATENT DOCUMENTS

| 10,163,940 B2 | 12/2018 | Kubota et al. |
| 2019/0348469 A1 | 11/2019 | Large |

FOREIGN PATENT DOCUMENTS

| KR | 1020170051640 | | 5/2017 |
| KR | 1020170131229 | A | 11/2017 |

(Continued)

OTHER PUBLICATIONS

International Search Report—PCT/KR2020/013893 dated Apr. 21, 2021.

*Primary Examiner* — Anthony Ho
(74) *Attorney, Agent, or Firm* — CANTOR COLBURN LLP

(57) ABSTRACT

A color converting substrate includes a substrate in which a first light transmitting area, a second light transmitting area, and a third light transmitting area are defined; a first stack disposed on the substrate and overlapping the first light transmitting area, the second light transmitting area, and the third light transmitting area; a first color filter disposed on the first stack and overlapping the first light transmitting area; a second color filter overlapping the second light transmitting area; a third color filter overlapping the third light transmitting area; and a second stack disposed between the first stack and at least one of the second color filter and the third color filter.

22 Claims, 70 Drawing Sheets

(56) References Cited

FOREIGN PATENT DOCUMENTS

| | | |
|---|---|---|
| KR | 1020180107443 | 10/2018 |
| KR | 1020190088587 | 7/2019 |
| KR | 1020200030147 | 3/2020 |
| KR | 1020200083879 | 7/2020 |
| KR | 1020200084967 | 7/2020 |

FIG. 1
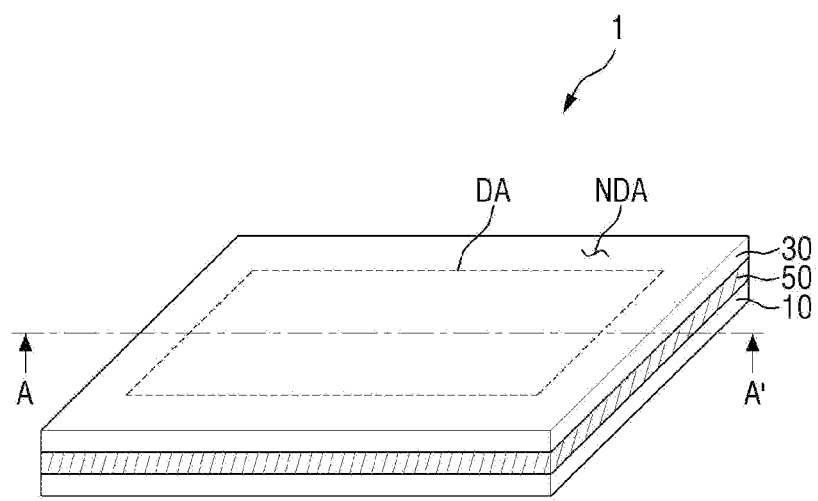
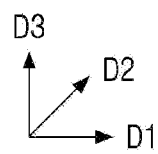

FIG. 9
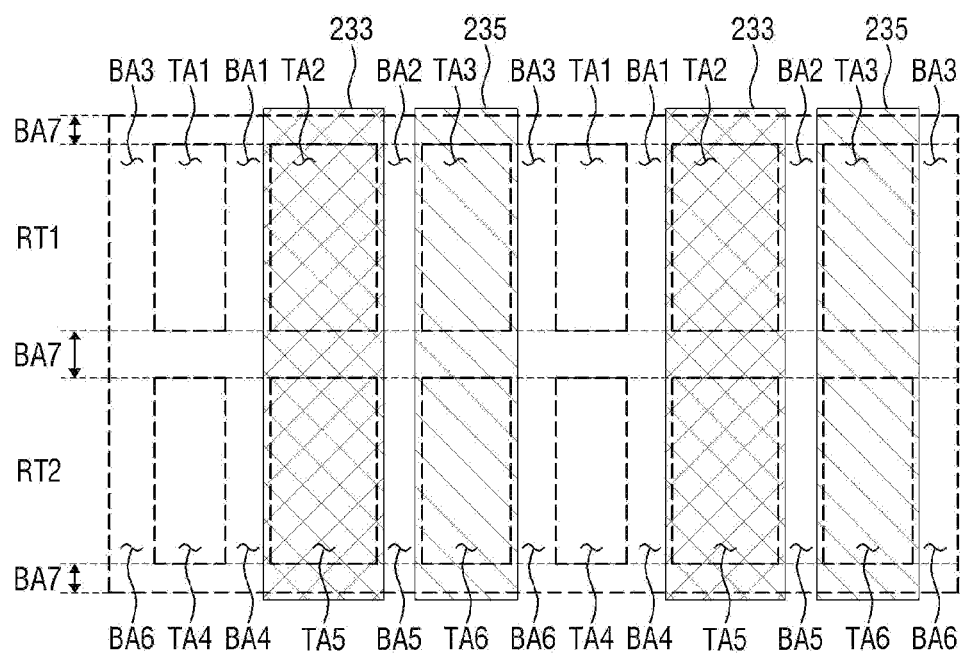
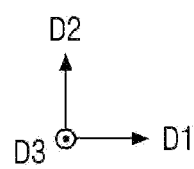
BA : BA1, BA2, BA3, BA4, BA5, BA6, BA7

FIG. 33
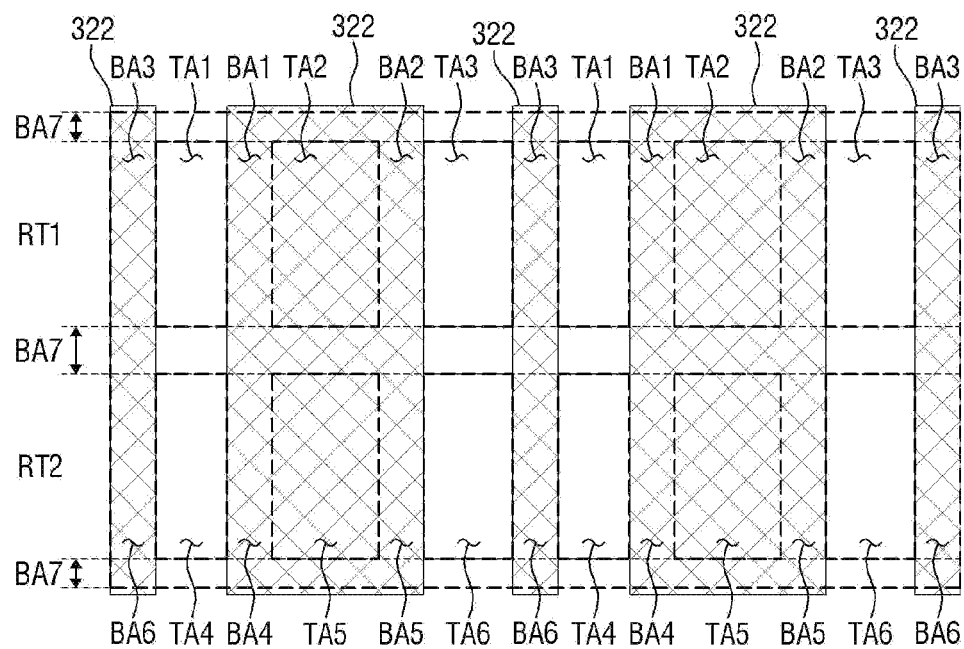
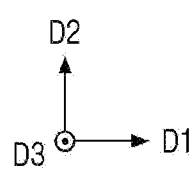
BA : BA1, BA2, BA3, BA4, BA5, BA6, BA7

COLOR CONVERTING SUBSTRATE AND DISPLAY DEVICE COMPRISING SAME

CROSS-REFERENCE TO RELATED APPLICATION

This application is a national stage application of the international Patent Application No. PCT/KR2020/013893 claiming priority to Korean Patent Application No. 10-2020-0091084, filed on Jul. 22, 2020, and all the benefits accruing therefrom under 35 U.S.C. § 119, the content of which in its entirety is herein incorporated by reference.

TECHNICAL FIELD

The disclosure relates to a color conversion substrate and a display device including the same.

BACKGROUND ART

The importance of display devices is gradually increasing with the development of multimedia. In response to the importance of the display device, various display devices such as a liquid crystal display device (LCD) and an organic light emitting diode display device (OLED) have been developed.

Among the display devices, a self-light-emitting display device includes a self-light-emitting element, e.g., an organic light emitting element. The self-light-emitting element may include two opposing electrodes and a light emitting layer interposed therebetween. When the self-light-emitting element is the organic light emitting element, electrons and holes provided from the two electrodes may be recombined in the light emitting layer to generate excitons, the generated excitons may be changed from an excited state to a ground state, and light may be emitted.

The self-light-emitting display device that does not desire a light source, such as a backlight unit, has low power consumption and may be configured in a lightweight and thin shape, and has also attracted attention as a next-generation display device because of its high quality characteristics such as a wide viewing angle, high luminance and contrast, and a fast response speed.

DISCLOSURE

Technical Problems

Features of the disclosure provide a display device capable of improving display quality by reducing a reflectance of external light.

It should be noted that features of the disclosure are not limited thereto and other features, which are not mentioned herein, will be apparent to those of ordinary skill in the art from the following description.

Technical Solutions

According to an embodiment of the disclosure, a color conversion substrate comprises a substrate on which a first light transmitting area, a second light transmitting area, and a third light transmitting area are defined, a first stack disposed on the substrate and overlapping the first light transmitting area, the second light transmitting area, and the third light transmitting area, a first color filter, a second color filter, and a third color filter disposed on the first stack, the first color filter overlapping the first light transmitting area, the second color filter overlapping the second light transmitting area, and the third color filter overlapping the third light transmitting area, and a second stack disposed between at least one of the second color filter and the third color filter and the first stack, a refractive index of the first stack has a value between a refractive index of the substrate and a refractive index of the first color filter, and the refractive index of the first stack is smaller than a refractive index of the second stack.

The second stack extends from at least one of the second light transmitting area and the third light transmitting area to overlap the first light transmitting area.

The second stack is disposed between the first stack and the second color filter in the second light transmitting area, and is disposed between the first stack and the third color filter in the third light transmitting area.

The second stack is disposed between the first stack and the second color filter in the second light transmitting area, and does not overlap the first light transmitting area and the third light transmitting area.

The color conversion substrate may further comprise a third stack disposed on the first stack, wherein the third stack is disposed between the first stack and the third color filter in the third light transmitting area.

The third stack extends from the third light transmitting area to overlap the first light transmitting area and the second light transmitting area.

A refractive index of the third stack has a value between the refractive index of the first stack and a refractive index of the third color filter.

According to an embodiment of the disclosure, a color conversion substrate comprises a substrate on which a first light transmitting area, a second light transmitting area, and a third light transmitting area are defined, a first color filter disposed on the substrate and overlapping the first light transmitting area, a second color filter disposed on the substrate and overlapping the second light transmitting area, and a third color filter disposed on the substrate and overlapping the third light transmitting area, and a second stack disposed between at least one of the second color filter and the third color filter and the second substrate, wherein a refractive index of the second stack has a value between a refractive index of the substrate and a refractive index of at least one of the second color filter and the third color filter.

The color conversion substrate may further comprise a first stack overlapping the first light transmitting area, disposed between the substrate and the first color filter, and non-overlapping the second light transmitting area and the third light transmitting area.

The second stack extends from at least one of the second light transmitting area and the third light transmitting area to overlap the first light transmitting area.

A refractive index of the first stack has a value between the refractive index of the substrate and a refractive index of the first color filter, and the refractive index of the first stack is smaller than the refractive index of the second stack.

The second stack is disposed between the substrate and the second color filter in the second light transmitting area, and is disposed between the substrate and the third color filter in the third light transmitting area.

The second stack is disposed between the substrate and the second color filter in the second light transmitting area, and does not overlap the first light transmitting area and the third light transmitting area.

The color conversion substrate may further comprise a third stack disposed on the second substrate, wherein the third stack is disposed between the substrate and the third color filter in the third light transmitting area.

The third stack extends from the third light transmitting area to overlap the first light transmitting area and the second light transmitting area.

A refractive index of the third stack has a value between the refractive index of the substrate and a refractive index of the third color filter.

According to an embodiment of the disclosure, a display device comprises a substrate on which a first light transmitting area, a second light transmitting area, and a third light transmitting area are defined, a first color filter, a second color filter, and a third color filter disposed on the second substrate, the first color filter overlapping the first light transmitting area, the second color filter overlapping the second light transmitting area, and the third color filter overlapping the third light transmitting area, a second stack disposed between at least one of the first color filter, the second color filter, and the third color filter and the second substrate, and a first stack disposed between the substrate and the second stack and overlapping the first light transmitting area, the second light transmitting area, and the third light transmitting area, a refractive index of the first stack has a value between a refractive index of the substrate and a refractive index of the first color filter, and the refractive index of the first stack is smaller than a refractive index of the second stack.

The display device may further comprise a third stack disposed on the second substrate, wherein the third stack is disposed between the substrate and the third color filter in the third light transmitting area.

The third stack extends from the third light transmitting area to overlap the first light transmitting area and the second light transmitting area.

A refractive index of the third stack has a value between the refractive index of the substrate and a refractive index of the third color filter.

The display device may further comprise a light transmission pattern disposed on the first color filter and overlapping the first light transmitting area, a first wavelength conversion pattern disposed on the second color filter and overlapping the second light transmitting area, and a second wavelength conversion pattern disposed on the third color filter and overlapping the third light transmitting area.

The first wavelength conversion pattern and the second wavelength conversion pattern include a base resin, and a wavelength shifter and a scatterer dispersed in the base resin, and the wavelength shifter is a quantum dot.

Advantageous Effects

According to embodiments of the disclosure, it is possible to provide a color conversion substrate capable of improving display quality by reducing a reflectance of external light.

Further, according to embodiments of the disclosure, a display device with improved display quality may be provided.

The effects according to the disclosure is not limited by the contents exemplified above, and more various effects are included in this disclosure.

BRIEF DESCRIPTION OF DRAWINGS

FIG. 1 is a schematic perspective view of a display device according to an embodiment;
FIG. 9 is a plan view schematically illustrating a second color filter of the color conversion substrate illustrated in FIG. 6;
FIG. 33 is a plan view schematically illustrating a second stack of the color conversion substrate illustrated in FIG. 32.

MODE FOR INVENTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, embodiments of the disclosure will be described with reference to the accompanying drawings.

Figure 2:
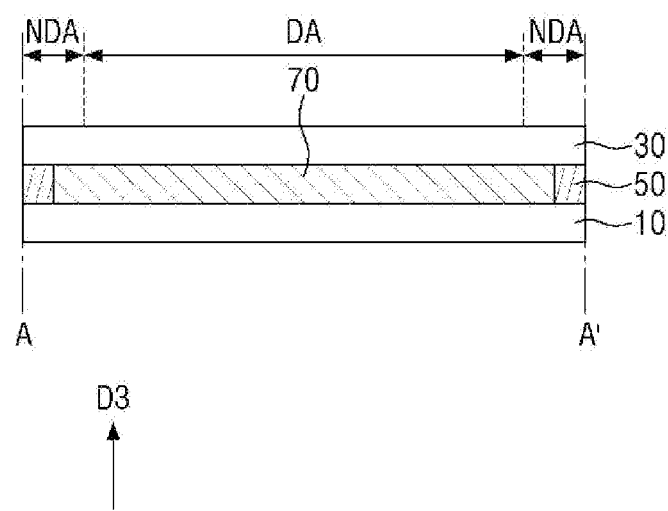
FIG. 2 is a schematic cross-sectional view taken along line A-A' of FIG. 1.

FIG. 1 is a schematic perspective view of a display device according to an embodiment, and FIG. 2 is a schematic cross-sectional view taken line A-A' of FIG. 1.

Referring to FIGS. 1 and 2, a display device 1 may be applied to various electronic devices such as small and medium-sized electronic equipment such as tablet personal computers (PCs), smartphones, car navigation units, cameras, central information displays (CIDs) provided in automobiles, wristwatch-type electronic devices, personal digital assistants (PDAs), portable multimedia players (PMPs), and game machines, medium and large-sized electronic equipment such as televisions, external billboards, monitors, personal computers, notebook computers, or the like. These electronic devices are presented only as examples, and the display device 1 may also be employed in other electronic devices without departing from the concept of the disclosure.

According to an embodiment, the display device 1 may have a rectangular shape in a plan view. The display device 1 may include two first sides extending in a first direction D1 and two second sides extending in a second direction D2 intersecting the first direction D1. A corner where the first side and the second side of the display device 1 meet may be a right angle, but is not limited thereto, and may form a curved surface. According to an embodiment, the first side may be shorter than the second side, but is not limited thereto. The shape of the display device 1 in a plan view is not limited to the illustrated shape, and a circular shape or other shapes may also be applied.

The display device 1 may include a display area DA in which an image is displayed and a non-display area NDA in which an image is not displayed. According to an embodiment, the non-display area NDA may be disposed around the display area DA and surround the display area DA.

Unless otherwise defined, herein, "on", "upper side", "upper portion", "top", and "upper surface" refer to a direction in which an arrow in the drawing is directed in a third direction D3 intersecting the first direction D1 and the second direction D2 based on the drawing, and "below", "lower side", "lower portion", "bottom", and "lower surface" refer to a direction opposite to the direction in which the arrow in the third direction D3 is directed based on the drawing.

A schematic stacked structure of the display device 1 will be described. According to an embodiment, the display device 1 includes a display substrate 10 and a color conversion substrate 30 facing the display substrate 10, and may further include a sealing portion 50 coupling the display substrate 10 and the color conversion substrate 30, and a filler 70 filled between the display substrate 10 and the color conversion substrate 30.

The display substrate 10 may include a device and circuits for displaying an image, e.g., a pixel circuit such as a switching element, a pixel defining film defining a light emitting area and a non-light-emitting area to be described later in the display area DA and a self-light-emitting element. According to an embodiment, the self-light-emitting element may include at least one of an organic light emitting diode, a quantum dot light emitting diode, an inorganic material-based micro light emitting diode (e.g., a micro-LED), and an inorganic material-based nano light emitting diode (e.g., a nano-LED). Hereinafter, for convenience of explanation, a case where the self-light-emitting element is an organic light emitting diode will be described by way of example.

The color conversion substrate 30 may be disposed on the display substrate 10 and may face the display substrate 10. According to an embodiment, the color conversion substrate 30 may include a color conversion pattern for converting a color of incident light. According to an embodiment, the color conversion pattern may include at least one of a color filter and a wavelength conversion pattern.

A sealing portion 50 may be disposed between the display substrate 10 and the color conversion substrate 30 in the non-display area NDA. The sealing portion 50 may be disposed along edges of the display substrate 10 and the color conversion substrate 30 in the non-display area NDA to surround the display area DA in a plan view. The display substrate 10 and the color conversion substrate 30 may be coupled to each other through the sealing portion 50.

According to an embodiment, the sealing portion 50 may include an organic material. In an embodiment, the sealing portion 50 may include an epoxy resin, for example, but is not limited thereto.

A filler 70 may be disposed in a space between the display substrate 10 and the color conversion substrate 30 surrounded by the sealing portion 50. The filler 70 may fill between the display substrate 10 and the color conversion substrate 30.

According to an embodiment, the filler 70 may include a material that may transmit light. According to an embodiment, the filler 70 may include an organic material. In an embodiment, the filler 70 may include a silicon organic material, an epoxy organic material, or the like, for example, but is not limited thereto. According to another embodiment, the filler 70 may be omitted.

Figure 3:
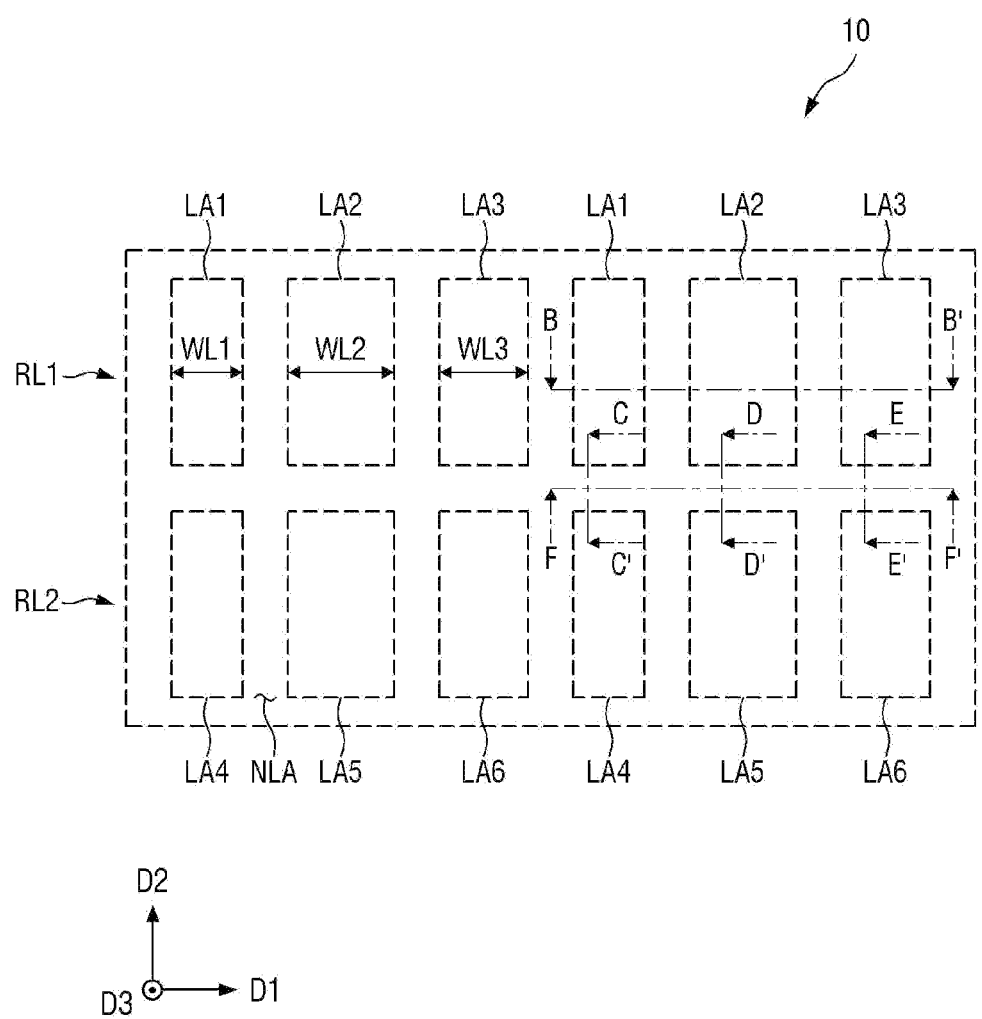
FIG. 3 is a plan view schematically illustrating a display area of a display substrate of the display device illustrated in FIGS. 1 and 2.
Figure 4:
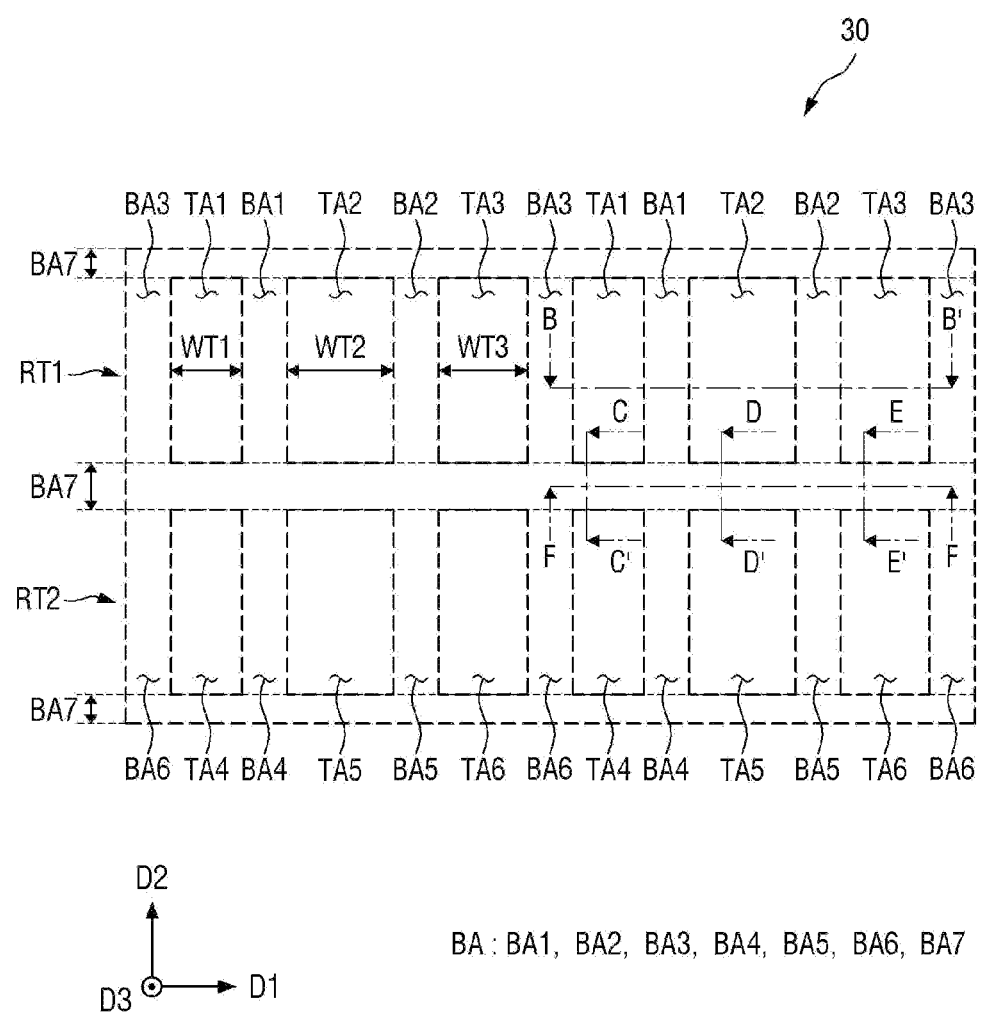
FIG. 4 is a plan view schematically illustrating a display area of a color conversion substrate of the display device illustrated in FIGS. 1 and 2.

FIG. 3 is a plan view schematically illustrating a display area of a display substrate of the display device illustrated in FIGS. 1 and 2, and FIG. 4 is a plan view schematically illustrating a display area of a color conversion substrate of the display device illustrated in FIGS. 1 and 2.

Referring further to FIGS. 3 and 4 in addition to FIGS. 1 and 2, a plurality of light emitting areas LA1, LA2, LA3, LA4, LA5, and LA6 and a non-light-emitting area NLA may be defined in the display area DA of the display substrate 10. The light emitting areas LA1, LA2, LA3, LA4, LA5, and LA6 may be areas in which light generated by the light emitting element of the display substrate 10 is emitted to the outside of the display substrate 10, and the non-light-emitting area NLA may be an area in which light is not emitted to the outside of the display substrate 10.

According to an embodiment, light emitted by the display substrate 10 to the color conversion substrate 30 in each of the light emitting areas LA1, LA2, LA3, LA4, LA5, and LA6 may be light of a first color. According to an embodiment, the light of the first color may be blue light, and may have a peak wavelength in the range of about 440 nanometers (nm) to about 480 nm. The peak wavelength may refer to a wavelength at which intensity is maximized within a wavelength region.

According to an embodiment, a first light emitting area LA1, a second light emitting area LA2, and a third light emitting area LA3 may be sequentially and repeatedly disposed along the first direction D1 in a first row RL1 of the display area DA of the display substrate 10. In addition, a fourth light emitting area LA4, a fifth light emitting area LA5, and a sixth light emitting area LA6 may be sequentially and repeatedly disposed along the first direction D1 in a second row RL2 adjacent to the first row RL1 along second direction D2.

According to an embodiment, the first light emitting area LA1 may have a predetermined first width WL1 in the first direction D1, the second light emitting area LA2 may have a predetermined second width WL2 in the first direction D1, and the third light emitting area LA3 may have a predetermined third width WL3 in the first direction D1. The first width WL1 of the first light emitting area LA1 may be smaller than the second width WL2 of the second light emitting area LA2 and the third width WL3 of the third light emitting area LA3. According to an embodiment, the second width WL2 of the second light emitting area LA2 and the third width WL3 of the third light emitting area LA3 may also be different from each other. In addition, the second width WL2 of the second light emitting area LA2 may be greater than the third width WL3 of the third light emitting area LA3. In addition, an area of the first light emitting area LA1 may be smaller than an area of the second light emitting area LA2 and an area of the third light emitting area LA3. The area of the second light emitting area LA2 may be greater than the area of the third light emitting area LA3. However, the embodiment is not limited to the above-described example, and for example, the area of the second light emitting area LA2 may be smaller than the area of the third light emitting area LA3.

According to another embodiment, the first width WL1 of the first light emitting area LA1, the second width WL2 of the second light emitting area LA2, and the third width WL3 of the third light emitting area LA3 may be substantially the same as each other. According to another embodiment, the area of the first light emitting area LA1, the area of the second light emitting area LA2, and the area of the third light emitting area LA3 may also be substantially the same.

The fourth light emitting area LA4 adjacent to the first light emitting area LA1 in the second direction D2 may be different from the first light emitting area LA1 only in that it is disposed in the second row RL2, and may have substantially the same width, area, and structure of the components disposed therein as those of the first light emitting area LA1. Similarly, the fifth light emitting area LA5 adjacent to the second light emitting area LA2 in the second direction D2 may have substantially the same structure as that of the second light emitting area LA2, and the sixth light emitting area LA6 adjacent to the third light emitting area LA3 in the second direction D2 may have substantially the same structure as that of the third light emitting area LA3.

A plurality of light transmitting areas TA1, TA2, TA3, TA4, TA5, and TA6 and a light blocking area BA may be defined in the display area DA of the color conversion substrate 30. The light transmitting areas TA1, TA2, TA3, TA4, TA5, and TA6 may be areas in which light emitted from the display substrate 10 transmits through the color conversion substrate 30 and is provided to the outside of the display device 1. The light blocking area BA may be an area through which light emitted from the display substrate 10 does not transmit.

According to an embodiment, a first light transmitting area TA1, a second light transmitting area TA2, and a third light transmitting area TA3 may be sequentially and repeatedly disposed along the first direction D1 in a first row RT1 of the display area DA of the color conversion substrate 30. The first light transmitting area TA1 may correspond to or overlap the first light emitting area LA1. Similarly, the second light transmitting area TA2 may correspond to or overlap the second light emitting area LA2, and the third light transmitting area TA3 may correspond to or overlap the third light emitting area LA3.

According to an embodiment, the light of the first color provided from the display substrate 10 may transmit through the first light transmitting area TA1, the second light transmitting area TA2, and the third light transmitting area TA3 and be provided to the outside of the display device 1. When light emitted from the first light transmitting area TA1 to the outside of the display device 1 is also referred to as first emitted light, light emitted from the second light transmitting area TA2 to the outside of the display device 1 is also referred to as second emitted light, and light emitted from the third light transmitting area TA3 to the outside of the display device 1 is also referred to as third emitted light, the first emitted light may be the light of the first color, the second emitted light may be light of a second color different from the first color, and the third emitted light may be light of a third color different from the first color and the second color. According to an embodiment, the light of the first color may be the blue light having the peak wavelength in the range of 440 nm to about 480 nm as described above, and the light of the second color may be red light having a peak wavelength in the range of about 610 nm to about 650 nm. In addition, the light of the third color may be green light having a peak wavelength in the range of about 510 nm to about 550 nm. However, the disclosure is not limited thereto, and the light of the second color may be green light and the light of the third color may be red light.

A fourth light transmitting area TA4, a fifth light transmitting area TA5, and a sixth light transmitting area TA6 may be sequentially and repeatedly disposed along the first direction D1 in a second row RT2 adjacent to the first row RT1 in the second direction D2. The fourth light transmitting area TA4 may correspond to or overlap the fourth light emitting area LA4, the fifth light transmitting area TA5 may correspond to or overlap the fifth light emitting area LA5, and the sixth light transmitting area TA6 may correspond to or overlap the sixth light emitting area LA6.

According to an embodiment, the first light transmitting area TA1 may have a predetermined first width WT1 in the first direction D1, the second light transmitting area TA2 may have a predetermined second width WT2 in the first direction D1, and the third light transmitting area TA3 may have a predetermined third width WT3 in the first direction D1. The first width WT1 of the first light transmitting area TA1 may be smaller than the second width WT2 of the second light transmitting area TA2 and the third width WT3 of the third light transmitting area TA3. According to an embodiment, the second width WT2 of the second light transmitting area TA2 and the third width WT3 of the third light transmitting area TA3 may also be different from each other. The second width WT2 of the second light transmitting area TA2 may be greater or less than the third width WT3 of the third light transmitting area TA3. In addition, according to an embodiment, an area of the first light transmitting area TA1 may be smaller than an area of the second light transmitting area TA2 and an area of the third light transmitting area TA3, and may be greater than the area of the second light transmitting area TA2 and the area of the third light transmitting area TA3.

However, the invention is not limited to the above-described examples. According to another embodiment, the first width WT1 of the first light transmitting area TA1, the second width WT2 of the second light transmitting area TA2, and the third width WT3 of the third light transmitting area TA3 may be substantially the same as each other. According to another embodiment, the area of the first light transmitting area TA1 may also be substantially the same as the area of the second light transmitting area TA2, and the area of the third light transmitting area TA3.

The first light transmitting area TA1 and the fourth light transmitting area TA4 adjacent to each other in the second direction D2 may have substantially the same width, area, structure of components disposed therein, and color of light emitted to the outside of the display device 1. Similarly, the second light transmitting area TA2 and the fifth light transmitting area TA5 adjacent to each other in the second direction D2 may have substantially the same structure, and may also have substantially the same color of light emitted to the outside of the display device 1. In addition, the third light transmitting area TA3 and the sixth light transmitting area TA6 adjacent to each other in the second direction D2 may have substantially the same structure, and may also have substantially the same color of light emitted to the outside of the display device 1.

The light blocking area BA may be disposed around the light transmitting areas TA1, TA2, TA3, TA4, TA5, and TA6 of the color conversion substrate 30 in the display area DA. According to an embodiment, when the light blocking area BA is divided by area, the light blocking area BA may include a first light blocking area BA1, a second light blocking area BA2, a third light blocking area BA3, a fourth light blocking area BA4, a fifth light blocking area BA5, a sixth light blocking area BA6, and a seventh light blocking area BA7.

The first light blocking area BA1 may be disposed between the first light transmitting area TA1 and the second light transmitting area TA2, the second light blocking area BA2 may be disposed between the second light transmitting area TA2 and the third light transmitting area TA3, and the third light blocking area BA3 may be disposed between the third light transmitting area TA3 and the first light transmitting area TA1 adjacent to the third light transmitting area TA3.

The fourth light blocking area BA4 may be disposed between the fourth light transmitting area TA4 and the fifth light transmitting area TA5, the fifth light blocking area BA5 may be disposed between the fifth light transmitting area TA5 and the sixth light transmitting area TA6, and the sixth light blocking area BA6 may be disposed between the sixth light transmitting area TA6 and the fourth light transmitting area TA4 adjacent to the sixth light transmitting area TA6.

The seventh light blocking area BA7 may be disposed between the first row RT1 and the second row RT2 adjacent in the second direction D2.

Figure 5:
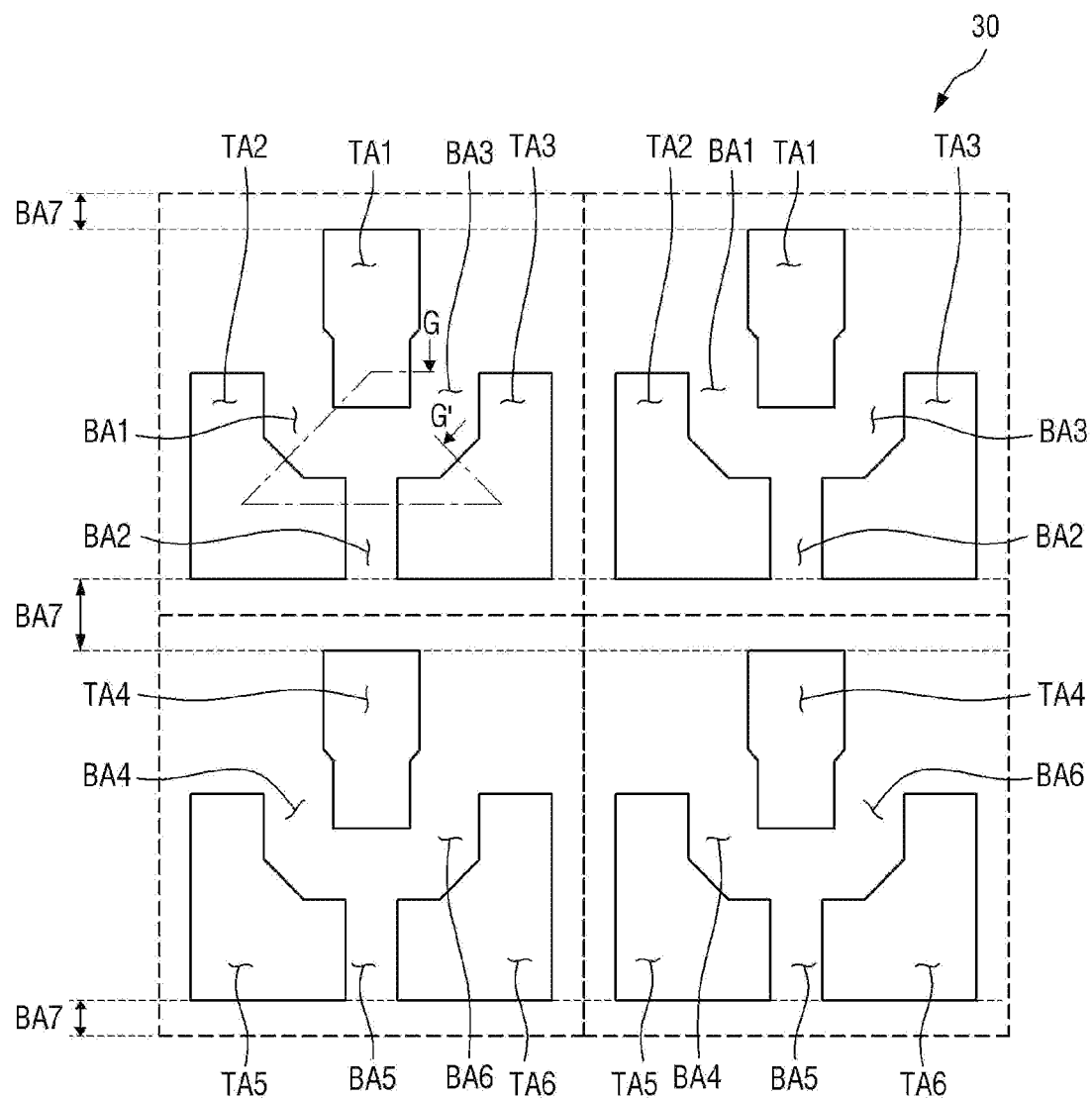
FIG. 5 is a plan view schematically illustrating another example of the display area of the color conversion substrate of the display device illustrated in FIGS. 1 and 2.

FIG. 5 is a plan view schematically illustrating another example of the display area of the color conversion substrate of the display device illustrated in FIGS. 1 and 2.

The color conversion substrate 30 of FIG. 5 is different from the color conversion substrate of the embodiments of FIGS. 3 and 4 in that the arrangement and shape of the plurality of light transmitting areas TA1, TA2, TA3, TA4, TA5, and TA6 are different.

Referring to FIG. 5, the first light transmitting area TA1 may be disposed between the second light transmitting area TA2 and the third light transmitting area TA3. The second light transmitting area TA2 and the third light transmitting area TA3 may be sequentially and repeatedly disposed along the first direction D1. At least a portion of the first light transmitting area TA1 may be disposed between the second light transmitting area TA2 and the third light transmitting area TA3, and the remaining portion thereof may be disposed to protrude from the second light transmitting area TA2 and the third light transmitting area TA3 in the second direction D2. In an embodiment, a line connecting the center points of each of the first light transmitting area TA1, the second light transmitting area TA2, and the third light transmitting area TA3 may have a triangular shape, for example.

In the plurality of light transmitting areas TA1 to TA6, three light transmitting areas may form one unit and may be repeatedly disposed in the first direction D1 and the second direction D2. In an embodiment, in the first row, the first light transmitting area TA1, the second light transmitting area TA2, and the third light transmitting area TA3 may be repeatedly disposed in the first direction D1 as one unit, for example. In the second row, the fourth light transmitting area TA4, the fifth light transmitting area TA5, and the sixth light transmitting area TA6 may be repeatedly disposed in the first direction D1 as one unit.

A plurality of light blocking areas BA1 to BA7 may be defined between the plurality of light transmitting areas TA1 to TA6. According to an embodiment, the first light blocking area BA1 may be disposed between the first light transmitting area TA1 and the second light transmitting area TA2, the second light blocking area BA2 may be disposed between the second light transmitting area TA2 and the third light transmitting area TA3, and the third light blocking area BA3 may be disposed between the third light transmitting area TA3 and the first light transmitting area TA1 adjacent to the third light transmitting area TA3. The fourth light blocking area BA4 may be disposed between the fourth light transmitting area TA4 and the fifth light transmitting area TA5, the fifth light blocking area BA5 may be disposed between the fifth light transmitting area TA5 and the sixth light transmitting area TA6, and the sixth light blocking area BA6 may be disposed between the sixth light transmitting area TA6 and the fourth light transmitting area TA4 adjacent to the sixth light transmitting area TA6. The seventh light blocking area BA7 may be disposed between the first row RT1 and the second row RT2 adjacent in the second direction D2.

Hereinafter, a structure of the display device 1 will be described in more detail.

Figure 6:
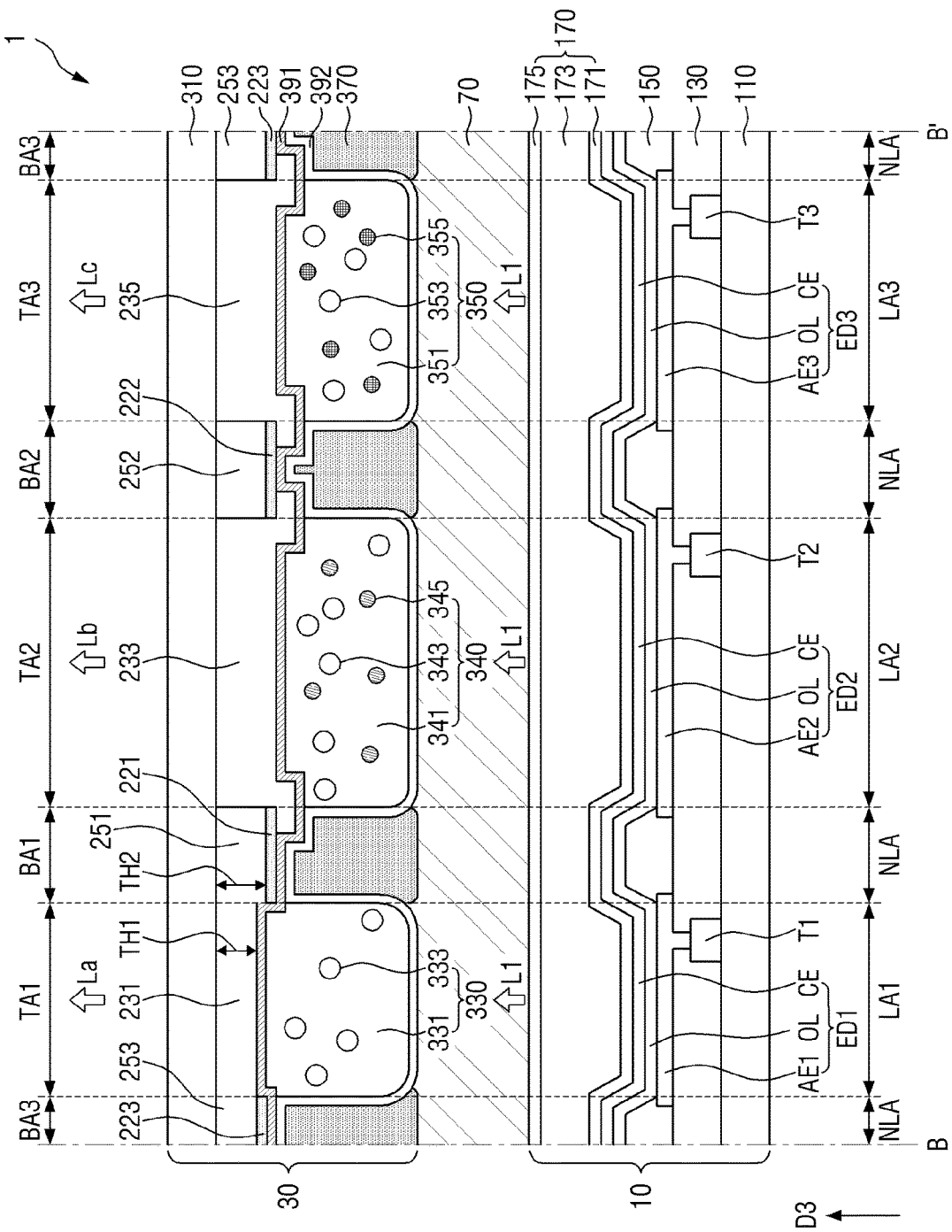
FIG. 6 is a cross-sectional view taken along line B-B' of FIGS. 3 and 4.
Figure 7:
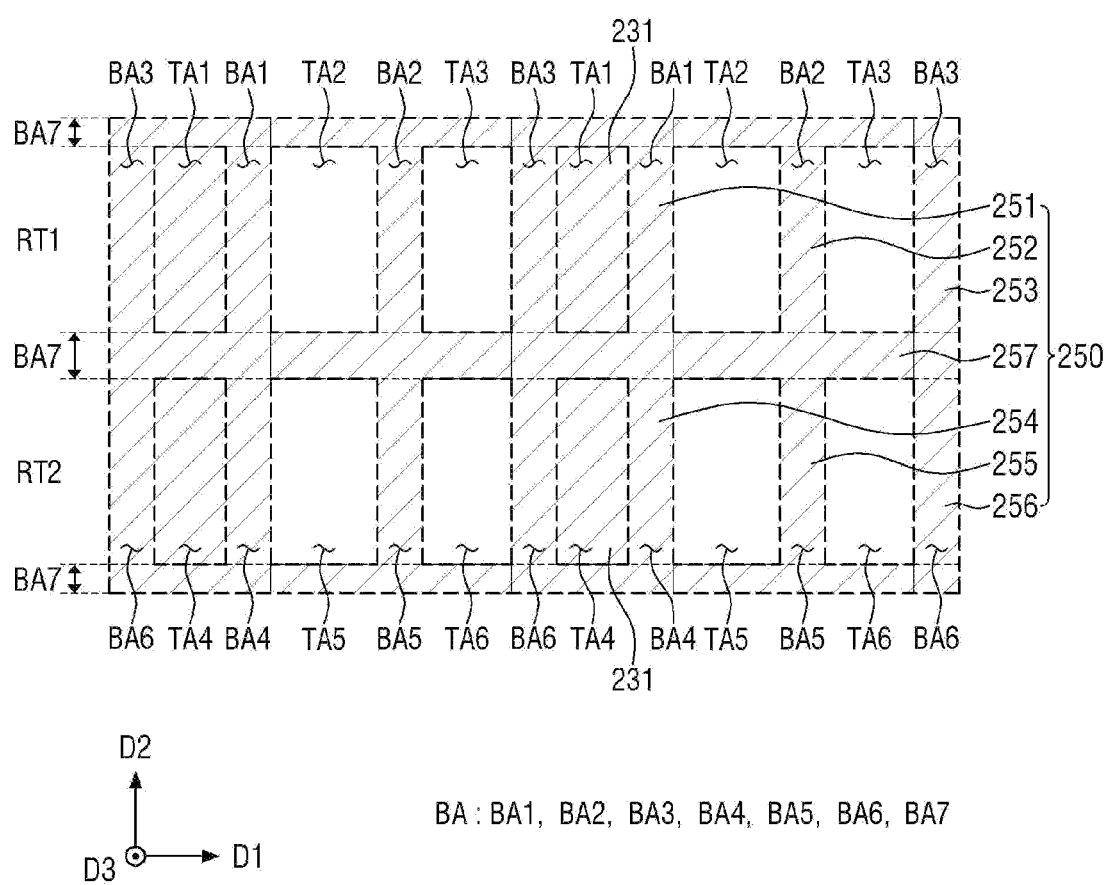
FIG. 7 is a plan view schematically illustrating a color pattern of the color conversion substrate illustrated in FIG. 6.
Figure 8:
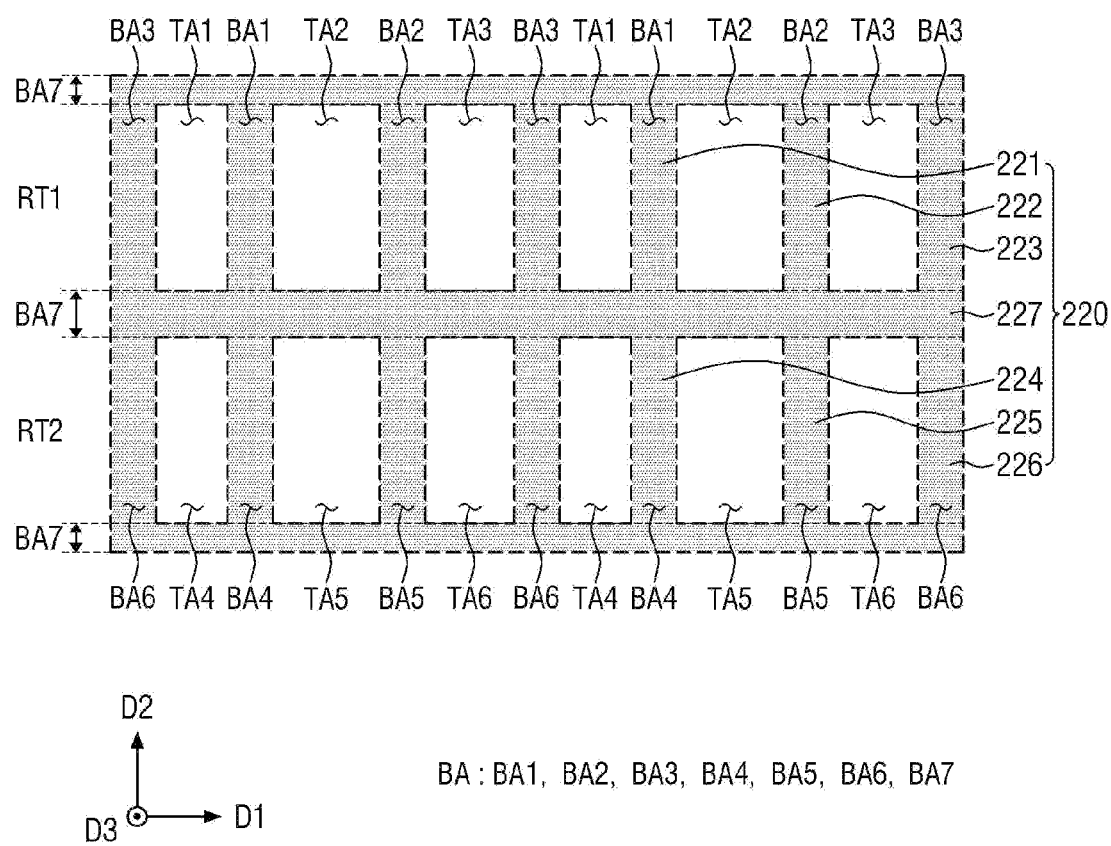
FIG. 8 is a plan view schematically illustrating a light blocking member of the color conversion substrate illustrated in FIG. 6.
Figure 10:
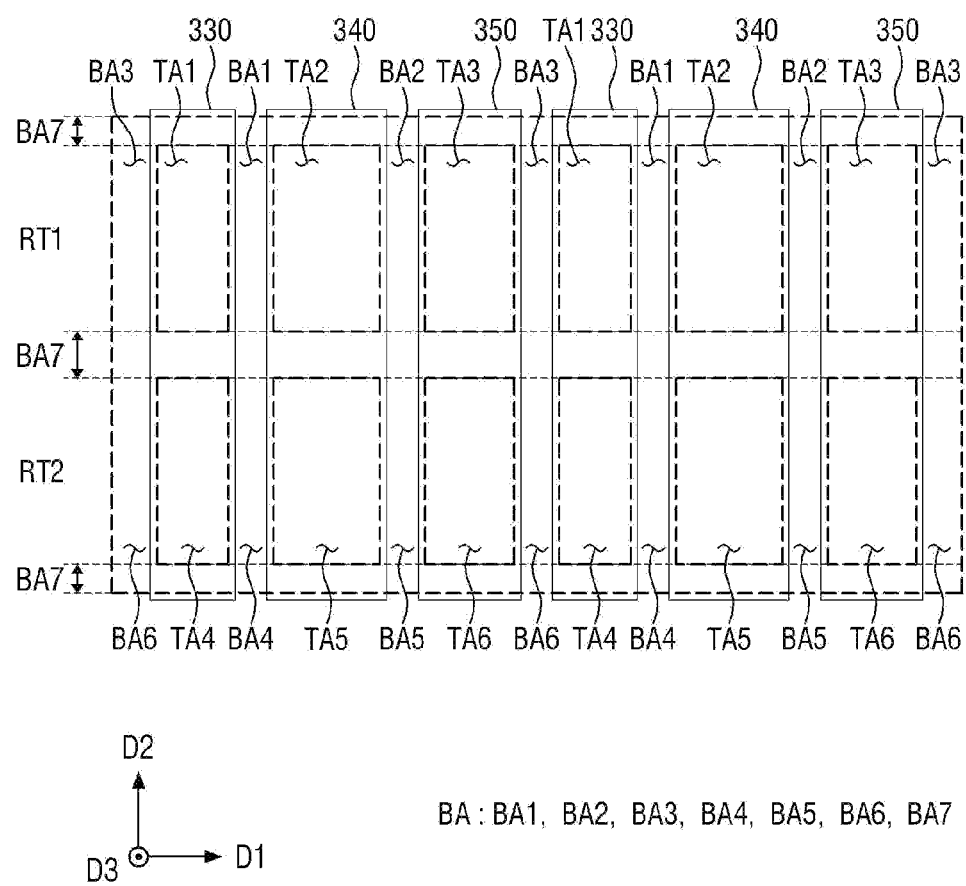
FIG. 10 is a plan view schematically illustrating a light transmission pattern of the color conversion substrate illustrated in FIG. 6.

FIG. 6 is a cross-sectional view taken along line B-B' of FIGS. 3 and 4, FIG. 7 is a plan view schematically illustrating a color pattern of the color conversion substrate illustrated in FIG. 6, FIG. 8 is a plan view schematically illustrating a light blocking member of the color conversion substrate illustrated in FIG. 6, FIG. 9 is a plan view schematically illustrating a second color filter of the color conversion substrate illustrated in FIG. 6, and FIG. 10 is a plan view schematically illustrating a light transmission pattern of the color conversion substrate illustrated in FIG. 6. The cross-sectional view illustrated in FIG. 6 is a cross-sectional view taken along line B-B' of FIGS. 3 and 4, but may have the same structure as the cross-sectional view taken along line G-G' of FIG. 5. Accordingly, FIG. 6 may also be applicable as a cross-sectional structure of FIG. 5.

Referring to FIG. 6, the display device 1 may include the display substrate 10, the color conversion substrate 30 facing the display substrate 10, and the filler 70 disposed between the display substrate 10 and the color conversion substrate 30 described above.

The display substrate 10 may include a first substrate 110. The first substrate 110 may be an insulating substrate. The first substrate 110 may include a transparent material. In an embodiment, the first substrate 110 may include a transparent insulating material such as glass or quartz, for example. The first substrate 110 may be a rigid substrate. However, the first substrate 110 is not limited thereto, and may include plastic such as polyimide, and may have flexible characteristics that may be curved, bent, folded, or rolled. As described above, the plurality of light emitting areas LA1, LA2, LA3, LA4, LA5, and LA6 and the non-light-emitting area NLA may be defined in the first substrate 110.

Switching elements T1, T2, and T3 may be disposed on the first substrate 110. According to an embodiment, a first switching element T1 may be disposed in the first light emitting area LA1 of the first substrate 110, a second switching element T2 may be disposed in the second light emitting area LA2 thereof, and a third switching element T3 may be disposed in the third light emitting area LA3 thereof. However, the disclosure is not limited. According to another embodiment, at least one of the first switching element T1, the second switching element T2, and the third switching element T3 may also be disposed in the non-light-emitting area NLA.

According to an embodiment, each of the first switching element T1, the second switching element T2, and the third switching element T3 may be a thin film transistor including amorphous silicon, polysilicon, or an oxide semiconductor. Although not illustrated in the drawings, a plurality of signal lines (e.g., a gate line, a data line, a power line, or the like) transmitting a signal to each switching element may be further disposed on the first substrate 110.

An insulating film 130 may be disposed on the first switching element T1, the second switching element T2, and the third switching element T3. According to an embodiment, the insulating film 130 may be a planarization film. According to an embodiment, the insulating film 130 may include an organic film. In an embodiment, the insulating film 130 may include an acrylic resin, an epoxy resin, an imide resin, an ester resin, or the like, for example. According to an embodiment, the insulating film 130 may include a positive photosensitive material or a negative photosensitive material.

A first anode electrode AE1, a second anode electrode AE2, and a third anode electrode AE3 may be disposed on the insulating film 130. The first anode electrode AE1 may be disposed in the first light emitting area LAL but at least a portion thereof may extend to the non-light-emitting area NLA. The second anode electrode AE2 may be disposed in the second light emitting area LA2, but at least a portion thereof may extend to the non-light-emitting area NLA. The third anode electrode AE3 may be disposed in the third light emitting area LA3, but at least a portion thereof may extend to the non-light-emitting area NLA. The first anode electrode AE1 may penetrate through the insulating film 130 and be connected to the first switching element T1, the second anode electrode AE2 may penetrate through the insulating film 130 and be connected to the second switching element T2, and the third anode electrode AE3 may penetrate through the insulating film 130 and be connected to the third switching element T3.

According to an embodiment, widths or areas of the first anode electrode AE1, the second anode electrode AE2, and the third anode electrode AE3 may be different from each other. In an embodiment, the width of the first anode electrode AE1 may be smaller than the width of the second anode electrode AE2, and the width of the third anode electrode AE3 may be smaller than the width of the second anode electrode AE2 and greater than the width of the first anode electrode AE1. In an alternative embodiment, the area of the first anode electrode AE1 may be smaller than the area of the second anode electrode AE2, and the area of the third anode electrode AE3 may be smaller than the area of the second anode electrode AE2 and greater than the area of the first anode electrode AE1. In an alternative embodiment, the area of the first anode electrode AE1 may be smaller than the area of the second anode electrode AE2, and the area of the third anode electrode AE3 may be greater than the area of the second anode electrode AE2 and the area of the first anode electrode AE1. However, the disclosure is not limited to the above-described embodiment. According to another embodiment, the widths or areas of the first anode electrode AE1, the second anode electrode AE2, and the third anode electrode AE3 may be substantially the same.

The first anode electrode AE1, the second anode electrode AE2, and the third anode electrode AE3 may be reflective electrodes. The first anode electrode AE1, the second anode electrode AE2, and the third anode electrode AE3 may have a stacked film structure in which a material layer having a high work function including indium-tin-oxide (ITO), indium-zinc-oxide (IZO), zinc oxide (ZnO), or indium oxide ($In_2O_3$) and a reflective material layer including silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a combination thereof are stacked. The material layer having the high work function may be disposed on a layer above the reflective material layer to be disposed close to a light emitting layer OL. The first anode electrode AE1, the second anode electrode AE2, and the third anode electrode AE3 may have a multilayer structure of ITO/Mg, ITO/MgF, ITO/Ag, and ITO/Ag/ITO, but are not limited thereto.

A pixel defining film 150 may be disposed on the first anode electrode AE1, the second anode electrode AE2, and the third anode electrode AE3. An opening exposing the first anode electrode AE1, an opening exposing the second anode electrode AE2, and an opening exposing the third anode electrode AE3 may be defined in the pixel defining film 150, and the pixel defining film 150 may define the first light emitting area LA1, the second light emitting area LA2, the third light emitting area LA3, and the non-light-emitting area NLA. That is, an area of the first anode electrode AE1 that is not covered by the pixel defining film 150 and is exposed may be the first light emitting area LA1. An area of the second anode electrode AE2 that is not covered by the pixel defining film 150 and is exposed may be the second light emitting area LA2. An area of the third anode electrode AE3 that is not covered by the pixel defining film 150 and is exposed may be the third light emitting area LA3. The other area in which the pixel defining film 150 is disposed may be the non-light-emitting area NLA.

The pixel defining film 150 may include an organic insulating material such as a polyacrylates resin, an epoxy resin, a phenolic resin, a polyamides resin, a polyimides resin, an unsaturated polyesters resin, a polyphenylenes resin, a polyphenylenesulfides resin, or benzocyclobutene (BCB).

According to an embodiment, the pixel defining film 150 may overlap a light blocking member of the color conversion substrate 30 to be described later. In an embodiment, the pixel defining film 150 may overlap a first light blocking member 221, a second light blocking member 222, and a third light blocking member 223. A light emitting layer OL may be disposed on the first anode electrode AE1, the second anode electrode AE2, and the third anode electrode AE3. In an embodiment in which the display device 1 is an organic light emitting diode display device, the light emitting layer OL may include an organic layer including an organic material. The organic layer may include an organic light emitting layer, and may further include at least one of a hole injection layer, a hole transporting layer, an electron transporting layer, and an electron injection layer as an auxiliary layer assisting light emission in some cases. According to another embodiment, when the display device 1 is a micro-LED display device or a nano LED display device, the light emitting layer OL may include an inorganic material such as an inorganic semiconductor.

According to an embodiment, the light emitting layer OL may have a tandem structure including a plurality of organic light emitting layers disposed to overlap each other in a thickness direction and a charge generating layer disposed between the organic light emitting layers. The respective organic light emitting layers disposed to overlap each other may emit light of the same wavelength or emit light of different wavelengths.

According to an embodiment, the light emitting layer OL may have a continuous film shape formed across the plurality of light emitting areas LA1, LA2, LA3, LA4, LA5, and LA6 and the non-light-emitting area NLA. In this case, the wavelength of the light emitted by the light emitting layer OL may be the same. In an embodiment, the light emitting layer OL may emit blue light or ultraviolet light from the plurality of light emitting areas LA1, LA2, LA3, LA4, LA5, and LA6, for example.

According to another embodiment, the light emitting layer OL may have a film shape patterned for each of the plurality of light emitting areas LA1, LA2, LA3, LA4, LA5, and LA6. In this case, the wavelength of light emitted by each light emitting layer OL may be different for each of the plurality of light emitting areas LA1, LA2, and LA3. In an embodiment, the first light emitting area LA1 may emit a first color, the second light emitting area LA2 may emit a second color, and the third light emitting area LA3 may emit a third color, for example.

A cathode electrode CE may be disposed on the light emitting layer OL. According to an embodiment, the cathode electrode CE may be semi-transmissive or transmissive. When the cathode electrode CE has the semi-transmissive, the cathode electrode CE may include Ag, Mg, Cu, Al, Pt, Pd, Au, Ni, Nd, Ir, Cr, Li, Ca, LiF/Ca, LiF/Al, Mo, Ti or any compounds or combinations thereof, e.g., a combination of Ag and Mg. In addition, when the cathode electrode CE has a thickness of several tens to several hundreds of angstroms, the cathode electrode CE may have semi-transmissive.

When the cathode electrode CE has transmissive, the cathode electrode CE may include a transparent conductive oxide (TCO). In an embodiment, the cathode electrode CE may include tungsten oxide (WxOx), titanium oxide ($TiO_2$), indium tin oxide (ITO), indium zinc oxide (IZO), zinc oxide (ZnO), indium tin zinc oxide (ITZO), magnesium oxide (MgO), or the like, for example.

The first anode electrode AE1, the light emitting layer OL, and the cathode electrode CE may constitute a first light emitting element ED1, the second anode electrode AE2, the light emitting layer OL, and the cathode electrode CE may constitute a second light emitting element ED2, and the third anode electrode AE3, the light emitting layer OL, and the cathode electrode CE may constitute a third light emitting element ED3. Each of the first light emitting element ED1, the second light emitting element ED2, and the third light emitting element ED3 may emit source light, and the source light may be provided to the color conversion substrate 30.

A thin film encapsulation layer 170 may be disposed on the cathode electrode CE. The thin film encapsulation layer 170 is commonly disposed in the first light emitting area LA1, the second light emitting area LA2, the third light emitting area LA3, and the non-light-emitting area NLA. According to an embodiment, the thin film encapsulation layer 170 may directly cover the cathode electrode CE. A capping layer (not illustrated) covering the cathode electrode CE may be further disposed between the thin film encapsulation layer 170 and the cathode electrode CE, and in this case, the thin film encapsulation layer 170 may directly cover the capping layer.

According to an embodiment, the thin film encapsulation layer 170 may include a first encapsulation inorganic film 171, an encapsulation organic film 173, and a second encapsulation inorganic film 175 sequentially stacked on the cathode electrode CE.

Each of the first encapsulation inorganic film 171 and the second encapsulation inorganic film 175 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like. The encapsulation organic film 173 may include an acrylic resin, a methacrylic resin, polyisoprene, a vinyl resin, an epoxy resin, a urethane resin, a cellulose resin, a perylene resin, or the like.

However, a structure of the thin film encapsulation layer 170 is not limited to the above-described example, and a stacked structure of the thin film encapsulation layer 170 may be variously changed.

The color conversion substrate 30 may be disposed to face the above-described display substrate 10.

Specifically, referring to FIGS. 6 and 7, the color conversion substrate 30 may include a second substrate 310. The second substrate 310 may be an insulating substrate. The second substrate 310 may include a transparent material. In an embodiment, the second substrate 310 may include a transparent insulating material such as glass or quartz, for example. The second substrate 310 may be a rigid substrate. However, the second substrate 310 is not limited thereto, and may include plastic such as polyimide, and may have flexible characteristics that may be curved, bent, folded, or rolled. As described above, the plurality of light transmitting areas TA1, TA2, TA3, TA4, TA5, and TA6 and the light blocking area BA may be defined in the second substrate 310.

A first color filter 231 and a color pattern 250 may be disposed on one surface of the second substrate 310 facing the display substrate 10.

The first color filter 231 may be disposed on one surface of the second substrate 310 and may overlap the first light transmitting area TA1 and the fourth light transmitting area TA4. According to an embodiment, the first color filter 231 overlapping the first light transmitting area TA1 and the first color filter 231 overlapping the fourth light transmitting area TA4 may be spaced apart from each other in the second direction D2. According to an embodiment, a seventh color pattern 257 to be described later may be disposed between the first color filter 231 overlapping the first light transmitting area TA1 and the first color filter 231 overlapping the fourth light transmitting area TA4. According to an embodiment, the seventh color pattern 257 may be connected to the first color filter 231 overlapping the first light transmitting area TA1 and the first color filter 231 overlapping the fourth light transmitting area TA4.

The first color filter 231 may selectively transmit the light of the first color (e.g., blue light), and block or absorb the light of the second color (e.g., red light) and the light of the third color (e.g., green light). According to an embodiment, the first color filter 231 may be a blue color filter, and may include a blue colorant such as a blue dye or a blue pigment. Herein, a colorant is a concept including both a dye and a pigment.

The color pattern 250 may absorb a portion of light incident on the color conversion substrate 30 from the outside of the display device 1 to reduce reflected light due to external light. In the display device 1, a significant portion of external light is reflected, causing a problem in that a color reproduction rate of the color conversion substrate 30 is distorted. However, according to the illustrated embodiment, as the color pattern 250 is disposed on the second substrate 310, an amount of reflected external light may be reduced, and color distortion caused by the external light may be reduced.

According to an embodiment, the color pattern 250 may include a blue colorant such as a blue dye or a blue pigment. According to an embodiment, the color pattern 250 may include the same material as that of the first color filter 231, and may be simultaneously formed during a formation of the first color filter 231. That is, the first color filter 231 and the color pattern 250 may be simultaneously formed by coating a photosensitive organic material including the blue colorant on one surface of the second substrate 310 and exposing and developing the same.

According to an embodiment, a thickness TH2 of the color pattern 250 measured along the third direction D3 may be substantially the same as a thickness TH1 of the first color filter 231. When the color pattern 250 includes the blue colorant, external light or reflected light transmitted through the color pattern 250 has a blue wavelength band. Color sensibility of eyes perceived by the user's eyes differs according to the color of the light. More specifically, the light of the blue wavelength band may be perceived less sensitively by the user than light of a green wavelength band and light of a red wavelength band. Therefore, as the color pattern 250 includes the blue colorant, the user may perceive the reflected light relatively less sensitively.

The color pattern 250 may be disposed on one surface of the second substrate 310 and overlap the light blocking area BA. In addition, the color pattern 250 may overlap the non-light-emitting area NLA. According to an embodiment, the color pattern 250 may be in direct contact with one surface of the second substrate 310. In an alternative embodiment, when a distinct buffer layer for preventing an inflow of impurities is disposed on one surface of the second substrate 310, the color pattern 250 may be in direct contact with the buffer layer.

As illustrated in FIG. 7, according to an embodiment, the color pattern 250 may be disposed across an entirety of the blocking area BA. The color pattern 250 may include a first color pattern 251 overlapping the first light blocking area BA1, a second color pattern 252 overlapping the second light blocking area BA2, a third color pattern 253 overlapping the third light blocking area BA3, a fourth color pattern 254 overlapping the fourth light blocking area BA4, a fifth color pattern 255 overlapping the fifth light blocking area BA5, a sixth color pattern 256 overlapping the sixth light blocking area BA6, and a seventh color pattern 257 overlapping the seventh light blocking area BA7. According to an embodiment, the seventh color pattern 257 may be connected to the first color pattern 251, the second color pattern 252, the third color pattern 253, the fourth color pattern 254, the fifth color pattern 255, and the sixth color pattern 256. In addition, the color pattern 250 may be connected to the first color filter 231.

Referring to FIGS. 6 and 8, a light blocking member 220 may be disposed on one surface of the second substrate 310 facing the display substrate 10. The light blocking member 220 may overlap the light blocking area BA to block transmission of light. As illustrated in FIG. 8, the light blocking member 220 may be disposed in a substantially grid shape in a plan view.

According to an embodiment, the light blocking member 220 may include an organic light blocking material, and may be formed through a process of coating and exposing the organic light blocking material. The light blocking member 220 may include a dye or a pigment having light blocking properties, and may be a black matrix.

As described above, the external light may cause the problem of distorting the color reproduction rate of the color conversion panel. However, according to the illustrated embodiment, when the light blocking member 220 is disposed on the second substrate 310, at least a portion of the external light is absorbed by the light blocking member 220. Accordingly, distortion of a color due to external light reflection may be reduced. According to an embodiment, the light blocking member 220 may prevent an occurrence of color mixing due to permeation of light between adjacent light transmitting areas, thereby further improving the color reproduction rate.

As illustrated in FIG. 8, according to an embodiment, the light blocking member 220 may include a first light blocking member 221 overlapping the first light blocking area BA1, a second light blocking member 222 overlapping the second light blocking area BA2, a third light blocking member 223 overlapping the third light blocking area BA3, a fourth light blocking member 224 overlapping the fourth light blocking area BA4, a fifth light blocking member 225 overlapping the fifth light blocking area BA5, a sixth light blocking member 226 overlapping the sixth light blocking area BA6, and a seventh light blocking member 227 overlapping the seventh light blocking area BA7. The first light blocking member 221, the second light blocking member 222, and the third light blocking member 223 may be connected to the seventh light blocking member 227, and the fourth light blocking member 224, the fifth light blocking member 225, and the sixth light blocking member 226 may also be connected to the seventh light blocking member 227.

The light blocking member 220 may be disposed on the color pattern 250. According to an embodiment, the first light blocking member 221 may be disposed on the first color pattern 251, the second light blocking member 222 may be disposed on the second color pattern 252, the third light blocking member 223 may be disposed on the third color pattern 253, the fourth light blocking member 224 may be disposed on the fourth color pattern 254, the fifth light blocking member 225 may be disposed on the fifth color pattern 255, the sixth light blocking member 226 may be disposed on the sixth color pattern 256, and the seventh light blocking member 227 may be disposed on the seventh color pattern 257.

Since the color pattern 250 is disposed between the light blocking member 220 and the second substrate 310, the light blocking member 220 may not contact the second substrate 310 according to an embodiment.

As illustrated in FIGS. 6 and 9, a second color filter 233 and a third color filter 235 may be disposed on one surface of the second substrate 310 facing the display substrate 10.

The second color filter 233 may overlap each of the second light transmitting area TA2 and the fifth light transmitting area TA5, and the third color filter 235 may overlap each of the third light transmitting area TA3 and the sixth light transmitting area TA6.

According to an embodiment, as illustrated in FIG. 6, one side of the second color filter 233 may overlap the first light blocking area BA1 and may be disposed on the first color pattern 251 and the first light blocking member 221. The other side of the second color filter 233 may overlap the second light blocking area BA2 and may be disposed on the second color pattern 252 and the second light blocking member 222.

According to an embodiment, one side of the third color filter 235 may overlap the second light blocking area BA2 and may be disposed on the second color pattern 252 and the second light blocking member 222. In addition, the other side of the third color filter 235 may overlap the third light blocking area BA3 and may be disposed on the third color pattern 253 and the third light blocking member 223.

According to an embodiment, as illustrated in FIG. 9, each of the second color filter 233 and the third color filter 235 may be formed in a stripe shape extending in the second direction D2, and may intersect the seventh light blocking area BA7 between the first row RT1 and the second row RT2. Therefore, in the seventh light blocking area BA7, the second color filter 233 and the third color filter 235 may be disposed on the seventh light blocking member 227, and in the seventh light blocking area BA7, the second color filter 233 and the third color filter 235 may cover the seventh color pattern 257 and the seventh light blocking member 227 in the second direction D2, respectively. However, the disclosure is not limited thereto, and according to another embodiment, at least one of the second color filter 233 and the third color filter 235 may be formed in a form of an island pattern spaced apart from each other in the second direction D2.

The second color filter 233 may block or absorb the light of the first color (e.g., blue light). That is, the second color filter 233 may function as a blue light blocking filter that blocks the blue light. The second color filter 233 may selectively transmit the light of the second color (e.g., red light), and block or absorb the light of the first color and the light of the third color (e.g., green light). In an embodiment, the second color filter 233 may be a red color filter, and may include a red colorant such as a red dye or a red pigment, for example.

The third color filter 235 may block or absorb the light of the first color. That is, the third color filter 235 may also function as a blue light blocking filter. The third color filter 235 may selectively transmit the light of the third color and block or absorb the light of the first color and the light of the second color. In an embodiment, the third color filter 235 may be a green color filter, and may include a green colorant such as a green dye or a green pigment, for example.

As illustrated in FIG. 6, a first capping layer 391 covering the light blocking member 220, the color pattern 250, the first color filter 231, the second color filter 233, and the third color filter 235 may be disposed on one surface of the second substrate 310. The first capping layer 391 may prevent impurities such as moisture or air from permeating from the outside to damage or contaminate the first color filter 231, the second color filter 233, and the third color filter 235. In addition, the first capping layer 391 may prevent the colorants of the first color filter 231, the second color filter 233, and the third color filter 235 from being diffused into other components.

The first capping layer 391 may be in direct contact with one surface (a lower surface in FIG. 6) of each of the first color filter 231, the second color filter 233, and the third color filter 235. In addition, the first capping layer 391 may be in direct contact with one surface (a lower surface in FIG. 6) of the light blocking member 220. In an embodiment, in the first light blocking area BA1, the first light blocking member 221 may be in direct contact with the first capping layer 391, in the second light blocking area BA2, the second light blocking member 222 may contact the first capping layer 391, and in the third light blocking area BA3, the third light blocking member 223 may contact the first capping layer 391, for example.

The first capping layer 391 may include an inorganic material. In an embodiment, the first capping layer 391 may include silicon nitride, aluminum nitride, zirconium nitride, titanium nitride, hafnium nitride, tantalum nitride, silicon oxide, aluminum oxide, titanium oxide, tin oxide, and silicon oxynitride, for example.

As illustrated in FIGS. 6 and 10, a light transmission pattern 330 may be disposed on the first capping layer 391.

According to an embodiment, the light transmission pattern 330 may be formed by applying a photosensitive material and exposing and developing the photosensitive material. However, the disclosure is not limited thereto, and the light transmission pattern 330, a first wavelength conversion pattern 340, and a second wavelength conversion pattern 350 may also be formed by an inkjet method.

The light transmission pattern 330 may be disposed on the first capping layer 391 and may overlap the first light transmitting area TA1 and the fourth light transmitting area TA4. As illustrated in FIG. 10, the light transmission pattern 330 may be formed in a stripe shape extending in the second direction D2, and may intersect the seventh light blocking area BA7 between the first row RT1 and the second row RT2. However, the disclosure is not limited thereto, and according to another embodiment, the light transmission pattern 330 may also be formed in a structure in which a portion overlapping the first light transmitting area TA1 and a portion overlapping the fourth light transmitting area TA4 are spaced apart from each other, e.g., in the form of an island pattern.

The light transmission pattern 330 may transmit incident light. As described above, the source light provided from the first light emitting element ED1 may be blue light. The source light L1, which is the blue light, transmits through the light transmission pattern 330 and the first color filter 231 and is emitted to the outside of the display device 1. That is, first light La emitted from the first light transmitting area TA1 may be blue light.

According to an embodiment, the light transmission pattern 330 may include a first base resin 331, and may further include first scatterers 333 dispersed in the first base resin 331.

The first base resin 331 may include a material having high light transmittance. According to an embodiment, the first base resin 331 may include an organic material. In an embodiment, the first base resin 331 may include an organic material such as an epoxy resin, an acrylic resin, a cardo resin, or an imide resin, for example.

The first scatterer 333 may have a refractive index different from that of the first base resin 331, and may form an optical interface with the first base resin 331. In an embodiment, the first scatterers 333 may be light scattering particles, for example. The first scatterer 333 is not particularly limited as long as it is a material capable of scattering at least a portion of transmitted light, but may be, for example, a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic resin, a urethane resin, or the like. The first scatterer 333 may scatter light in a random direction irrespective of an incident direction of the incident light without substantially converting a wavelength of the light transmitted through the light transmission pattern 330.

As described above, the light transmission pattern 330 may be in direct contact with the first capping layer 391 in the first light transmitting area TA1.

A first wavelength conversion pattern 340 and a second wavelength conversion pattern 350 may be disposed on the first capping layer 391.

The first wavelength conversion pattern 340 may be disposed on the first capping layer 391 and may overlap the second light transmitting area TA2 and the fifth light transmitting area TA5. According to an embodiment, as illustrated in FIG. 10, the first wavelength conversion pattern 340 may be formed in a stripe shape extending in the second direction D2, and may intersect the seventh light blocking area BA7 between the first row RT1 and the second row RT2. However, the disclosure is not limited thereto, and according to another embodiment, the first wavelength conversion pattern 340 may also be formed in a structure in which a portion overlapping the second light transmitting area TA2 and a portion overlapping the fifth light transmitting area TA5 are spaced apart from each other, for example, in the form of an island pattern.

The first wavelength conversion pattern 340 may convert or shift a peak wavelength of the incident light to light having another predetermined peak wavelength and emit the light having another predetermined peak wavelength. According to an embodiment, the first wavelength conversion pattern 340 may convert the source light L1 provided from the second light emitting element ED2 into red light having a peak wavelength in a range of 610 nm to 650 nm, and emit the red light. That is, second light Lb emitted from the second light transmitting area TA2 may be red light.

The first wavelength conversion pattern 340 may include a second base resin 341 and first wavelength shifters 345 dispersed in the second base resin 341, and may further include second scatterers 343 dispersed in the second base resin 341.

The second base resin 341 may include a material having high light transmittance. According to an embodiment, the second base resin 341 may include an organic material. The second base resin 341 may include the same material as that of the first base resin 331, or may include at least one of the materials exemplified as the constituent materials of the first base resin 331.

The first wavelength shifter 345 may convert or shift the peak wavelength of the incident light into another predetermined peak wavelength. According to an embodiment, the first wavelength shifter 345 may convert the light of the first color which is the blue light provided from the second light emitting element ED2, into red light having a single peak wavelength in the range of about 610 nm to 650 nm, and emit the red light.

The first wavelength shifter 345 may be a quantum dot, a quantum bar, or a phosphor, for example. In an embodiment, the quantum dot may be a particulate matter that emits a predetermined color while electrons are transitioning from a conduction band to a valence band, for example.

The quantum dot may be a semiconductor nano-crystal material. The quantum dot may have a predetermined bandgap according to its composition and size to absorb light and then emit light having a unique wavelength. Examples of the semiconductor nano-crystal of the quantum dot may include group IV nano-crystal, group II-VI compound nano-crystal, group III-V compound nano-crystal, group IV-VI compound nano-crystal, or any combinations thereof.

The group II-VI compound may be selected from the group including a binary compound selected from the group including CdSe, CdTe, ZnS, ZnSe, ZnTe, ZnO, HgS, HgSe, HgTe, MgSe, MgS, and any combinations thereof; a ternary compound selected from the group including InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and any combinations of thereof; and a quaternary compound selected from the group including HgZnTeS, CdZnSeS, CdZnSeTe, CdZnSTe, CdHgSeS, CdHgSeTe, CdHgSTe, HgZnSeS, HgZnSeTe, HgZnSTe, and any combinations thereof.

The group III-V compound may be selected from the group including a binary compound selected from the group including GaN, GaP, GaAs, GaSb, AlP, AlAs, AlSb, InN, InP, InAs, InSb, and any combinations thereof; a ternary compound selected from the group including GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and any combinations thereof; and a quaternary compound selected from the group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combinations thereof.

The group IV-VI compound may be selected from the group including a binary compound selected from the group including SnS, SnSe, SnTe, PbS, PbSe, PbTe, and any combinations thereof; a ternary compound selected from the group including SnSeS, SnSeTe, SnSTe, PbSeS, PbSeTe, PbSTe, SnPbS, SnPbSe, SnPbTe, and any combinations thereof; and a quaternary compound selected from the group including SnPbSSe, SnPbSeTe, SnPbSTe, and any combinations thereof. A group IV element may be selected from the group including Si, Ge, and any combinations thereof. A group IV compound may be a binary compound selected from the group including SiC, SiGe, and any combinations thereof.

In this case, the binary compound, the ternary compound, or the quaternary compound may be in a particle at a uniform concentration or may be in the same particle in a state of partially different concentration distributions. In addition, the quantum dot may have a core/shell structure in which one quantum dot surrounds another quantum dot. An interface between the core and the shell may have a concentration gradient in which a concentration of the element in the shell decreases toward the center.

According to an embodiment, the quantum dot may have a core-shell structure including a core including the above-described nano-crystal and a shell surrounding the core. The shell of the quantum dot may serve as a protective layer for maintaining semiconductor properties by preventing chemical modification of the core and/or a charging layer for imparting electrophoretic properties to the quantum dot. The shell may be a single layer or multiple layers. Examples of the shell of the quantum dot may include a metal or non-metal oxide, a semiconductor compound, or any combinations thereof.

In an embodiment, examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, for example, but the disclosure is not limited thereto.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

The light emitted by the first wavelength shifter 345 may have an emission wavelength spectrum full width of half maximum (FWHM) of about 45 nm or less, or about 40 nm or less, or about 30 nm or less, and through this, color purity and color reproducibility of colors displayed by the display device 1 may be further improved. In addition, the light emitted by the first wavelength shifter 345 may be emitted in several directions regardless of the incident direction of the incident light. Through this, side visibility of the second color displayed in the second light transmitting area TA2 may be improved.

A portion of the source light provided from the second light emitting element ED2 may not be converted into the red light by the first wavelength shifter 345. However, light that is not converted to the red light among the source light may be blocked by the second color filter 233. The red light converted by the first wavelength conversion pattern 340 among the source light is transmitted through the second color filter 233 and is emitted to the outside. That is, the second light emitted from the second light transmitting area TA2 may be the red light.

The second scatterer 343 may have a refractive index different from that of the second base resin 341, and may form an optical interface with the second base resin 341. In an embodiment, the second scatterers 343 may be light scattering particles, for example. Other detailed descriptions of the second scatterers 343 are substantially the same as or similar to those of the first scatterers 333, and thus will be omitted.

The second wavelength conversion pattern 350 may be disposed on the first capping layer 391 and may overlap the third light transmitting area TA3 and the sixth light transmitting area TA6. According to an embodiment, as illustrated in FIG. 10, the second wavelength conversion pattern 350 may be formed in a stripe shape extending in the second direction D2, and may intersect the seventh light blocking area BA7 between the first row RT1 and the second row RT2. However, the disclosure is not limited thereto, and according to another embodiment, the second wavelength conversion pattern 350 may also be formed in a structure in which a portion overlapping the third light transmitting area TA3 and a portion overlapping the sixth light transmitting area TA6 are spaced apart from each other, for example, in the form of an island pattern.

The second wavelength conversion pattern 350 may convert or shift a peak wavelength of the incident light to light having another predetermined peak wavelength and emit the light having another predetermined peak wavelength. According to an embodiment, the second wavelength conversion pattern 350 may convert the source light L1 provided from the third light emitting element ED3 into green light in a range of 510 nm to 550 nm, and emit the green light. That is, third light Lc emitted from the third light transmitting area TA3 may be green light.

The second wavelength conversion pattern 350 may include a third base resin 351 and second wavelength shifters 355 dispersed in the third base resin 351, and may further include third scatterers 353 dispersed in the third base resin 351.

The third base resin 351 may include a material having high light transmittance. According to an embodiment, the third base resin 351 may include an organic material. The third base resin 351 may include the same material as that of the first base resin 331, or may include at least one of the materials exemplified as the constituent materials of the first base resin 331.

The second wavelength shifter 355 may convert or shift the peak wavelength of the incident light into another predetermined peak wavelength. According to an embodiment, the second wavelength shifter 355 may convert blue light having a peak wavelength in a range of 440 nm to 480 nm into green light having a peak wavelength in a range of 510 nm to 550 nm.

The second wavelength shifter 355 may be a quantum dot, a quantum bar, or a phosphor, for example. A more detailed description of the second wavelength shifter 355 is substantially the same as or similar to that of the first wavelength shifter 345 described above, and thus will be omitted.

According to an embodiment, both the first wavelength shifter 345 and the second wavelength shifter 355 may include quantum dots. In this case, a particle size of the quantum dots constituting the first wavelength shifter 345 may be greater than a particle size of the quantum dots constituting the second wavelength shifter 355.

The third scatterer 353 may have a refractive index different from that of the third base resin 351, and may form an optical interface with the third base resin 351. In an embodiment, the third scatterers 353 may be light scattering particles, for example. Other detailed descriptions of the third scatterers 353 are substantially the same as or similar to those of the second scatterers 343, and thus will be omitted.

The source light emitted from the third light emitting element ED3 may be provided to the second wavelength conversion pattern 350, and the second wavelength shifter 355 may convert the source light provided from the third light emitting element ED3 into green light having a peak wavelength in a range of about 510 nm to about 550 nm and emit the green light.

A portion of the source light which is the blue light may transmit through the second wavelength conversion pattern 350 without being converted into the green light by the second wavelength shifter 355. However, the light that is not converted to the green light may be blocked by the third color filter 235. The green light converted by the second wavelength conversion pattern 350 among the source light is transmitted through the third color filter 235 and is emitted to the outside. Accordingly, the third light emitted from the third light transmitting area TA3 to the outside of the display device 1 may be the green light.

When the source light is a combination of deep blue light and light blue light, the source light includes both a long wavelength component and a short wavelength component, and thus a movement path of the source light incident on the second wavelength conversion pattern 350 may be further increased. Accordingly, the amount of source light provided to the second wavelength shifter 355 may further increase, and a light conversion efficiency of the second wavelength conversion pattern 350 may increase. Therefore, color reproducibility of the display device 1 may be further improved.

As illustrated in FIG. 6, a second capping layer 392 may be disposed on the light transmission pattern 330, the first wavelength conversion pattern 340, and the second wavelength conversion pattern 350. The second capping layer 392 may cover the light transmission pattern 330, the first wavelength conversion pattern 340, and the second wavelength conversion pattern 350. The second capping layer 392 may contact the first capping layer 391 in the light blocking areas BA1, BA2, and BA3, and may seal the light transmission pattern 330, the first wavelength conversion pattern 340, and the second wavelength conversion pattern 350. Accordingly, it is possible to prevent impurities such as moisture or air from permeating from the outside to damage or contaminate the light transmission pattern 330, the first wavelength conversion pattern 340, and the second wavelength conversion pattern 350.

The second capping layer 392 may include an inorganic material. In an embodiment, the second capping layer 392 may include silicon nitride, aluminum nitride, zirconium nitride, titanium nitride, hafnium nitride, tantalum nitride, silicon oxide, aluminum oxide, titanium oxide, tin oxide, and silicon oxynitride.

When both the first capping layer 391 and the second capping layer 392 include an inorganic material, a portion where the first capping layer 391 and the second capping layer 392 are in direct contact with each other may be inorganic-inorganic bonded, which may effectively block an inflow of moisture or air from the outside.

As illustrated in FIG. 6, a color mixing preventing member 370 may be disposed on the second capping layer 392. The color mixing preventing member 370 may be disposed in the light blocking area BA to block transmission of light. More specifically, the color mixing preventing member 370 may be disposed between the light transmission pattern 330 and the first wavelength conversion pattern 340 and between the first wavelength conversion pattern 340 and the second wavelength conversion pattern 350 to prevent color mixing between the adjacent light transmitting areas. According to an embodiment, the color mixing preventing member 370 may be formed in a stripe shape extending in the second direction (D2 in FIG. 10), and may prevent color mixing between the adjacent light transmitting areas in the first direction (D1 in FIG. 10).

The color mixing preventing member 370 may include an organic light blocking material, and may be formed through a process of coating and exposing the organic light blocking material. In an embodiment, the color mixing preventing member 370 may include a dye or a pigment having light blocking properties, and may be a black matrix, for example.

As described above, the filler 70 may be disposed in the space between the color conversion substrate 30 and the display substrate 10. As illustrated in FIG. 6, the filler 70 may be disposed between the second capping layer 392 and the thin film encapsulation layer 170 and between the color mixing preventing member 370 and the thin film encapsulation layer 170. The filler 70 may be in direct contact with the second capping layer 392 and the color mixing preventing member 370.

In the display device 1 described above, when external light is incident on the color conversion substrate 30, a portion of the external light may be reflected at an interface between the second substrate 310 and the color filter having different refractive indices. Specifically, the external light may be reflected at an interface between the second substrate 310 and the first color filter 231, an interface between the second substrate 310 and the second color filter 233, an interface between the second substrate 310 and the third color filter 235, and an interface between the second substrate 310 and the color pattern 250. As a difference in refractive index between two media, e.g., the second substrate 310 and the first color filter 231, increases, a reflectance of external light may increase. The reflected light degrades a quality of a display image.

Hereinafter, a color conversion substrate 30 capable of reducing a reflectance of external light and a display device 1 including the same will be described.

Figure 11:
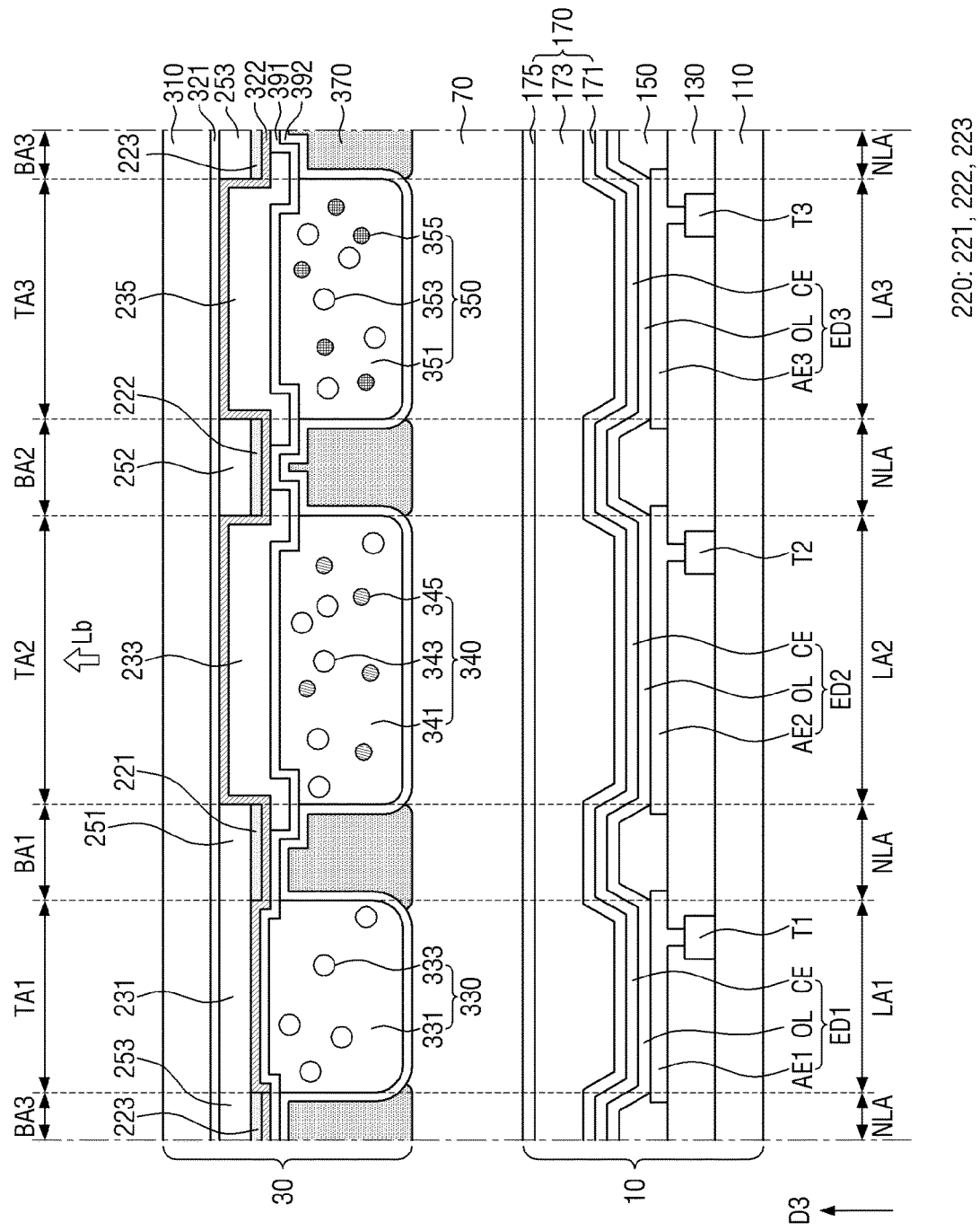
FIG. 11 is a cross-sectional view schematically illustrating a display device according to another embodiment taken along line B-B' of FIGS. 3 and 4.

FIG. 11 is a cross-sectional view schematically illustrating a display device according to another embodiment taken along line B-B' of FIGS. 3 and 4.

Referring to FIG. 11, the color conversion substrate 30 may include a first stack 321 disposed on one surface of the second substrate 310 facing the display substrate 10. The first color filter 231, the first color pattern 251, the second color pattern 252, and the third color pattern 253 may be disposed on one surface (a lower surface in FIG. 11) of the first stack 321. Since the color conversion substrate 30 according to an embodiment is different from the color conversion substrate 30 of FIG. 6 described above only in that it has the first color filter 231, the first color pattern 251, the second color pattern 252, and the third color pattern 253 disposed on one surface of the first stack 321, and further includes a second stack 322, a redundant description will be omitted.

The first stack 321 may be disposed between the second substrate 310 and the first color filter 231, between the second substrate 310 and the first color pattern 251, between the second substrate 310 and the second color pattern 252, and between the second substrate 310 and the third color pattern 253. The first stack 321 may contact one surface (an upper surface in FIG. 11) of each of the first color filter 231, the first color pattern 251, the second color pattern 252, and the third color pattern 253.

According to an embodiment, the first stack 321 may be disposed on an entirety of a surface of the second substrate 310. Here, the entirety of the surface of the second substrate 310 may be a surface including the light transmitting areas and the light blocking areas.

As illustrated in FIG. 11, the first stack 321 may be disposed between the second substrate 310 and the first color filter 231 to reduce a reflectance of external light reflected from an interface between the second substrate 310 and the first color filter 231. According to an embodiment, a refractive index of the first stack 321 may have a value between a refractive index of the second substrate 310 and a refractive index of the first color filter 231.

A reflectance R of light increases as a difference between a refractive index no of a first medium and a refractive index $n_1$ of a second medium through which the light is transmitted increases. This may be expressed by the following equation.

$$R = \frac{(n_1 - n_0)^2}{(n_1 + n_0)^2}$$

As an example, when the refractive index of the second substrate 310 is 1.5 and the refractive index of the first color filter 231 is 1.8, the reflectance R of external light at the interface between the second substrate 310 and the first color filter 231 is about 0.0082. According to an embodiment, when the first stack 321 having a refractive index of 1.7 is disposed between the second substrate 310 and the first color filter 231, the reflectance R of external light is about 0.0039 at the interface between the second substrate 310 and the first stack 321, and is about 0.0008 at the interface between the first stack 321 and the first color filter 231. As a result, when the first stack 321 is provided, compared to the case in which the first stack 321 is not provided, the reflectance R of external light may be significantly reduced.

Therefore, according to an embodiment, the reflectance of external light incident on the color conversion substrate 30 and reflected at the interface between the second substrate 310 and the first color filter 231 may be reduced by disposing the first stack 321 between the second substrate 310 and the first color filter 231.

Similarly, the first stack 321 may be disposed between the second substrate 310 and the first color pattern 251, between the second substrate 310 and the second color pattern 252, and between the second substrate 310 and the third color pattern 253.

As described above, the first color filter 231 may include the same material as that of the first color pattern 251, the second color pattern 252, and the third color pattern 253. According to an embodiment, the refractive index of the first stack 321 may have a value between the refractive index of the second substrate 310 and the refractive index of the first color pattern 251, may have a value between the refractive index of the second substrate 310 and a refractive index of the second color pattern 252, and may have a value between the refractive index of the second substrate 310 and a refractive index of the third color pattern 253.

Therefore, when external light is incident on the second substrate 310 corresponding to the first color pattern 251, the second color pattern 252, and the third color pattern 253, the reflectance of the external light may be reduced as the first stack 321 is disposed between the second substrate 310 and the first color pattern 251, between the second substrate 310 and the second color pattern 252, and between the second substrate 310 and the third color pattern 253.

As illustrated in FIG. 11, the light blocking members 221, 222, and 223 may be disposed on one surface (a lower surface in FIG. 11) of each of the first color pattern 251, the second color pattern 252, and the third color pattern 253. The first light blocking member 221 may be disposed on the first color pattern 251, the second light blocking member 222 may be disposed on the second color pattern 252, and the third light blocking member 223 may be disposed on the third color pattern 253.

As illustrated in FIG. 11, a second stack 322 may be disposed on the first color filter 231, the first stack 321, the first color pattern 251, the second color pattern 252, the third color pattern 253, the first light blocking member 221, the second light blocking member 222, and the third light blocking member 223. The second stack 322 may be in direct contact with one surface (a lower surface in FIG. 11) of the first color filter 231 overlapping the first light transmitting area TA1. The second stack 322 may be in direct contact with one surface (a lower surface of FIG. 11) of each of the first light blocking member 221, the second light blocking member 222, and the third light blocking member 223. The second stack 322 may be in direct contact with the first stack 321 overlapping the second light transmitting area TA2 and the third light transmitting area TA3, respectively.

According to an embodiment, the second color filter 233 may be disposed in the second light transmitting area TA2, and the third color filter 235 may be disposed in the third light transmitting area TA3. The second stack 322 may be disposed between the first stack 321 and the second color filter 233, and may be in direct contact with one surface (an upper surface in FIG. 11) of the second color filter 233. The second stack 322 may be disposed between the first stack 321 and the third color filter 235, and may be in direct contact with one surface (an upper surface in FIG. 11) of the third color filter 235.

The second stack 322 may be disposed between the first stack 321 and the second color filter 233 to reduce a reflectance of external light at the interface between the first stack 321 and the second color filter 233. The second stack 322 may have a value between the refractive index of the first stack 321 and the refractive index of the second color filter 233. Similarly to the first stack 321 described above, the reflectance of external light incident on the color conversion substrate 30 and reflected may be reduced as the refractive index of the second stack 322 has the value between the refractive index of the first stack 321 and the refractive index of the second color filter 233.

Similarly, the second stack 322 may be disposed between the first stack 321 and the third color filter 235 to reduce a reflectance of external light at the interface between the first stack 321 and the third color filter 235. The second stack 322 may have a value between the refractive index of the first stack 321 and the refractive index of the third color filter 235. Therefore, the reflectance of external light incident on the color conversion substrate 30 and reflected may be reduced as the refractive index of the second stack 322 has the value between the refractive index of the first stack 321 and the refractive index of the third color filter 235.

As illustrated in FIG. 11, the first color filter 231, the first color pattern 251, the second color pattern 252, the third color pattern 253, the first light blocking member 221, the second light blocking member 222, and the third light blocking member 223 may be disposed between the first stack 321 and the second stack 322. As the first color filter 231, the first color pattern 251, the second color pattern 252, the third color pattern 253, the first light blocking member 221, the second light blocking member 222, and the third light blocking member 223 are disposed between the first stack 321 and the second stack 322, it is possible to prevent permeation of impurities such as moisture or air from the outside.

Each of the first stack 321 and the second stack 322 may include an inorganic material. The first stack 321 and the second stack 322 may include different inorganic materials. According to an embodiment, the refractive index of the first stack 321 may be smaller than the refractive index of the second stack 322. In an embodiment, external light may be incident on the color conversion substrate 30 in the order of the second substrate 310, the first stack 321, the second stack 322, and the second color filter 233 in the second light transmitting area TA2. The refractive index of the second substrate 310 may be the smallest and the refractive index of the second color filter 233 may be the largest. In this case, the refractive index of the first stack 321 may have a value between the refractive index of the second substrate 310 and the refractive index of the second stack 322, and the refractive index of the second stack 322 may have a value between the refractive indices of the first stack 321 and the second color filter 233. According to an embodiment, the refractive index of each component layer may increase in the same order as the order in which the external light is incident, that is, in the order of the second substrate 310 having the smallest refractive index, the first stack 321, the second stack 322, and the second color filter 233.

According to an embodiment, each of the first stack 321 and the second stack 322 may be any one of silicon oxide, silicon nitride oxide, silicon nitride, indium-tin-oxide (ITO), and indium-zinc-oxide (IZO). However, each of the first stack 321 and the second stack 322 is not limited thereto, and any transparent inorganic material such as titanium oxide, tantalum oxide, hafnium oxide, or zirconium oxide may be applied.

As illustrated in FIG. 11, the first capping layer 391 may be disposed on the second stack 322, the second color filter 233, and the third color filter 235. The first capping layer 391 may be in direct contact with one surface (a lower surface in FIG. 11) of each of the second stack 322, the second color filter 233, and the third color filter 235. Since the first capping layer 391 has been described with reference to FIG. 6, a redundant description thereof will be omitted.

The light transmission pattern 330, the first wavelength conversion pattern 340, and the second wavelength conversion pattern 350 may be disposed on the first capping layer 391. The second capping layer 392 may be disposed on the light transmission pattern 330, the first wavelength conversion pattern 340, and the second wavelength conversion pattern 350. The second capping layer 392 may cover and seal the light transmission pattern 330, the first wavelength conversion pattern 340, and the second wavelength conversion pattern 350.

The color mixing preventing member 370 may be disposed on the second capping layer 392. The color mixing preventing member 370 may be disposed in the light blocking areas BA1, BA2, and BA3 to block transmission of light.

As described above, in the color conversion substrate according to an embodiment, the reflectance of external light may be reduced between the second substrate 310 and the first color filter 231, and the reflectance of external light may be reduced between the second substrate 310 and the color patterns 251, 252, and 253 by forming the first stack 321 between the second substrate 310 and the first color filter 231 and between the second substrate 310 and the color patterns 251, 252, and 253. In addition, the reflectance of external light may be reduced between the second substrate 310 and the second and third color filters 233 and 235 by forming the first stack 321 and the second stack 322 between the second substrate 310 and the second color filter 233 and between the second substrate 310 and the third color filter 235.

Figure 12:
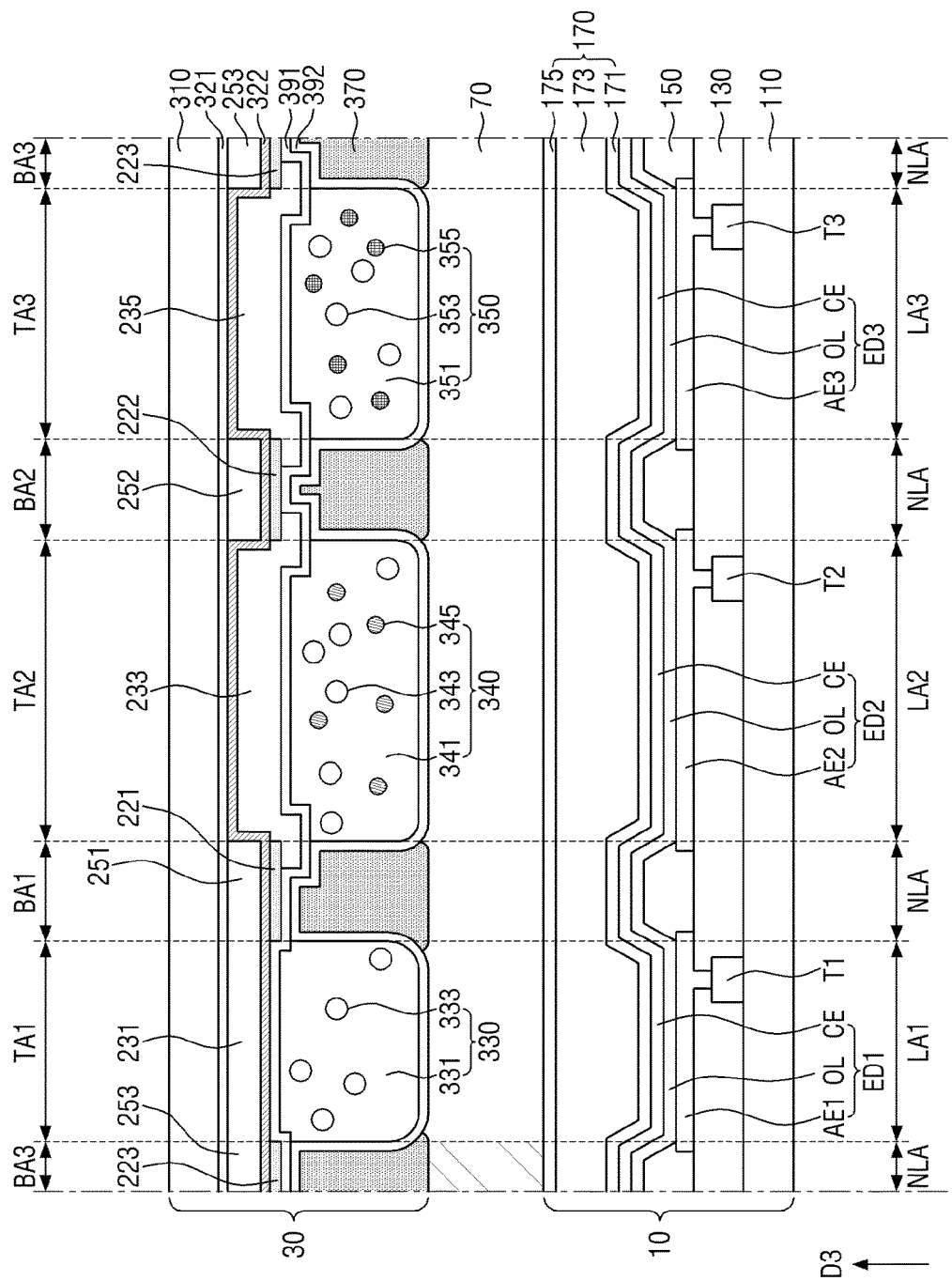
FIGS. 12 and 13 are cross-sectional views schematically illustrating a display device according to still another embodiment taken along line B-B' of FIGS. 3 and 4.

FIG. 12 is a cross-sectional view schematically illustrating a display device according to still another embodiment taken along line B-B' of FIGS. 3 and 4.

Referring to FIG. 12, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 11 described above in that a position of the light blocking member 220 is different, and other configurations are substantially the same or similar. Therefore, a redundant description will be omitted and differences will be mainly described.

As illustrated in FIG. 12, the light blocking member 220 may be disposed on one surface of the second substrate 310 facing the display substrate 10.

According to an embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

The light blocking member 220 may be disposed on the second stack 322. Specifically, the first light blocking member 221 may overlap the first light blocking area BA1 and may be disposed on the second stack 322. The first light blocking member 221 may be in direct contact with one surface (a lower surface in FIG. 12) of the second stack 322. The second light blocking member 222 may overlap the second light blocking area BA2 and may be disposed on the second stack 322. The second light blocking member 222 may be in direct contact with one surface (a lower surface in FIG. 12) of the second stack 322. The third light blocking member 223 may overlap the third light blocking area BA3 and may be disposed on the second stack 322. The third light blocking member 223 may be in direct contact with one surface (a lower surface in FIG. 12) of the second stack 322.

According to the illustrated embodiment, the light blocking member 220 may be disposed between the second stack 322 and the first capping layer 391.

According to an embodiment, the first light blocking member 221 may overlap the first capping layer 391, and at least one area thereof may overlap the second color filter 233. One area of one surface (a lower surface of FIG. 12) of the first light blocking member 221 may be in direct contact with the first capping layer 391, and the other area thereof may be in direct contact with one surface of the second color filter 233. The second light blocking member 222 may overlap the first capping layer 391, at least one area thereof may overlap the second color filter 233, and the other area thereof may overlap the third color filter 235. One area of one surface (a lower surface of FIG. 12) of the second light blocking member 222 may be in direct contact with the first capping layer 391, and the other area thereof may be in direct contact with the second color filter 233. The third light blocking member 223 may overlap the first capping layer 391, at least one area thereof may overlap the second color filter 233, and the other area thereof may overlap the third color filter 235. One area of one surface (a lower surface of FIG. 12) of the third light blocking member 223 may be in direct contact with the first capping layer 391, and the other area thereof may be in direct contact with the third color filter 235.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 13:
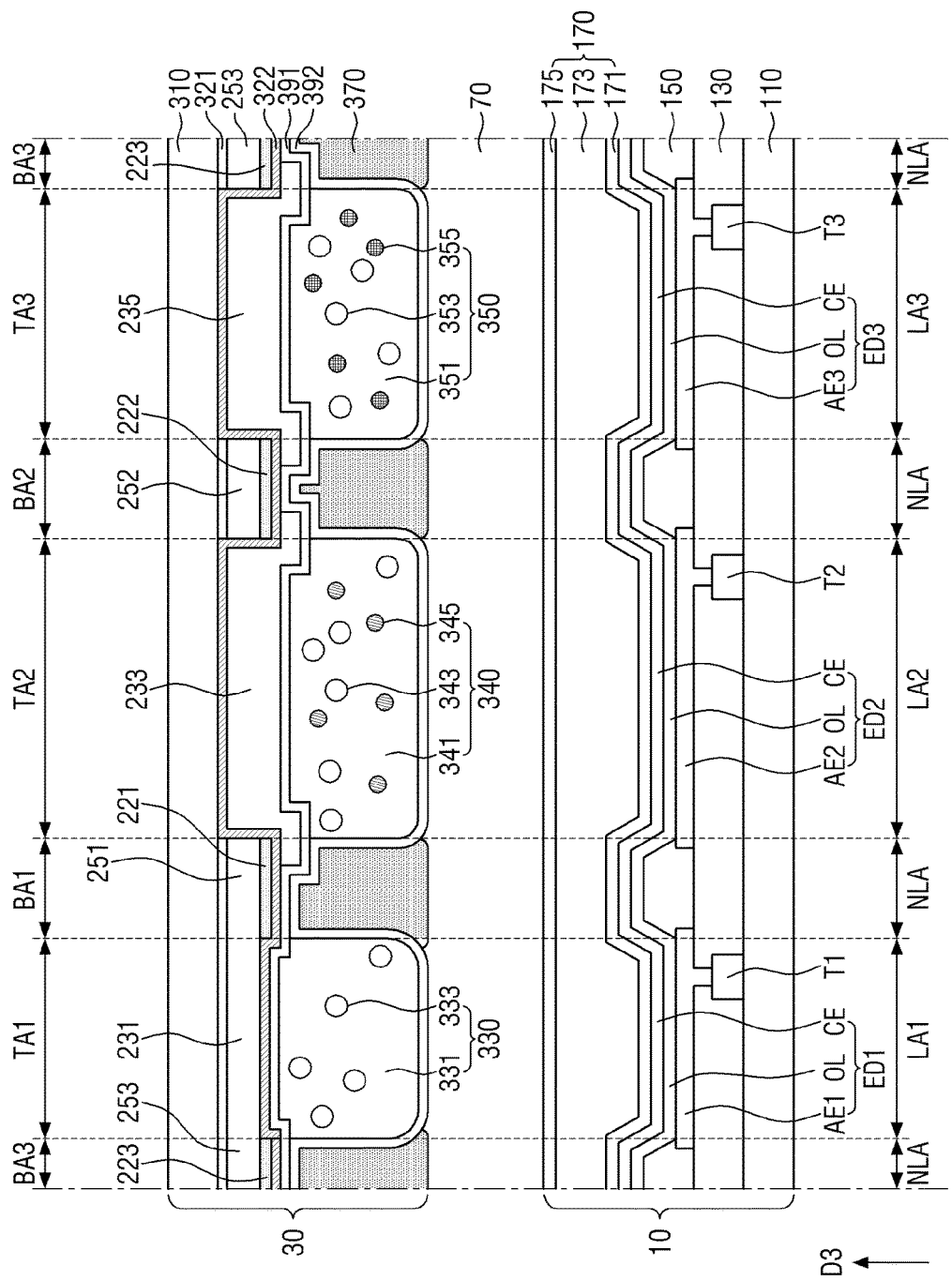
Figure 14:
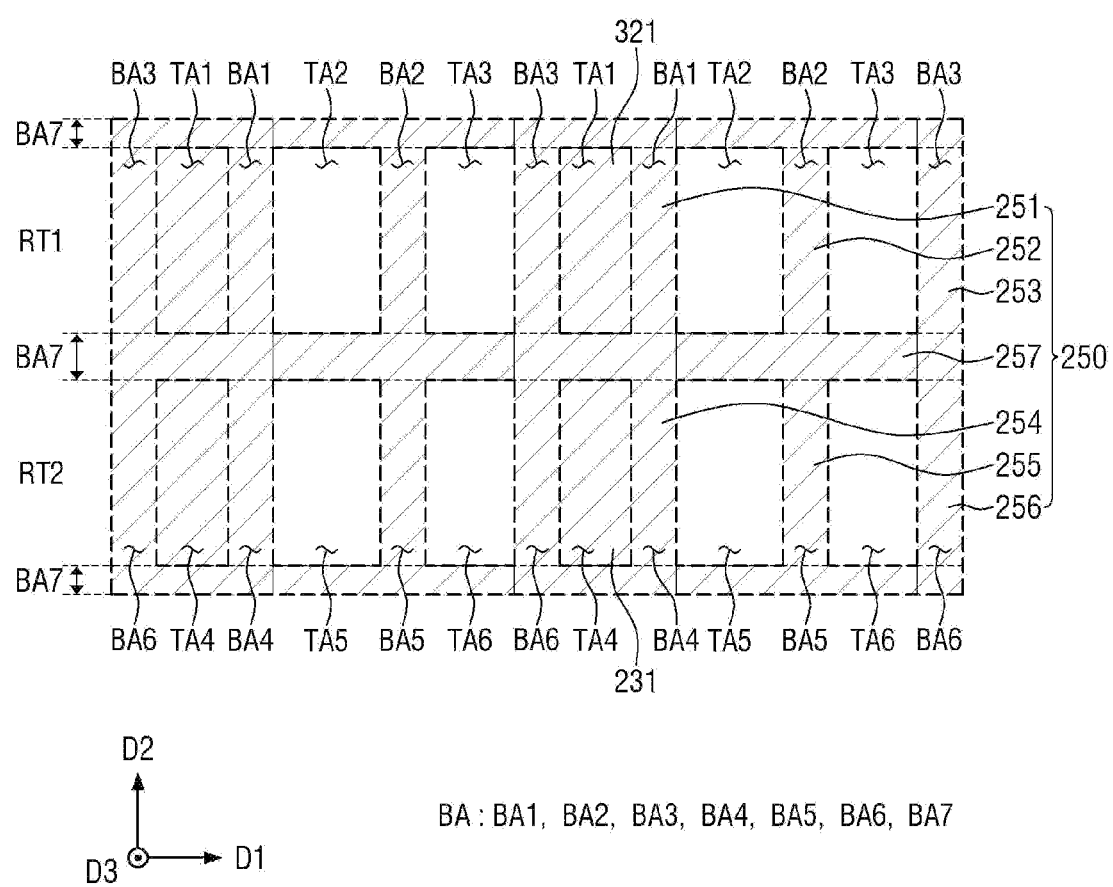
FIG. 14 is a plan view schematically illustrating a first stack of the color conversion substrate illustrated in FIG. 13.
Figure 15:
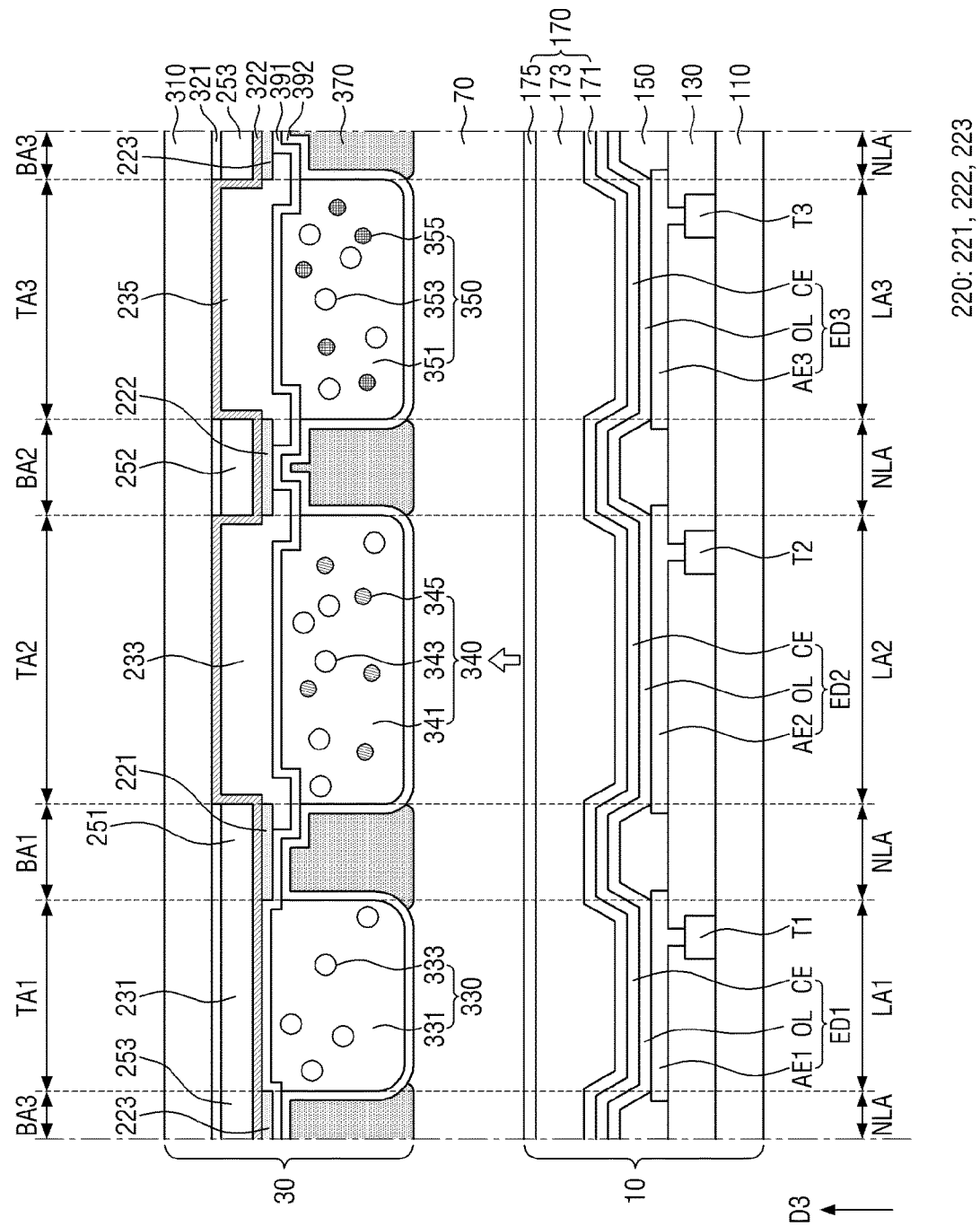
FIGS. 15 to 21 are cross-sectional views schematically illustrating a display device according to still another embodiment taken along line B-B' of FIGS. 3 and 4.

FIG. 13 is a cross-sectional view schematically illustrating a display device according to still another embodiment taken along line B-B' of FIGS. 3 and 4, FIG. 14 is a plan view schematically illustrating a first stack of the color conversion substrate illustrated in FIG. 13, and FIG. 15 is a cross-sectional view schematically illustrating a display device according to still another embodiment taken along line B-B' of FIGS. 3 and 4.

Referring to FIG. 13, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 11 described above in that a position of the first stack 321 is different, and other configurations are substantially the same or similar. Therefore, a redundant description will be omitted and differences will be mainly described.

Referring to FIGS. 13 and 14, the first stack 321 may be disposed on one surface of the second substrate 310 facing the display substrate 10. The first color filter 231, the first color pattern 251, the second color pattern 252, and the third color pattern 253 may be disposed on one surface (a lower surface in FIG. 13) of the first stack 321. The first stack 321 may be disposed between the second substrate 310 and the first color pattern 251, between the second substrate 310 and the second color pattern 252, and between the second substrate 310 and the third color pattern 253. The first stack 321 may contact one surface (an upper surface in FIG. 13) of each of the first color pattern 251, the second color pattern 252, and the third color pattern 253.

According to the illustrated embodiment, as illustrated in FIG. 14, the first stack 321 may be disposed in the remaining areas other than the second light transmitting area TA2 and the third light transmitting area TA3, that is, the first light transmitting area TA1, the first light blocking area BA1, the second light blocking area BA2, the third light blocking area BA3, the fourth light blocking area BA4, the fifth light blocking area BA5, the sixth light blocking area BA6, and the seventh light blocking area BA7.

As illustrated in FIG. 13, the first stack 321 may be disposed between the second substrate 310 and the first color filter 231 to reduce a reflectance of external light reflected from an interface between the second substrate 310 and the first color filter 231. According to an embodiment, a refractive index of the first stack 321 may have a value between a refractive index of the second substrate 310 and a refractive index of the first color filter 231.

The first stack 321 may be disposed between the second substrate 310 and the first color pattern 251, between the second substrate 310 and the second color pattern 252, and between the second substrate 310 and the third color pattern 253. The refractive index of the first stack 321 may have a value between the refractive index of the second substrate 310 and the refractive index of the first color pattern 251, may have a value between the refractive index of the second substrate 310 and a refractive index of the second color pattern 252, and may have a value between the refractive index of the second substrate 310 and a refractive index of the third color pattern 253. Therefore, when external light is incident on the second substrate 310 corresponding to the first color pattern 251, the second color pattern 252, and the third color pattern 253, the reflectance of the external light may be reduced as the first stack 321 is disposed between the second substrate 310 and the first color pattern 251, between the second substrate 310 and the second color pattern 252, and between the second substrate 310 and the third color pattern 253.

According to an embodiment, the second stack 322 may be in direct contact with one surface (a lower surface in FIG. 13) of the first color filter 231 overlapping the first light transmitting area TA1. The second stack 322 may be in direct contact with one surface (a lower surface of FIG. 13) of each of the first light blocking member 221, the second light blocking member 222, and the third light blocking member 223. In particular, the second stack 322 may be in direct contact with one surface (a lower surface in FIG. 13) of the second substrate 310 overlapping the second light transmitting area TA2 and the third light transmitting area TA3. The second stack 322 may contact one surface (an upper surface in FIG. 13) of the second color filter 233 in the second light transmitting area TA2, and may contact one surface (an upper surface in FIG. 13) of the third color filter 235 in the third light transmitting area TA3.

According to the illustrated embodiment, the first stack 321 having a refractive index between the refractive index of the first color filter 231 and the refractive index of the second substrate 310 may be disposed between the first color filter 231 and the second substrate 310. The second stack 322 having a refractive index between the refractive index of the second color filter 233 and the refractive index of the second substrate 310 and having a refractive index between the refractive index of the third color filter 235 and the refractive index of the second substrate 310 may be disposed between the second color filter 233 and the second substrate 310 and between the third color filter 235 and the second substrate 310.

That is, the reflectance of external light at the interface between the first color filter 231 and the second substrate 310, the interface between the first color pattern 251 and the second substrate 310, the interface between the second color pattern 252 and the second substrate 310, and the interface between the third color pattern 253 and the second substrate 310 may be reduced by selectively forming the first stack 321 in the areas in which the first color filter 231, the first color pattern 251, the second color pattern 252, and the third color pattern 253 are disposed. In addition, the reflectance of external light at the interface between the second color filter 233 and the second substrate 310 and the interface between the third color filter 235 and the second substrate 310 may be reduced by forming the second stack 322 in the areas in which the second color filter 233 and the third color filter 235.

As illustrated in FIG. 15, the light blocking member 220 may be disposed on the second stack 322. Similarly to the position of the light blocking member 220 of FIG. 12 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 12, and thus a detailed description thereof will be omitted.

As illustrated in FIG. 15, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 16:
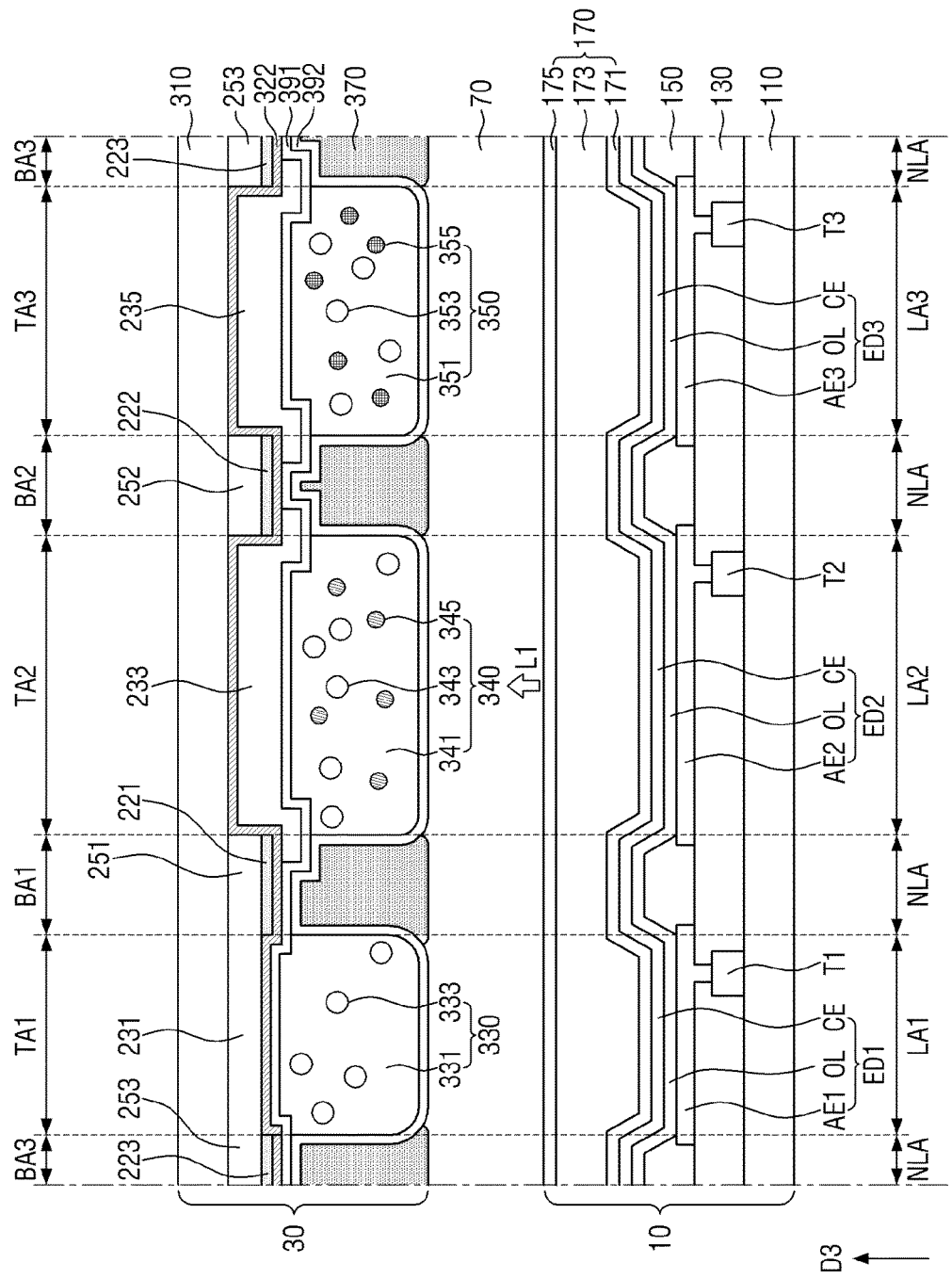
Figure 17:
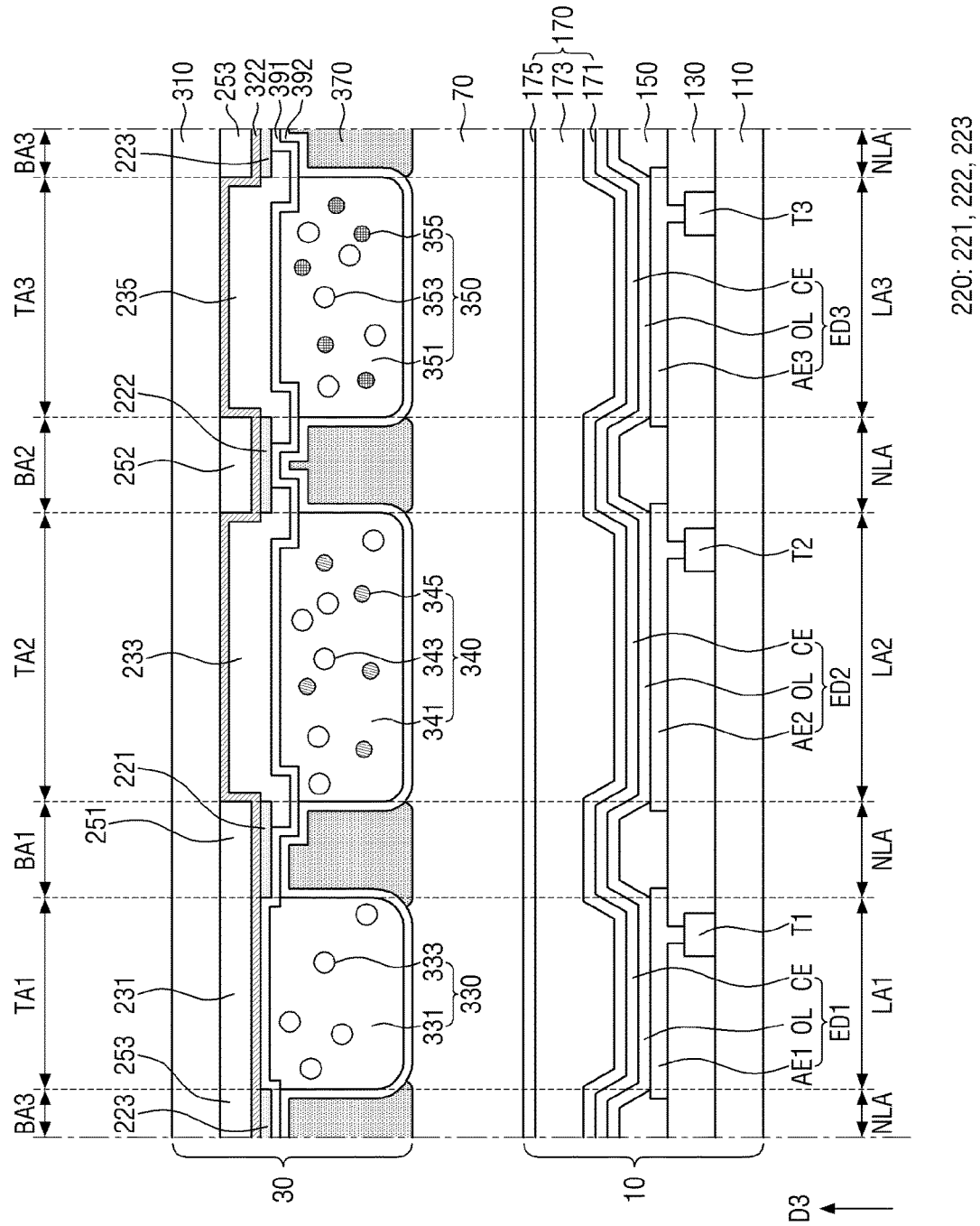

FIG. 16 is a cross-sectional view schematically illustrating a display device according to still another embodiment taken along line B-B' of FIGS. 3 and 4, and FIG. 17 is a cross-sectional view schematically illustrating a display device according to still another embodiment taken along line B-B' of FIGS. 3 and 4.

Referring to FIG. 16, the color conversion substrate 30 according to the illustrated embodiment may include the second substrate 310, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 11 described above in that the first stack 321 is omitted, and other configurations are substantially the same or similar. Therefore, a redundant description will be omitted and differences will be mainly described.

Referring to FIG. 16, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 16) of the second substrate 310.

According to an embodiment, the second stack 322 may be disposed on the first color filter 231, the first light blocking member 221, the second light blocking member 222, the third light blocking member 223, and the second substrate 310. The second stack 322 may be in direct contact with one surface (a lower surface in FIG. 16) of the first color filter 231 overlapping the first light transmitting area TA1, and may be in direct contact with one surface (a lower surface in FIG. 16) of each of the first light blocking member 221, the second light blocking member 222, and the third light blocking member 223.

According to an embodiment, the second stack 322 may be in direct contact with one surface (a lower surface in FIG. 16) of the second substrate 310 overlapping the second light transmitting area TA2 and the third light transmitting area TA3. The second stack 322 may contact one surface (an upper surface in FIG. 16) of the second color filter 233 in the second light transmitting area TA2, and may contact one surface (an upper surface in FIG. 16) of the third color filter 235 in the third light transmitting area TA3.

According to the illustrated embodiment, the second stack 322 having a refractive index between the refractive index of the second color filter 233 and the refractive index of the second substrate 310 and having a refractive index between the refractive index of the third color filter 235 and the refractive index of the second substrate 310 may be disposed between the second color filter 233 and the second substrate 310 and between the third color filter 235 and the second substrate 310.

That is, the reflectance of external light at the interface between the second color filter 233 and the second substrate 310 and the interface between the third color filter 235 and the second substrate 310 may be reduced by forming the second stack 322 in the areas in which the second color filter 233 and the third color filter 235.

Although the second stack 322 is described as an example in the illustrated embodiment, the disclosure is not limited thereto, and the first stack 321 may also be disposed at the position of the second stack 322 instead of the second stack 322.

As illustrated in FIG. 17, the light blocking member 220 may be disposed on the second stack 322. Similarly to the position of the light blocking member 220 of FIG. 17 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 12, and thus a detailed description thereof will be omitted.

As illustrated in FIG. 17, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 18:
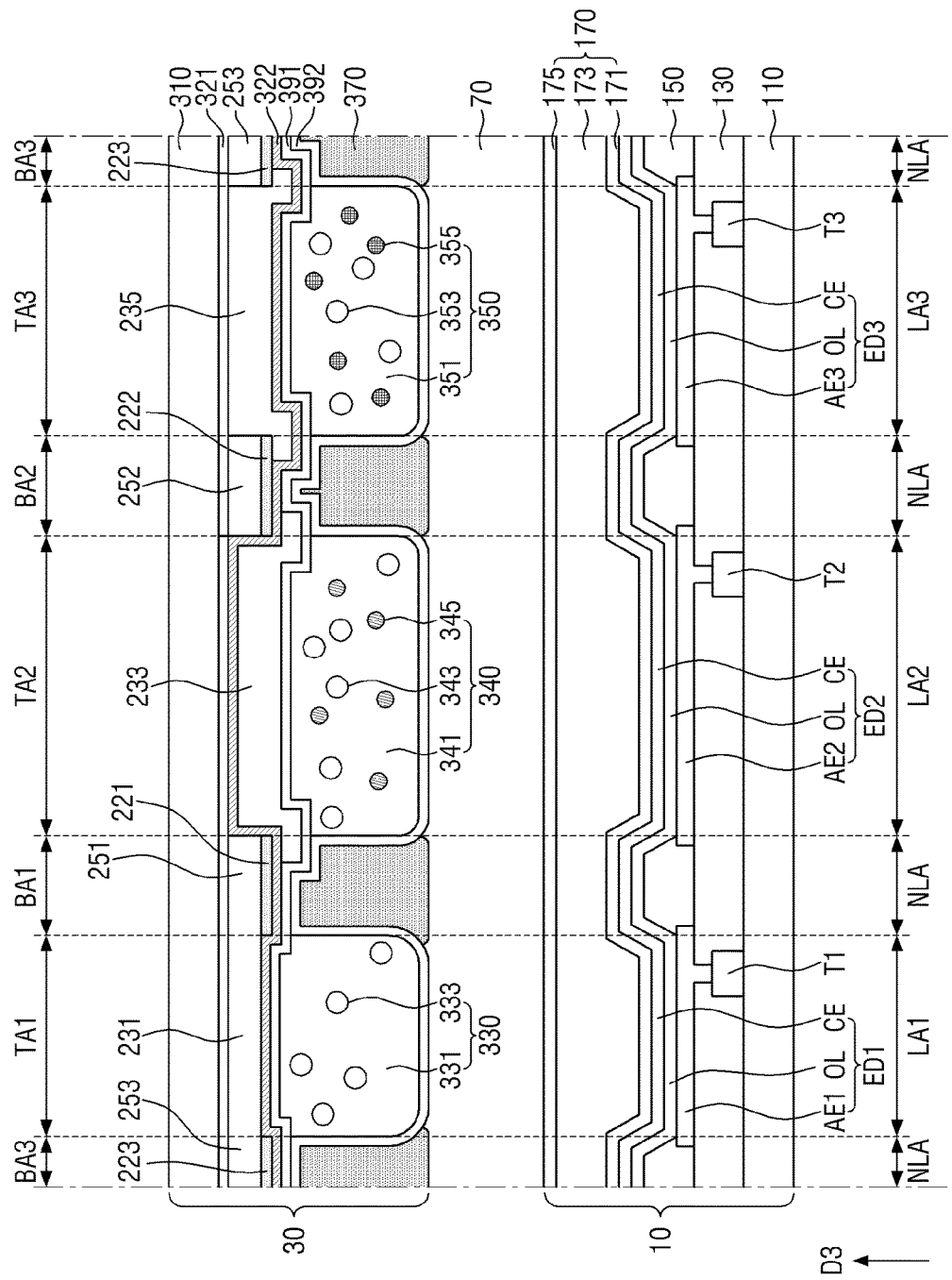

FIG. 18 is a cross-sectional view schematically illustrating a display device according to still another embodiment taken along line B-B' of FIGS. 3 and 4.

Referring to FIG. 18, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 11 described above in that a position of the second stack 322 is different, and other configurations are substantially the same or similar. Therefore, a redundant description will be omitted and differences will be mainly described.

As illustrated in FIG. 18, the second stack 322 may be disposed on the first color filter 231, the third color filter 235, the first stack 321, the first light blocking member 221, the second light blocking member 222, and the third light blocking member 223.

The second stack 322 may be in direct contact with one surface (a lower surface in FIG. 18) of the first color filter 231 overlapping the first light transmitting area TA1. The second stack 322 may be in direct contact with one surface (a lower surface of FIG. 18) of each of the first light blocking member 221, the second light blocking member 222, and the third light blocking member 223.

The second stack 322 may be in direct contact with one surface (a lower surface in FIG. 18) of the first stack 321 overlapping the second light transmitting area TA2. According to an embodiment, the second color filter 233 may be disposed in the second light transmitting area TA2. The second stack 322 may be in direct contact with one surface (an upper surface in FIG. 18) of the second color filter 233, and may be disposed between the first stack 321 and the second color filter 233.

The second stack 322 may be disposed between the first stack 321 and the second color filter 233 to reduce a reflectance of external light at the interface between the first stack 321 and the second color filter 233. The second stack 322 may have a value between the refractive index of the first stack 321 and the refractive index of the second color filter 233. Similarly to the first stack 321 described above, the reflectance of external light incident on the color conversion substrate 30 and reflected may be reduced as the refractive index of the second stack 322 has the value between the refractive index of the first stack 321 and the refractive index of the second color filter 233.

The second stack 322 may be disposed to overlap the third light transmitting area TA3. The third color filter 235 may be disposed in the third light transmitting area TA3. The third color filter 235 may contact one surface (a lower surface in FIG. 18) of the first stack 321 in the third light transmitting area TA3. A portion of the third color filter 235 may contact one surface (a lower surface in FIG. 18) of the second light blocking member 222, and another portion thereof may contact one surface (a lower surface in FIG. 18) of the third light blocking member 223.

The second stack 322 may cover the third color filter 235 and may contact one surface (a lower surface of FIG. 18) of the third color filter 235. The second stack 322 may contact one surface (a lower surface in FIG. 18) of the second light blocking member 222 overlapping the second light blocking area BA2, and may contact one surface (a lower surface in FIG. 18) of the third light blocking member 223 overlapping the third light blocking area BA3.

The second stack 322 is disposed between the first stack 321 and the second color filter 233 in the second light transmitting area TA2, but may be disposed to contact the lower surface of the third color filter 235 in the third light transmitting area TA3. The second stack 322 may serve to protect the third color filter 235 in the third light transmitting area TA3.

In the third light transmitting area TA3, the first stack 321 may be disposed between the second substrate 310 and the third color filter 235. The reflectance of external light incident on the color conversion substrate 30 and reflected may be reduced as the refractive index of the first stack 321 has the value between the refractive index of the second substrate 310 and the refractive index of the third color filter 235.

According to the illustrated embodiment, as described above, the reflectance of external light in the second light transmitting area TA2 overlapping the second color filter 233 may be reduced as the second stack 322 is disposed between the first stack 321 and the second color filter 233 in the second light transmitting area TA2.

Figure 19:
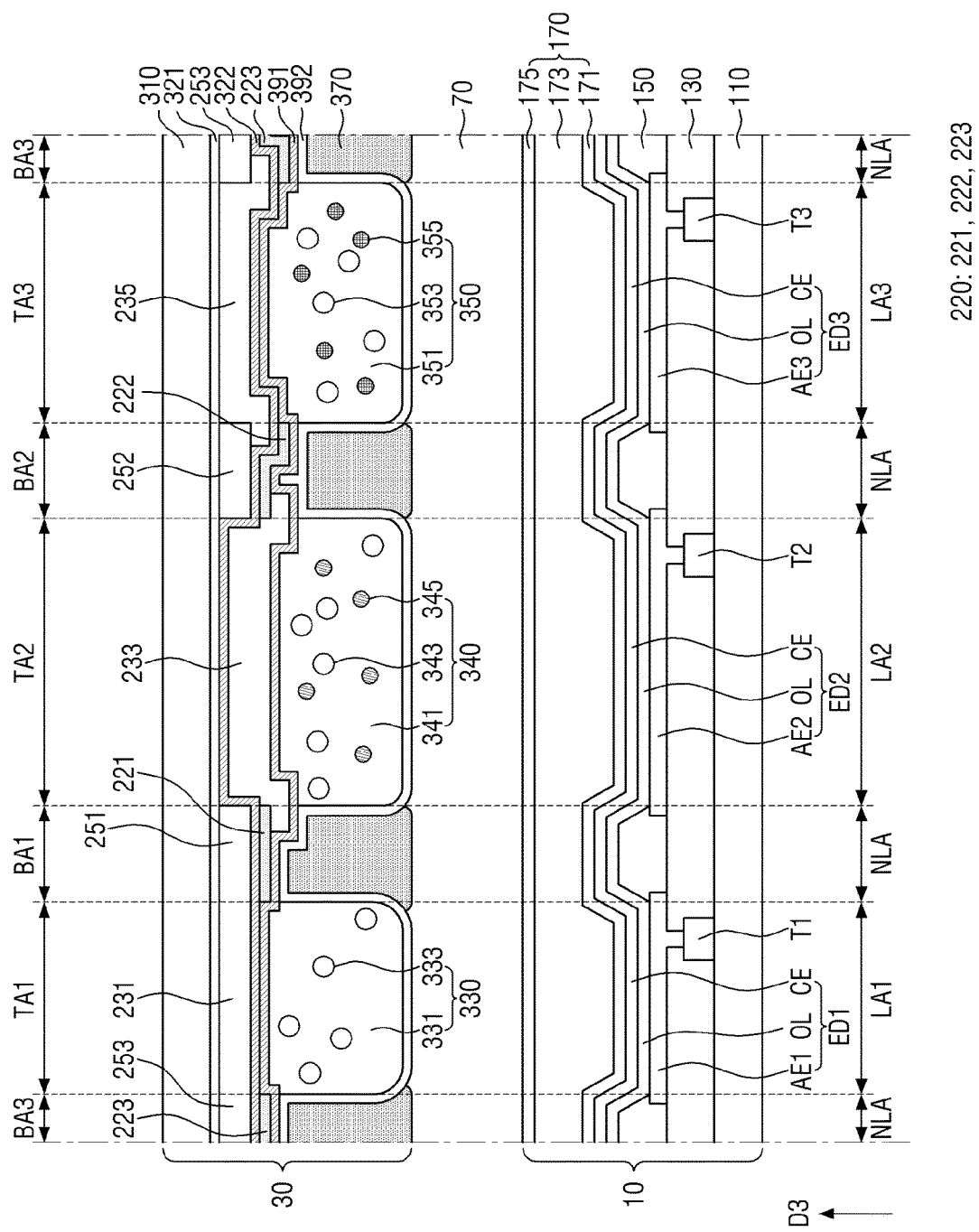

FIG. 19 is a cross-sectional view schematically illustrating a display device according to still another embodiment taken along line B-B' of FIGS. 3 and 4.

Referring to FIG. 19, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 18 described above in that a position of the light blocking member 220 is different, and other configurations are substantially the same or similar. Therefore, a redundant description will be omitted and differences will be mainly described.

As illustrated in FIG. 19, the light blocking member 220 may be disposed on one surface of the second substrate 310 facing the display substrate 10.

According to an embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

The light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 19) of the second stack 322. The second light blocking member 222 may overlap the second light blocking area BA2 and may be disposed on the second stack 322. The second light blocking member 222 may contact one surface (a lower surface in FIG. 19) of the second stack 322. The third light blocking member 223 may overlap the third light blocking area BA3 and may be disposed on the second stack 322. The third light blocking member 223 may contact one surface (a lower surface in FIG. 19) of the second stack 322.

The first color filter 231 may not overlap the first light blocking member 221 and may be spaced apart from the first light blocking member 221. The second color filter 233 may contact one surface (a lower surface in FIG. 19) of the second stack 322, may overlap the first light blocking member 221 in the first light blocking area BA1, and may contact one surface (a lower surface of FIG. 19) of the first light blocking member 221. In addition, the second color filter 233 may overlap the second light blocking member 222 in the second light blocking area BA2 and may contact one surface (a lower surface in FIG. 19) of the second light blocking member 222.

The third color filter 235 may overlap the second light blocking member 222 in the second light blocking area BA2, and may be spaced apart from the second light blocking member 222 due to the second stack 322 disposed between the third color filter 235 and the second light blocking member 222. Similarly, the third color filter 235 may overlap the third light blocking member 223 in the third light blocking area BA3, and may be spaced apart from the third light blocking member 223 due to the second stack 322 disposed between the third color filter 235 and the third light blocking member 223.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 20:
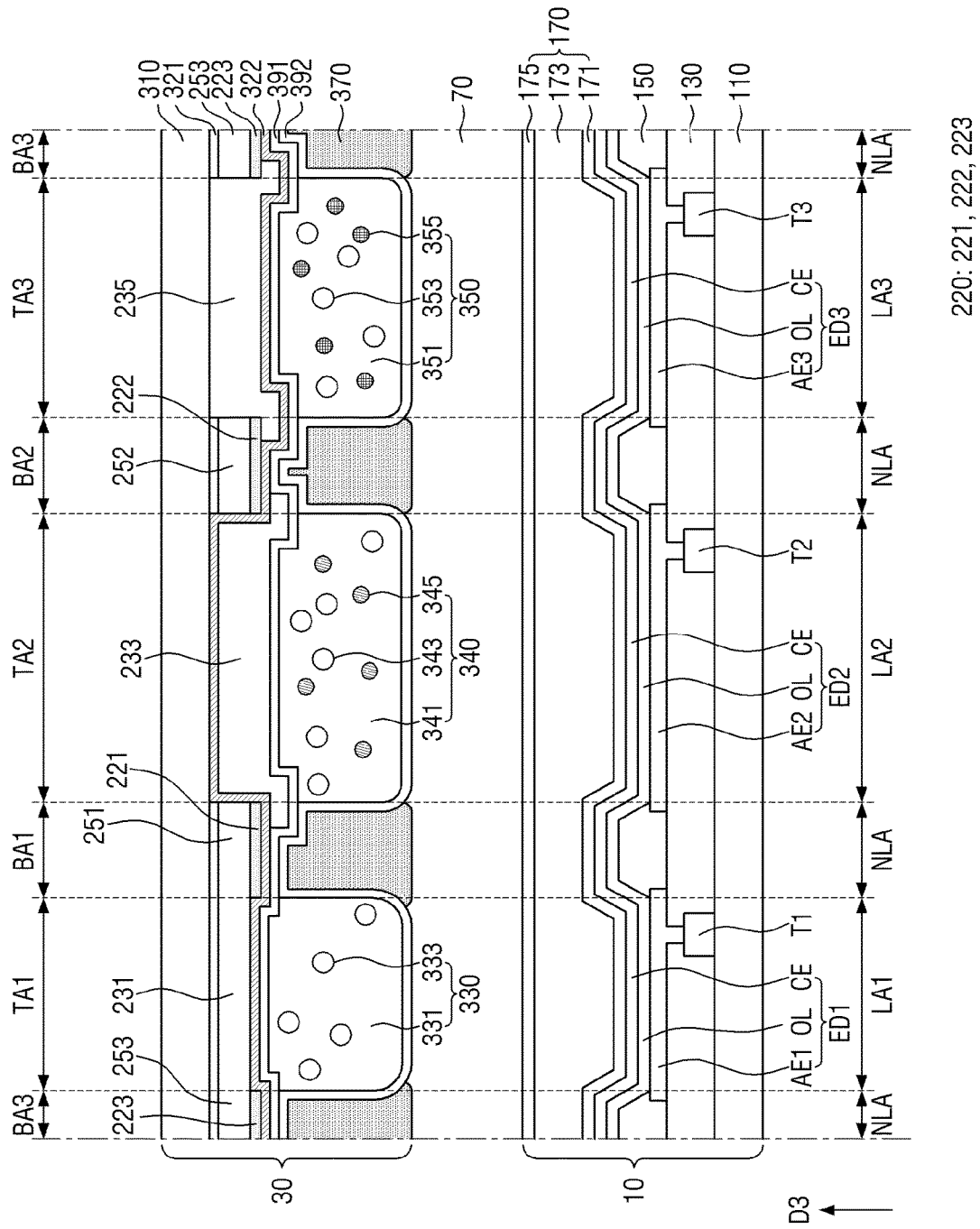
Figure 21:
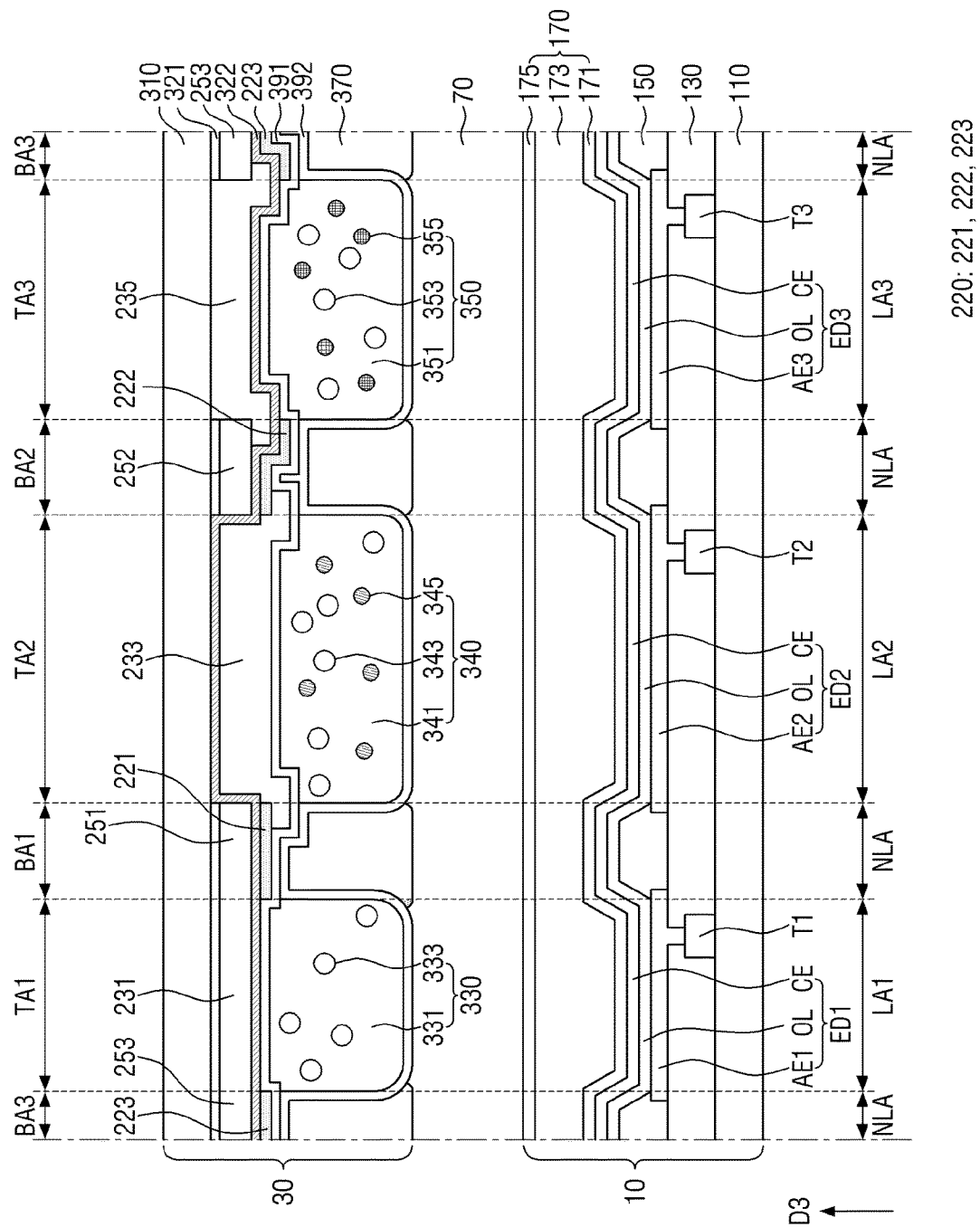

FIGS. 20 and 21 are cross-sectional views schematically illustrating a display device according to still another embodiment taken along line B-B' of FIGS. 3 and 4.

As illustrated in FIG. 20, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may contact one surface (a lower surface in FIG. 20) of the second substrate 310 in the second light transmitting area TA2. The third color filter 235 may contact one surface (a lower surface in FIG. 20) of the second substrate 310 in the third light transmitting area TA3. The configurations other than the configuration of the first stack 321 are substantially the same as or similar to those of FIG. 18 described above, and thus detailed descriptions thereof will be omitted.

According to the illustrated embodiment, the reflectance of external light between the second color filter 233 and the second substrate 310 may be reduced by selectively disposing the second stack 322 between the second color filter 233 and the second substrate 310 in the second light transmitting area TA2.

In addition, as illustrated in FIG. 21, the light blocking member 220 may be disposed on the second stack 322. Similarly to the position of the light blocking member 220 of FIG. 19 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 19, and thus a detailed description thereof will be omitted.

Figure 22:
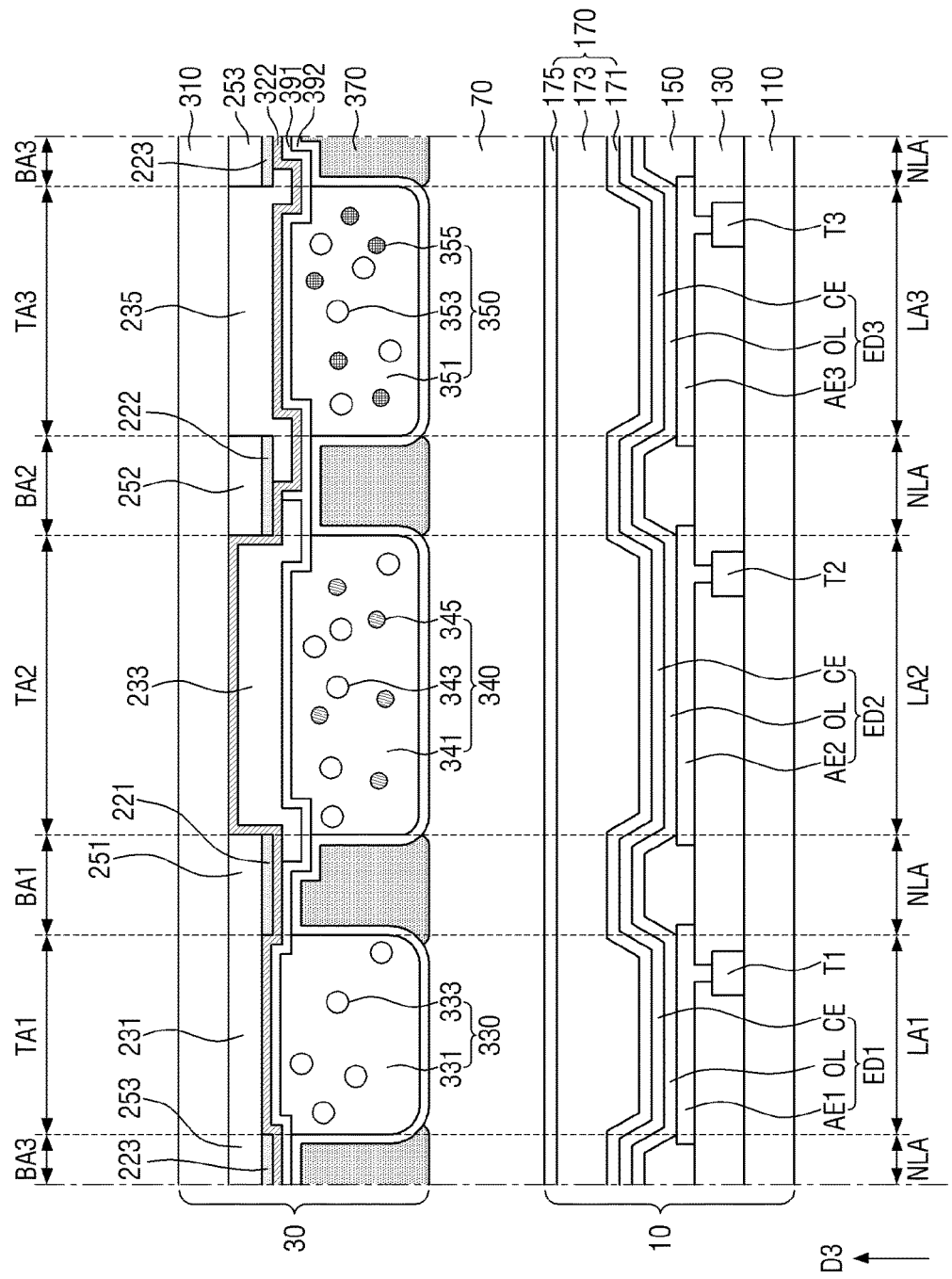
FIGS. 22 and 23 are cross-sectional views schematically illustrating a display device according to still another embodiment taken along line B-B' of FIGS. 3 and 4.
Figure 23:
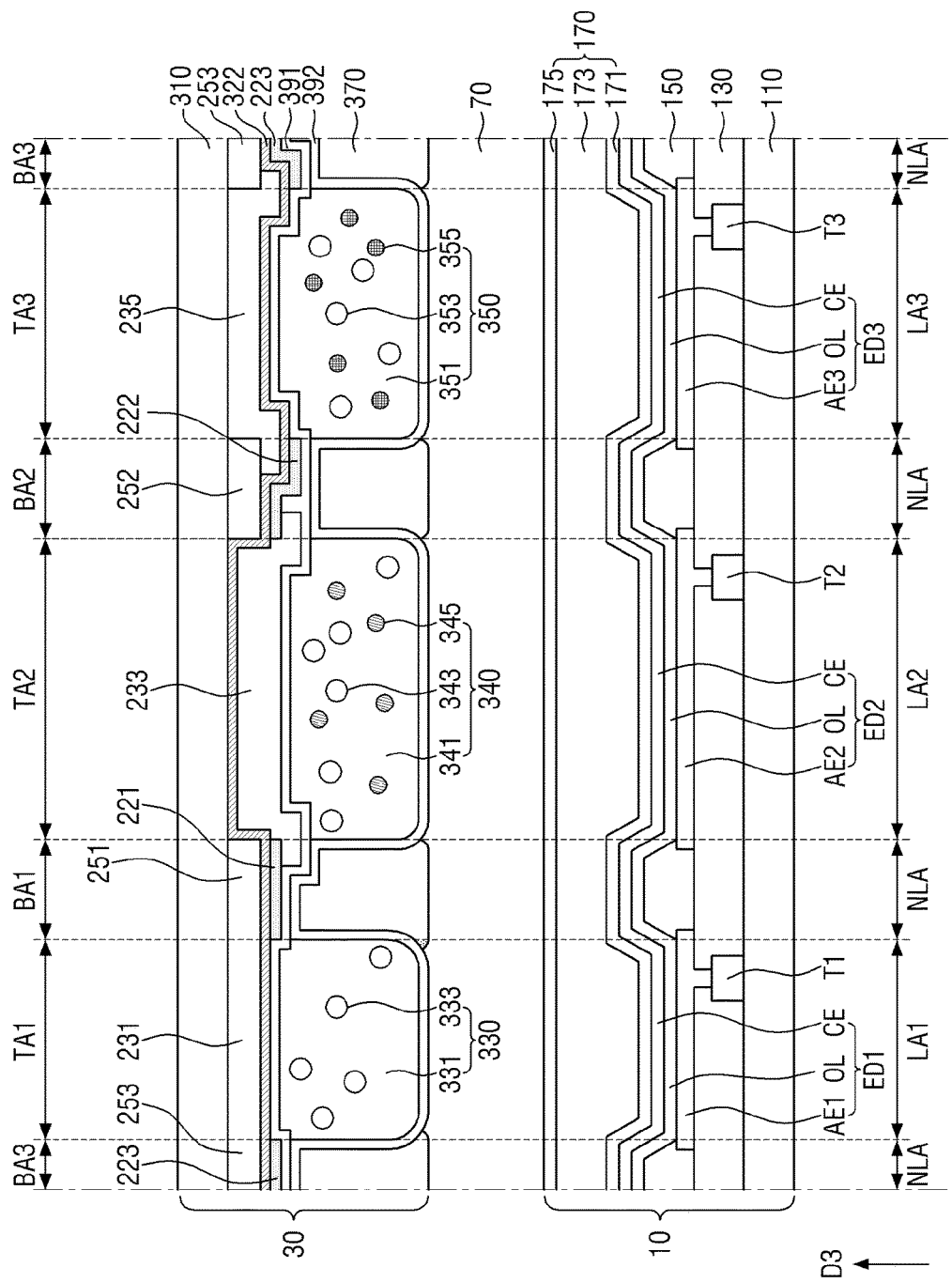

FIGS. 22 and 23 are cross-sectional views schematically illustrating a display device according to still another embodiment taken along line B-B' of FIGS. 3 and 4.

Referring to FIG. 22, the color conversion substrate 30 according to the illustrated embodiment may include the second substrate 310, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 18 described above in that the first stack 321 is omitted, and other configurations are substantially the same or similar. Therefore, a redundant description will be omitted and differences will be mainly described.

Referring to FIG. 22, the first color filter 231, the first color pattern 251, the second color pattern 252, and the third color pattern 253 may be disposed on one surface of the second substrate 310 facing the display substrate 10. The first color filter 231, the third color filter 235, the first color pattern 251, the second color pattern 252, and the third color pattern 253 may be in direct contact with one surface (a lower surface in FIG. 22) of the second substrate 310.

According to an embodiment, the second stack 322 may be disposed on the first color filter 231, the third color filter 235, the first light blocking member 221, the second light blocking member 222, the third light blocking member 223, and the second substrate 310. The second stack 322 may be in direct contact with one surface (a lower surface in FIG. 22) of the first color filter 231 in the first light transmitting area TA1, and may be in direct contact with one surface (a lower surface in FIG. 22) of the third color filter 235 in the third light transmitting area TA3. The second stack 322 may be in direct contact with one surface (a lower surface of FIG. 22) of each of the first light blocking member 221, the second light blocking member 222, and the third light blocking member 223.

According to an embodiment, the second stack 322 may be disposed between the second substrate 310 and the second color filter 233 in the second light transmitting area TA2. The second stack 322 may be in direct contact with one surface (a lower surface in FIG. 22) of the second substrate 310 overlapping the second light transmitting area TA2. The second stack 322 may contact one surface (an upper surface in FIG. 22) of the second color filter 233 in the second light transmitting area TA2.

According to the illustrated embodiment, the second stack 322 having a refractive index between the refractive index of the second color filter 233 and the refractive index of the second substrate 310 may be disposed between the second color filter 233 and the second substrate 310. That is, by selectively forming the second stack 322 in the area in which the second color filter 233 is disposed, the reflectance of external light at the interface between the second color filter 233 and the second substrate 310 may be reduced. Although the second stack 322 is described as an example in the illustrated embodiment, the disclosure is not limited thereto, and the first stack 321 may also be disposed at the position of the second stack 322 instead of the second stack 322.

As illustrated in FIG. 23, the light blocking member 220 may be disposed on the second stack 322. Similarly to the position of the light blocking member 220 of FIG. 19 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 19, and thus a detailed description thereof will be omitted.

As illustrated in FIG. 23, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 24:
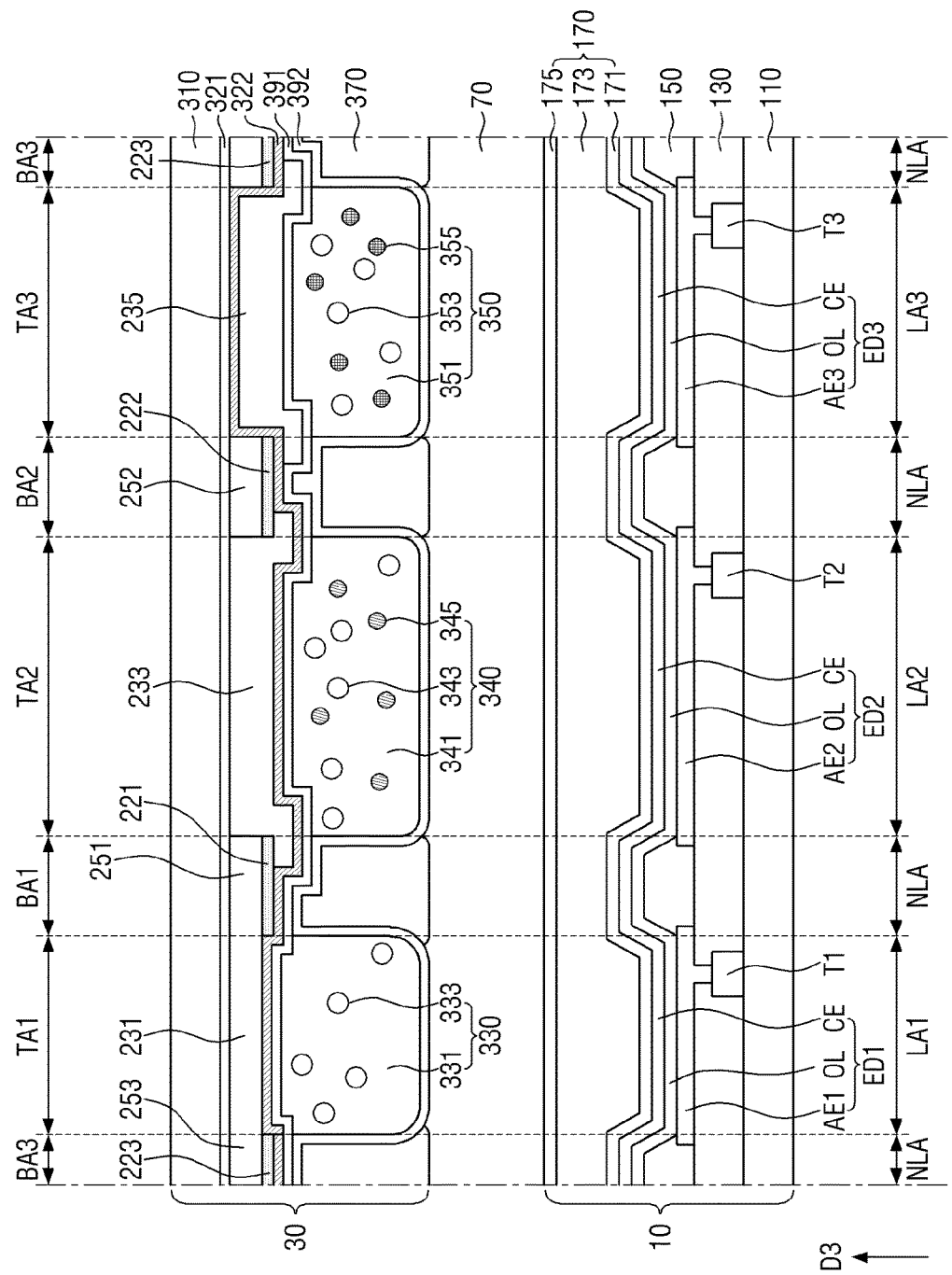
FIGS. 24 to 30 are cross-sectional views schematically illustrating a display device according to still another embodiment taken along line B-B' of FIGS. 3 and 4.

FIG. 24 is a cross-sectional view schematically illustrating a display device according to still another embodiment taken along line B-B' of FIGS. 3 and 4.

Referring to FIG. 24, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 18 described above in that a position of the second stack 322 is different, and other configurations are substantially the same or similar. Therefore, a redundant description will be omitted and differences will be mainly described.

As illustrated in FIG. 24, the second stack 322 may be disposed on the first color filter 231, the second color filter 233, the first stack 321, the first light blocking member 221, the second light blocking member 222, and the third light blocking member 223.

The second stack 322 may be in direct contact with one surface (a lower surface in FIG. 24) of the first color filter 231 overlapping the first light transmitting area TA1 and one surface (a lower surface in FIG. 24) of each of the first light blocking member 221, the second light blocking member 222, and the third light blocking member 223.

The second stack 322 may be in direct contact with one surface (a lower surface in FIG. 24) of the first stack 321 overlapping the third light transmitting area TA3. According to an embodiment, the third color filter 235 may be disposed in the third light transmitting area TA3. The second stack 322 may be in direct contact with one surface (an upper surface in FIG. 24) of the third color filter 235, and may be disposed between the first stack 321 and the third color filter 235.

The second stack 322 may be disposed between the first stack 321 and the third color filter 235 to reduce a reflectance of external light at the interface between the first stack 321 and the third color filter 235. The second stack 322 may have a value between the refractive index of the first stack 321 and the refractive index of the third color filter 235. Similarly to the first stack 321 described above, the reflectance of external light incident on the color conversion substrate 30 and reflected may be reduced as the refractive index of the second stack 322 has the value between the refractive index of the first stack 321 and the refractive index of the third color filter 235.

The second stack 322 may be disposed to overlap the second light transmitting area TA2. The second color filter 233 may be disposed in the second light transmitting area TA2. The second color filter 233 may contact one surface (a lower surface in FIG. 24) of the first stack 321 in the second light transmitting area TA2. A portion of the second color filter 233 may contact one surface (a lower surface in FIG. 24) of the first light blocking member 221, and another portion thereof may contact one surface (a lower surface in FIG. 24) of the second light blocking member 222.

The second stack 322 may cover the second color filter 233 and may contact one surface (a lower surface of FIG. 24) of the second color filter 233. The second stack 322 may contact one surface (a lower surface in FIG. 24) of the first light blocking member 221 overlapping the first light blocking area BA1, and may contact one surface (a lower surface in FIG. 24) of the second light blocking member 222 overlapping the second light blocking area BA2.

The second stack 322 is disposed between the first stack 321 and the third color filter 235 in the third light transmitting area TA3, but may be disposed to contact the lower surface of the second color filter 233 in the second light transmitting area TA2. The second stack 322 may serve to protect the second color filter 233 in the second light transmitting area TA2.

In the second light transmitting area TA2, the first stack 321 may be disposed between the second substrate 310 and the second color filter 233. The reflectance of external light incident on the color conversion substrate 30 and reflected may be reduced as the refractive index of the first stack 321 has the value between the refractive index of the second substrate 310 and the refractive index of the second color filter 233.

According to the illustrated embodiment, the reflectance of external light in the third light transmitting area TA3 overlapping the third color filter 235 may be reduced as the second stack 322 is selectively disposed between the first stack 321 and the third color filter 235 in the second light transmitting area TA2 as described above.

Figure 25:
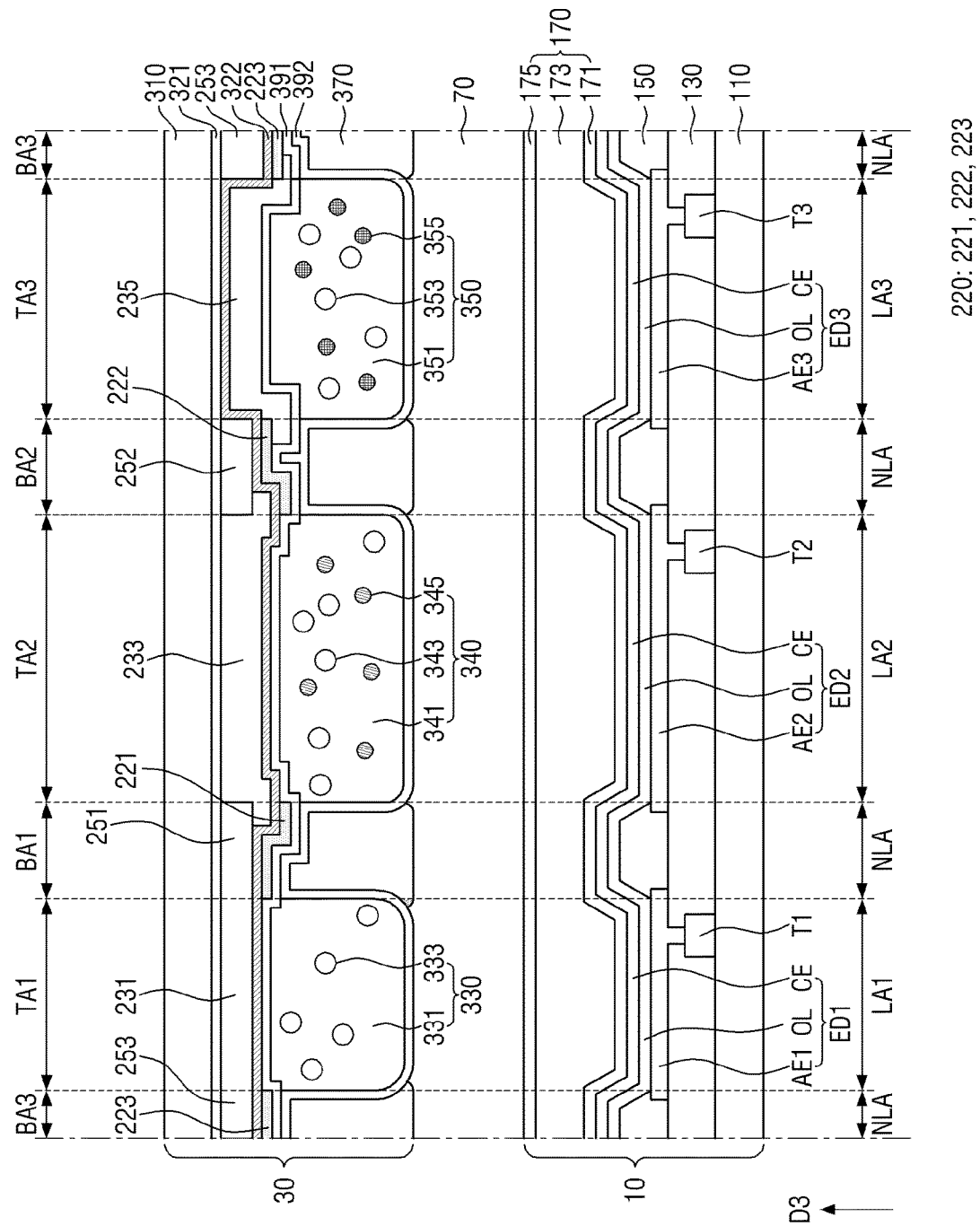

FIG. 25 is a cross-sectional view schematically illustrating a display device according to still another embodiment taken along line B-B' of FIGS. 3 and 4.

Referring to FIG. 25, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 24 described above in that a position of the light blocking member 220 is different, and other configurations are substantially the same or similar. Therefore, a redundant description will be omitted and differences will be mainly described.

As illustrated in FIG. 25, the light blocking member 220 may be disposed on one surface of the second substrate 310 facing the display substrate 10.

According to an embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

The light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 25) of the second stack 322. The second light blocking member 222 may overlap the second light blocking area BA2 and may be disposed on the second stack 322. The second light blocking member 222 may contact one surface (a lower surface in FIG. 25) of the second stack 322. The third light blocking member 223 may overlap the third light blocking area BA3 and may be disposed on the second stack 322. The third light blocking member 223 may contact one surface (a lower surface in FIG. 25) of the second stack 322.

The first color filter 231 may not overlap the first light blocking member 221 and may be spaced apart from the first light blocking member 221. The second color filter 233 may overlap the first light blocking member 221 in the first light blocking area BA1, and may be spaced apart from the first light blocking member 221 due to the second stack 322 disposed between the second color filter 233 and the first light blocking member 221. Similarly, the second color filter 233 may overlap the second light blocking member 222 in the second light blocking area BA2, and may be spaced apart from the second light blocking member 222 due to the second stack 322 disposed between the second color filter 233 and the second light blocking member 222.

The third color filter 235 may contact one surface (a lower surface in FIG. 25) of the second stack 322, may overlap the second light blocking member 222 in the second light blocking area BA2, and may contact one surface (a lower surface of FIG. 25) of the second light blocking member 222. In addition, the third color filter 235 may overlap the third light blocking member 223 in the third light blocking area BA3 and may contact one surface (a lower surface in FIG. 25) of the third light blocking member 223.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 26:
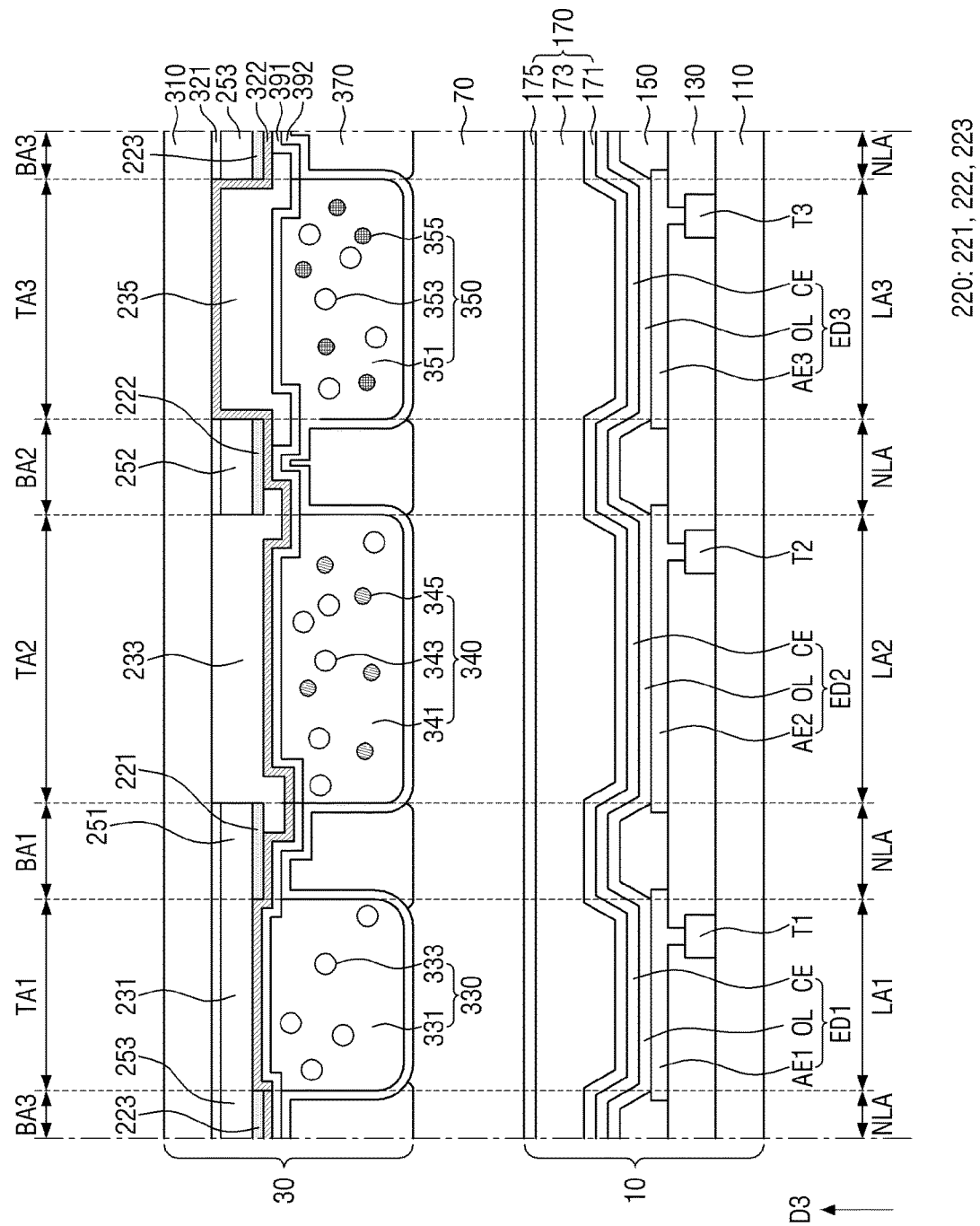
Figure 27:
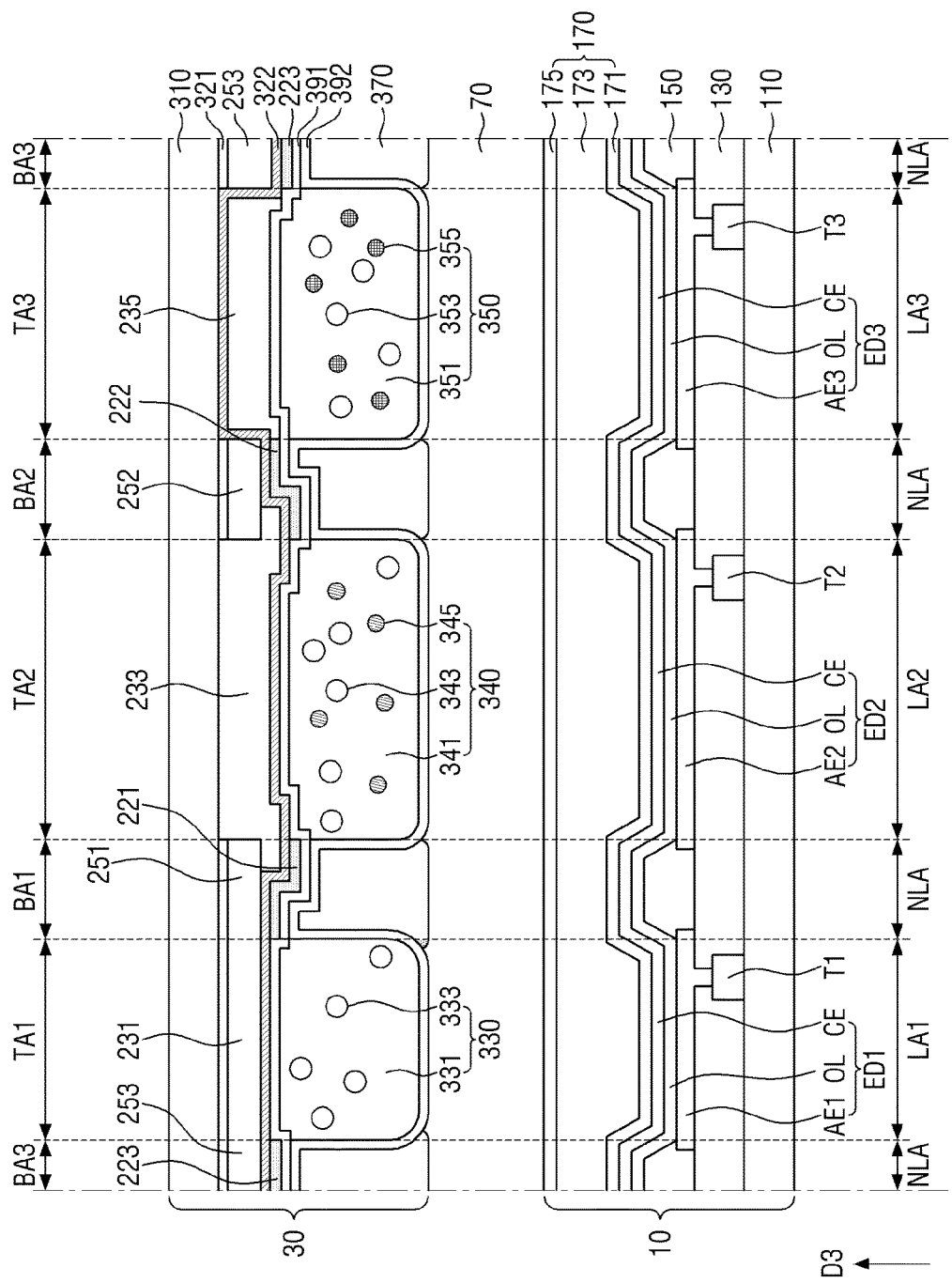

FIGS. 26 and 27 are cross-sectional views schematically illustrating a display device according to still another embodiment taken along line B-B' of FIGS. 3 and 4.

As illustrated in FIG. 26, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 26) of the second substrate 310 in the third light transmitting area TA3. The second color filter 233 may contact one surface (a lower surface in FIG. 26) of the second substrate 310 in the second light transmitting area TA2. The configurations other than the configuration of the first stack 321 are substantially the same as or similar to those of FIG. 24 described above, and thus detailed descriptions thereof will be omitted.

According to the illustrated embodiment, the reflectance of external light between the third color filter 235 and the second substrate 310 may be reduced by selectively disposing the second stack 322 between the third color filter 235 and the second substrate 310 in the third light transmitting area TA3.

In addition, as illustrated in FIG. 27, the light blocking member 220 may be disposed on the second stack 322. Similarly to the position of the light blocking member 220 of FIG. 25 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 25, and thus a detailed description thereof will be omitted.

Figure 28:
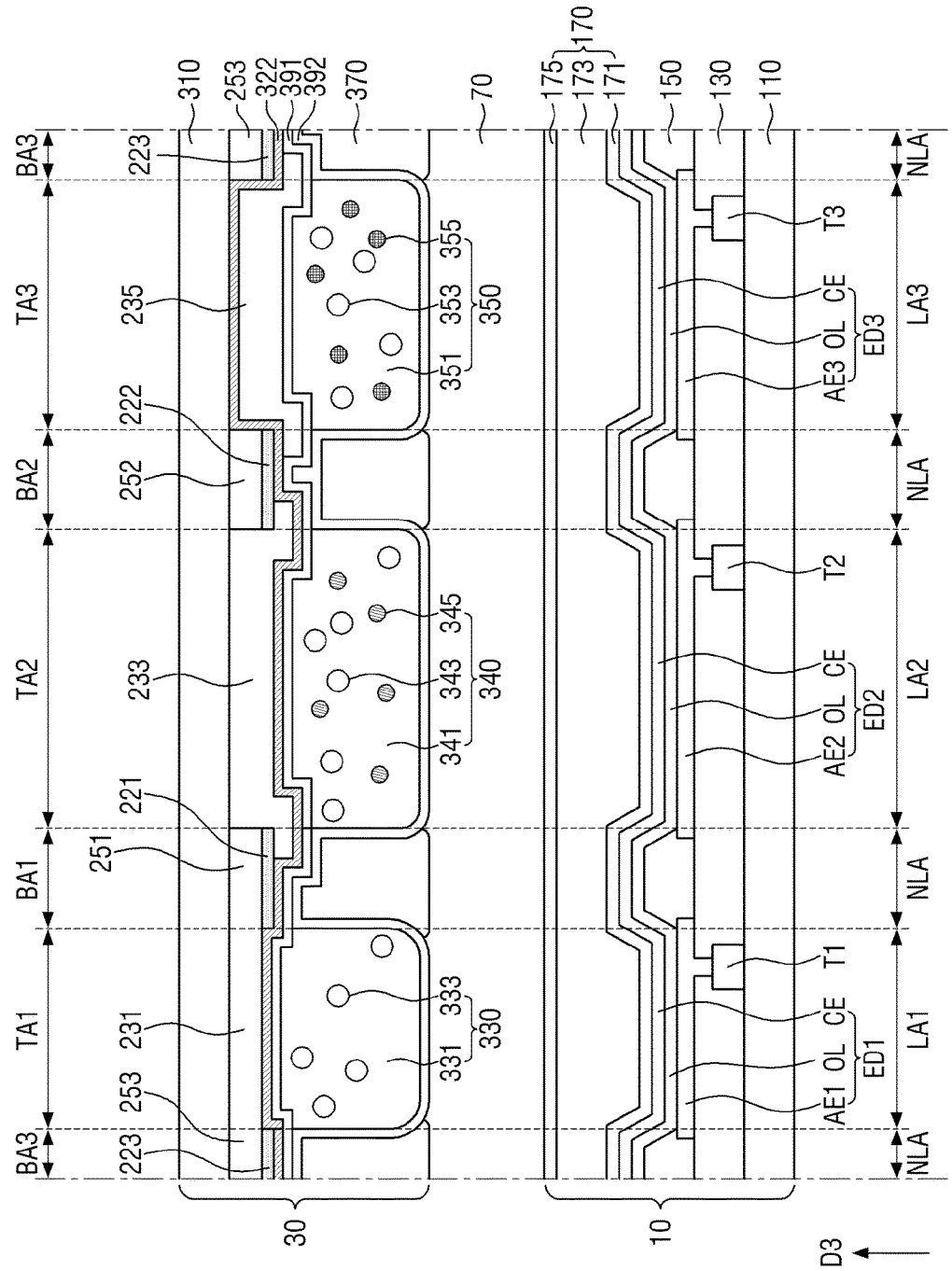
Figure 29:
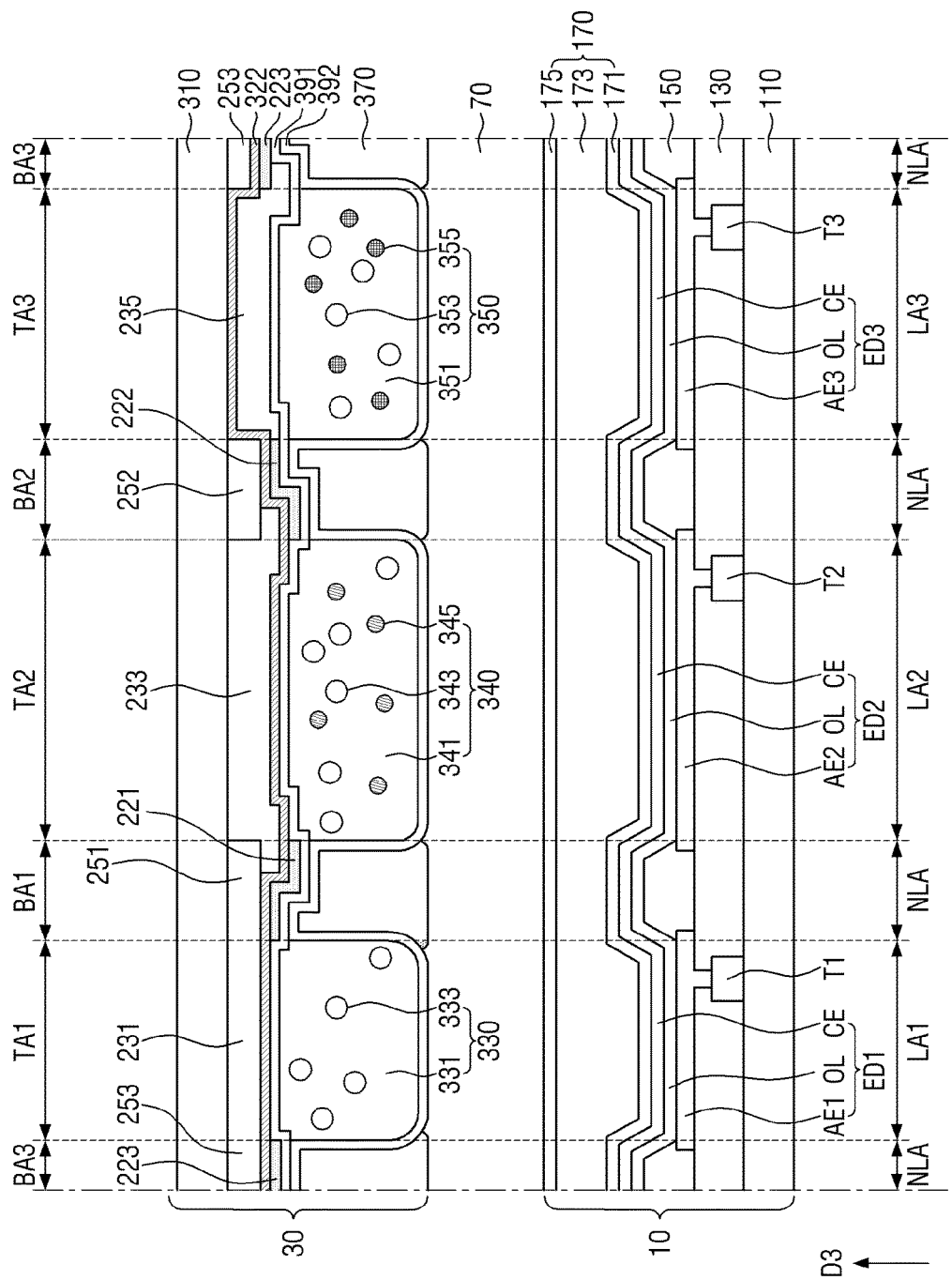

FIGS. 28 and 29 are cross-sectional views schematically illustrating a display device according to still another embodiment taken along line B-B' of FIGS. 3 and 4.

Referring to FIG. 28, the color conversion substrate 30 according to the illustrated embodiment may include the second substrate 310, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 24 described above in that the first stack 321 is omitted, and other configurations are substantially the same or similar. Therefore, a redundant description will be omitted and differences will be mainly described.

Referring to FIG. 28, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 28) of the second substrate 310.

According to an embodiment, the second stack 322 may be disposed on the first color filter 231, the first light blocking member 221, the second light blocking member 222, the third light blocking member 223, and the second substrate 310. The second stack 322 may be in direct contact with one surface (a lower surface in FIG. 28) of the first color filter 231 in the first light transmitting area TA1, and may be in direct contact with one surface (a lower surface in FIG. 28) of the second color filter 233 in the second light transmitting area TA2. The second stack 322 may be in direct contact with one surface (a lower surface of FIG. 28) of each of the first light blocking member 221, the second light blocking member 222, and the third light blocking member 223.

According to an embodiment, the second stack 322 may be in direct contact with the second substrate 310 overlapping the third light transmitting area TA3. The second stack 322 may contact one surface (an upper surface in FIG. 28) of the third color filter 235 in the third light transmitting area TA3.

According to the illustrated embodiment, the second stack 322 having a refractive index between the refractive index of the third color filter 235 and the refractive index of the second substrate 310 may be disposed between the third color filter 235 and the second substrate 310.

That is, by forming the second stack 322 in the area in which the third color filter 235 is disposed, the reflectance of external light at the interface between the third color filter 235 and the second substrate 310 may be reduced. Although the second stack 322 is described as an example in the illustrated embodiment, the disclosure is not limited thereto, and the first stack 321 may also be disposed instead of the second stack 322.

As illustrated in FIG. 29, the light blocking member 220 may be disposed on the second stack 322. Similarly to the position of the light blocking member 220 of FIG. 25 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 25, and thus a detailed description thereof will be omitted.

As illustrated in FIG. 29, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate (10 in FIG. 6) from which light is emitted, thereby preventing an occurrence of color mixing due to permeation of light between adjacent light transmitting areas, and accordingly, a color reproduction rate may be further improved.

Figure 30:
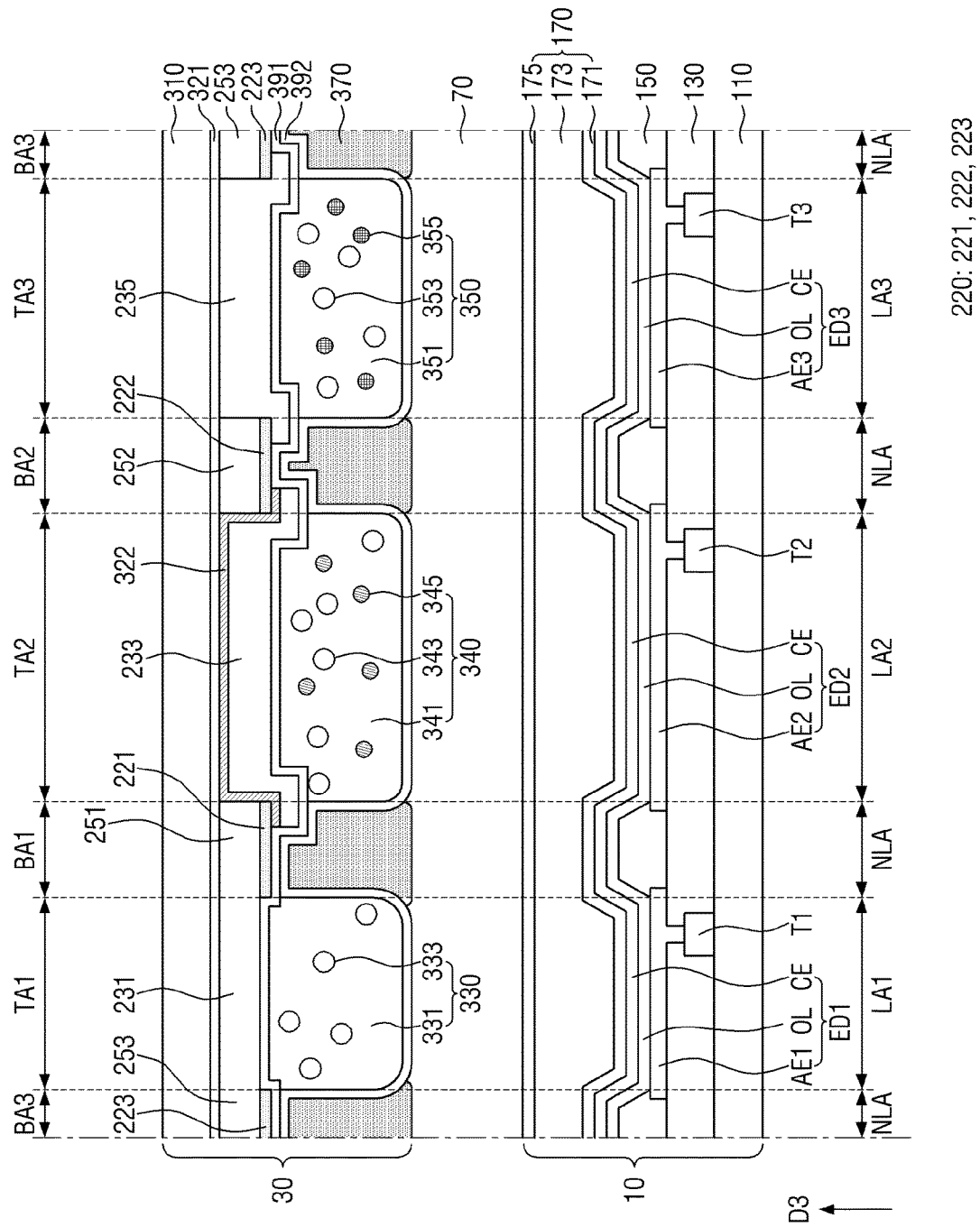
Figure 31:
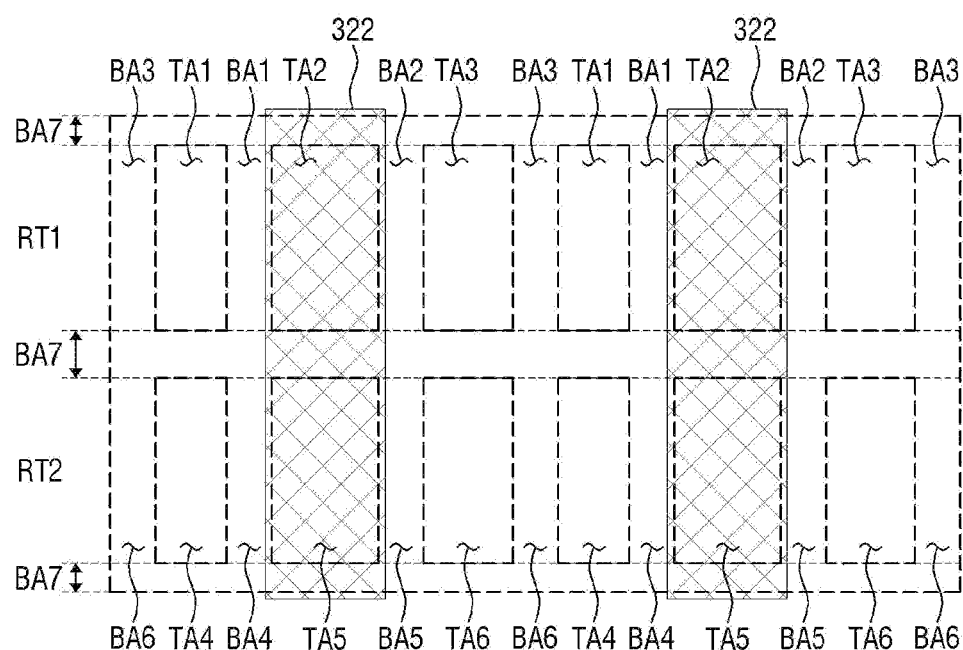
FIG. 31 is a plan view schematically illustrating a second stack of the color conversion substrate illustrated in FIG. 30.

FIG. 30 is a cross-sectional view schematically illustrating a display device according to still another embodiment taken along line B-B' of FIGS. 3 and 4, and FIG. 31 is a plan view schematically illustrating a second stack of the color conversion substrate of FIG. 30.

Referring to FIG. 30, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 22 described above in that a shape of the second stack 322 is different, and other configurations are substantially the same or similar. Therefore, a redundant description will be omitted and differences will be mainly described.

As illustrated in FIG. 30, the second stack 322 may be disposed on the first stack 321, the first color pattern 251, the second color pattern 252, the first light blocking member 221, and the second light blocking member 222.

The second stack 322 may be in direct contact with one surface (a lower surface in FIG. 30) of the first light blocking member 221 overlapping the first light blocking area BA1, and may be in direct contact with one surface (a lower surface in FIG. 30) of the second light blocking member 222 overlapping the second light blocking area BA2.

The second stack 322 may be in direct contact with the first stack 321 overlapping the second light transmitting area TA2. According to an embodiment, the second color filter 233 may be disposed in the second light transmitting area TA2. The second stack 322 may be in direct contact with one surface (an upper surface in FIG. 30) of the second color filter 233, and may be disposed between the first stack 321 and the second color filter 233.

The second stack 322 may be disposed between the first stack 321 and the second color filter 233 to reduce a reflectance of external light at the interface between the first stack 321 and the second color filter 233. The second stack 322 may have a value between the refractive index of the first stack 321 and the refractive index of the second color filter 233. Similarly to the first stack 321 described above, the reflectance of external light incident on the color conversion substrate 30 and reflected may be reduced as the refractive index of the second stack 322 has the value between the refractive index of the first stack 321 and the refractive index of the second color filter 233.

The second stack 322 may not overlap the first light transmitting area TA1 and the third light transmitting area TA3. The second stack 322 may not overlap the third light blocking area BA3.

As illustrated in FIG. 31, the second stack 322 may overlap the second light transmitting area TA2, and may be formed in a stripe shape extending in the second direction D2. The second stack 322 may cross the seventh light blocking area BA7 between the first row RT1 and the second row RT2. However, the disclosure is not limited thereto, and the second stack 322 may also be formed in the form of an island pattern spaced apart from each other in the second direction D2.

As illustrated in FIG. 30, the third color filter 235 may be disposed in the third light transmitting area TA3. The third color filter 235 may be in direct contact with one surface (a lower surface in FIG. 30) of the first stack 321 in the third light transmitting area TA3. A portion of the third color filter 235 may contact one surface (a lower surface in FIG. 30) of the second light blocking member 222, and another portion thereof may contact one surface (a lower surface in FIG. 30) of the third light blocking member 223.

In the third light transmitting area TA3, the first stack 321 may be disposed between the second substrate 310 and the third color filter 235. The reflectance of external light incident on the color conversion substrate 30 and reflected may be reduced as the refractive index of the first stack 321 has the value between the refractive index of the second substrate 310 and the refractive index of the third color filter 235.

According to the illustrated embodiment, the reflectance of external light in the second light transmitting area TA2 overlapping the second color filter 233 may be reduced as the second stack 322 does not overlap the first light transmitting area TA1 and the third light transmitting area TA3, overlaps the second light transmitting area TA2, and is selectively disposed between the first stack 321 and the second color filter 233 as described above.

Figure 32:
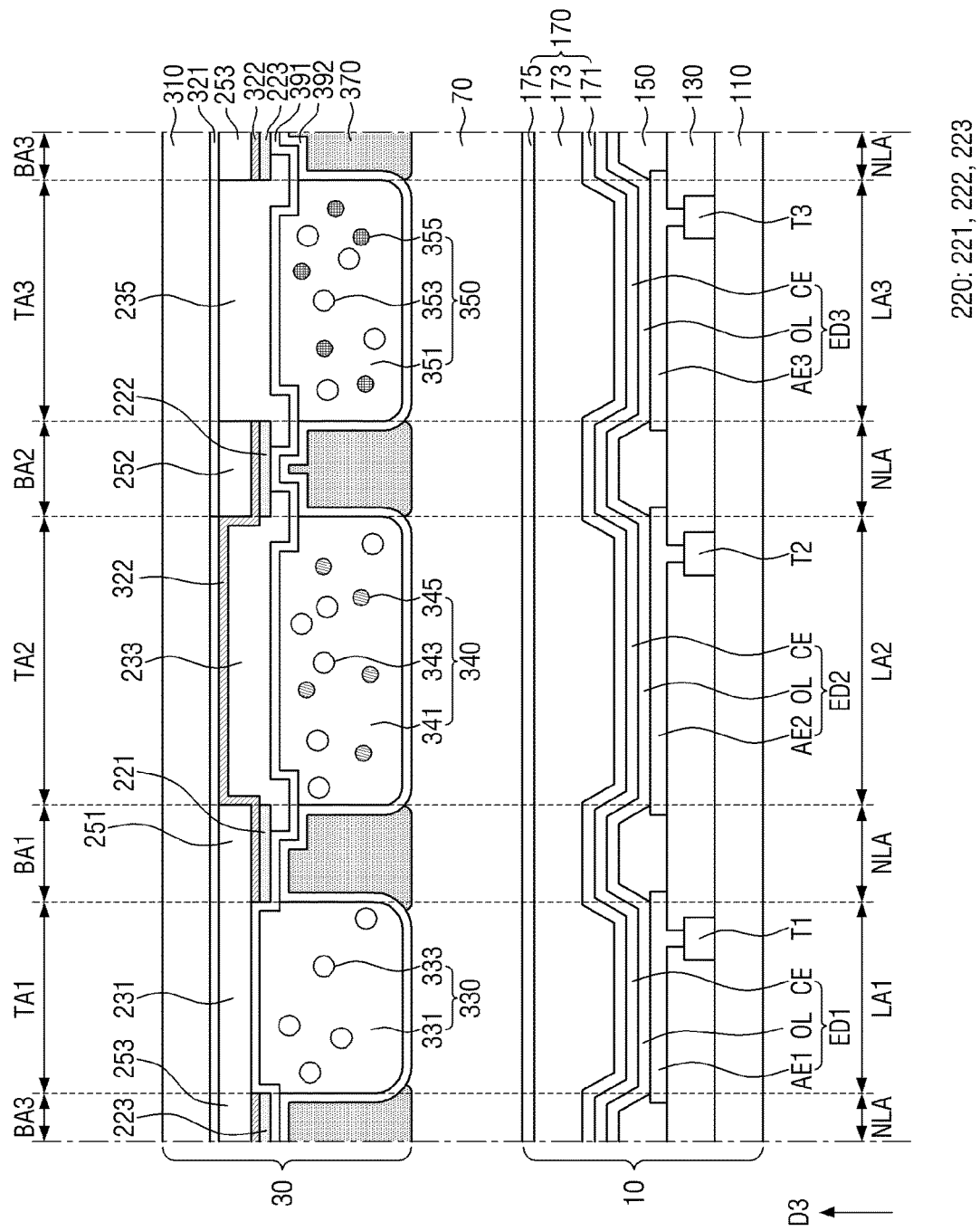
FIG. 32 is a cross-sectional view schematically illustrating a display device according to still another embodiment taken along line B-B' of FIGS. 3 and 4.

FIG. 32 is a cross-sectional view schematically illustrating a display device according to still another embodiment taken along line B-B' of FIGS. 3 and 4, and FIG. 33 is a plan view schematically illustrating a second stack of the color conversion substrate of FIG. 32.

Referring to FIG. 32, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 30 described above in that a shape of the second stack 322 and a position of the light blocking member 220 are different, and other configurations are substantially the same or similar. Therefore, a redundant description will be omitted and differences will be mainly described.

As illustrated in FIG. 32, the second stack 322 may be disposed on one surface of the second substrate 310 facing the display substrate 10.

Unlike FIG. 30 described above, the second stack 322 may overlap the first light blocking area BA1, the second light blocking area BA2, the third light blocking area BA3, and the second light transmitting area TA2. Specifically, the second stack 322 may overlap the entirety of the first light blocking area BA1, the second light blocking area BA2, the third light blocking area BA3, and the second light transmitting area TA2.

Referring to FIGS. 32 and 33, the second stack 322 may overlap the first light blocking area BA1 and may contact one surface (a lower surface in FIG. 32) of the first color pattern 251. The second stack 322 may overlap the second light blocking area BA2 and may contact one surface (a lower surface in FIG. 32) of the second color pattern 252. The second stack 322 may overlap the third light blocking area BA3 and may contact one surface (a lower surface in FIG. 32) of the third color pattern 253. The second stack 322 may overlap the second light transmitting area TA2 and may contact one surface (a lower surface in FIG. 32) of the first stack 321 disposed in the second light transmitting area TA2. The second stack 322 may not overlap the first light transmitting area TA1 and the third light transmitting area TA3.

According to the illustrated embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

As illustrated in FIG. 32, the light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 32) of the second stack 322. The second light blocking member 222 may overlap the second light blocking area BA2 and may be disposed on the second stack 322. The second light blocking member 222 may contact one surface (a lower surface in FIG. 32) of the second stack 322. The third light blocking member 223 may overlap the third light blocking area BA3 and may be disposed on the second stack 322. The third light blocking member 223 may contact one surface (a lower surface in FIG. 32) of the second stack 322.

The first color filter 231 may not overlap the first light blocking member 221 and may be spaced apart from the first light blocking member 221. The second color filter 233 may contact one surface (a lower surface in FIG. 32) of the second stack 322, may overlap the first light blocking member 221 in the first light blocking area BA1, and may contact one surface (a lower surface of FIG. 32) of the first light blocking member 221. In addition, the second color filter 233 may overlap the second light blocking member 222 in the second light blocking area BA2 and may contact one surface (a lower surface in FIG. 32) of the second light blocking member 222.

The third color filter 235 may overlap the second light blocking member 222 in the second light blocking area BA2 and may contact one surface (a lower surface in FIG. 32) of the second light blocking member 222. Similarly, the third color filter 235 may overlap the third light blocking member 223 in the third light blocking area BA3 and may contact one surface (a lower surface in FIG. 32) of the third light blocking member 223.

The second stack 322 and the light blocking member 220 may completely overlap each other in the first light blocking area BA1, the second light blocking area BA2, and the third light blocking area BA3. At least one side of the second stack 322 and at least one side of the first light blocking member 221 may be aligned with each other and coincide with each other in the first light blocking area BA1, the second light blocking area BA2, and the third light blocking area BA3.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

FIGS. 34 to 39 are views for describing a method of manufacturing the color conversion substrate illustrated in FIG. 32.

Figure 34:
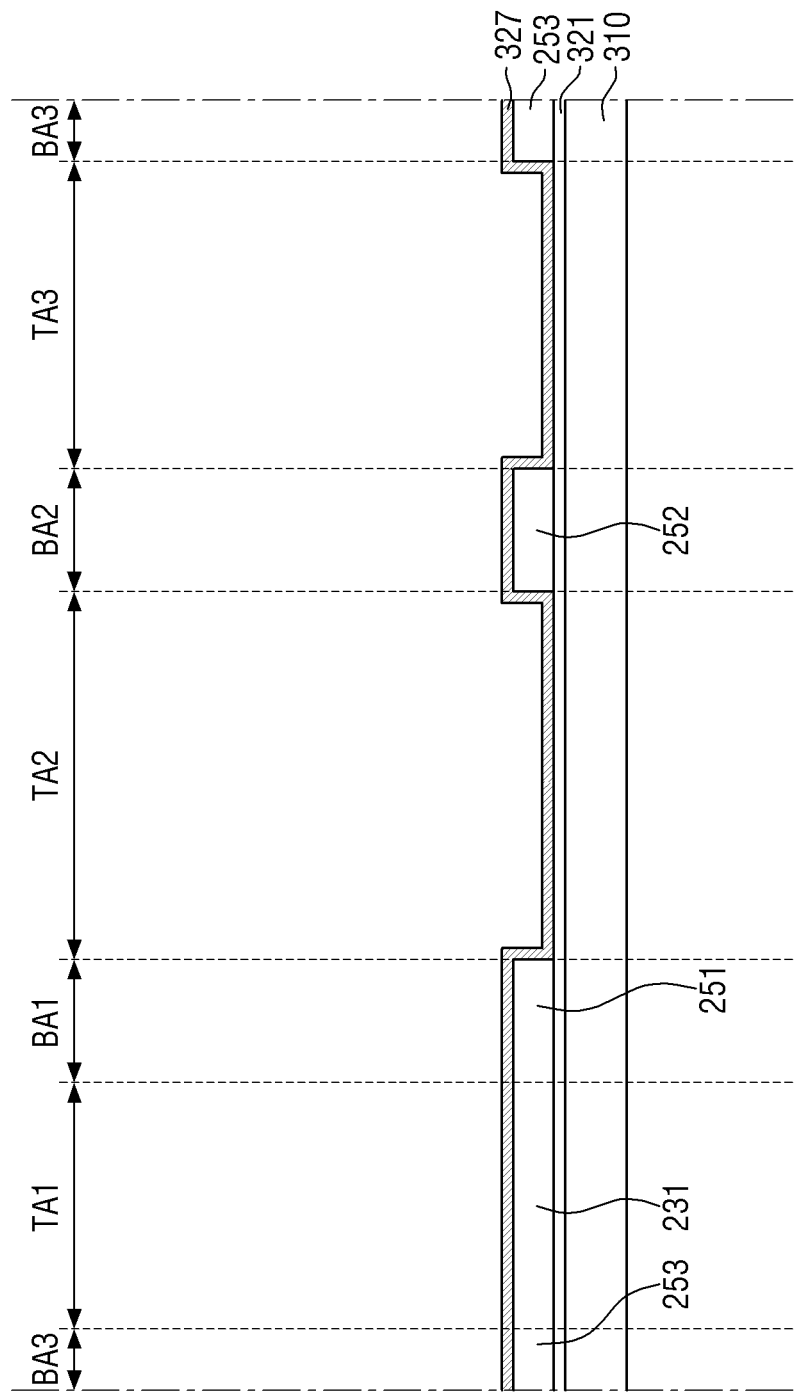
FIGS. 34 to 39 are views for describing a method of manufacturing the color conversion substrate illustrated in FIG. 32.

Referring to FIG. 34, a second substrate 310 having a light blocking area and a light transmitting area defined thereon is prepared. FIG. 34 illustrates that a first light transmitting area TA1, a first light blocking area BA1, a second light transmitting area TA2, a second light blocking area BA2, a third light transmitting area TA3, and a third light blocking area BA3 are sequentially defined on the second substrate 310.

Next, a first stack 321 is formed by stacking an inorganic material on the second substrate 310. The first stack 321 may be formed by a chemical vapor deposition method. Subsequently, a first color filter 231, the first color pattern 251, a second color pattern 252, and a third color pattern 253 are simultaneously formed by a process of coating a photosensitive material including a blue colorant on the second substrate 310 and exposing and developing the blue colorant, e.g., a photo process. Positions where the first color filter 231, the first color pattern 251, the second color pattern 252, and the third color pattern 253 are formed are the same as described above, and thus will be omitted. It is illustrated in the drawing that the first color filter 231 is formed in the first light transmitting area TA1, the first color pattern 251 is formed in the first light blocking area BA1, the second color pattern 252 is formed in the second light blocking area BA2, and the third color pattern 253 is formed in the third light blocking area BA3.

Subsequently, a second stack material layer 327 is formed on the first stack 321, the first color filter 231, the first color pattern 251, the second color pattern 252, and the third color pattern 253 by laminating an inorganic material on the second substrate 310. The second stack material layer 327 may be formed by a chemical vapor deposition method.

Figure 35:
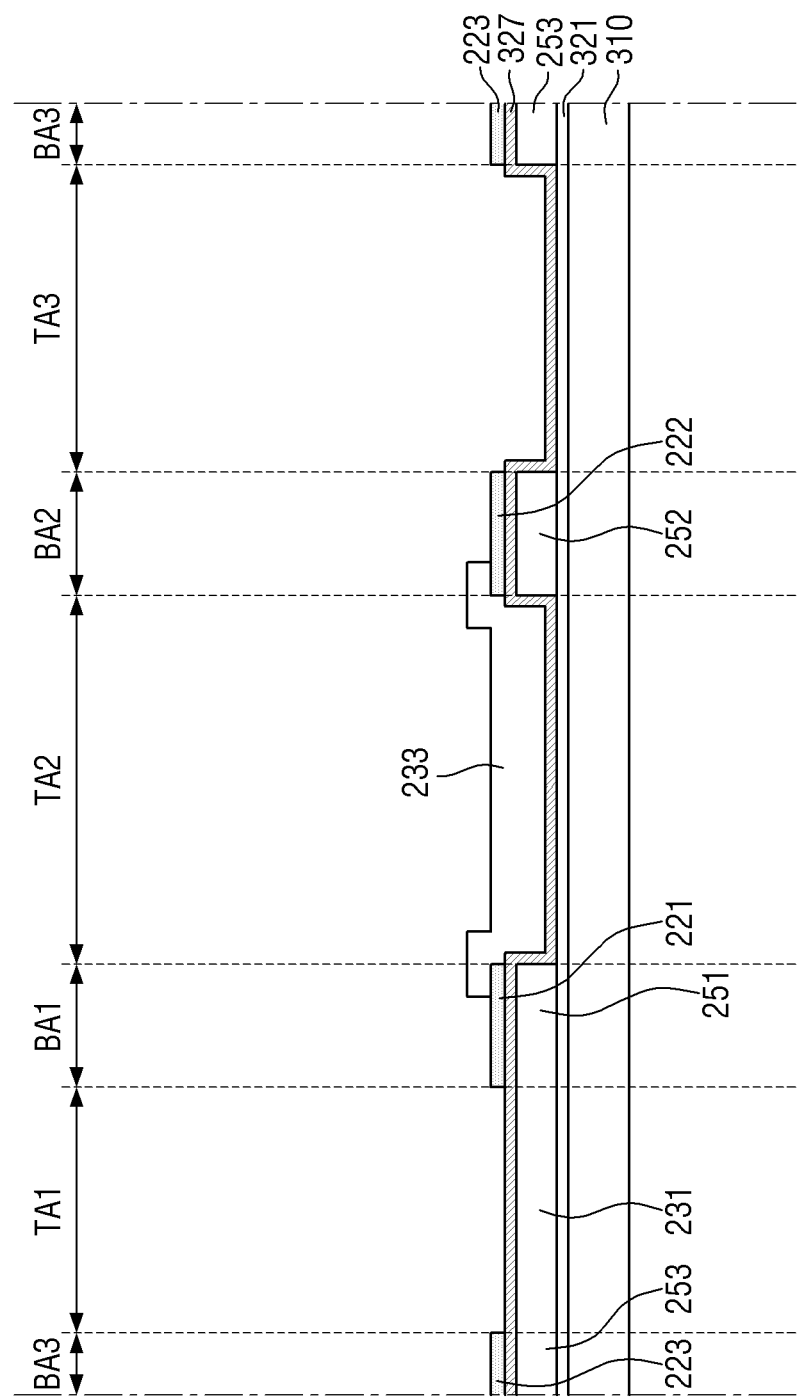

Subsequently, referring to FIG. 35, a first light blocking member 221, a second light blocking member 222, and a third light blocking member 223 are formed on the second stack material layer 327 by coating a photosensitive material including a light blocking material on the second substrate 310 and exposing and developing the photosensitive material. The first light blocking member 221 is formed to overlap the first light blocking area BA1, the second light blocking member 222 is formed to overlap the second light blocking area BA2, and the third light blocking member 223 is formed to overlap the third light blocking area BA3.

Subsequently, a second color filter 233 is formed. The second color filter 233 may be formed through a photo process. In FIG. 35, for example, the second color filter 233 may be formed to overlap the second light transmitting area TA2, the first light blocking area BA1, and the second light blocking area BA2.

Figure 36:
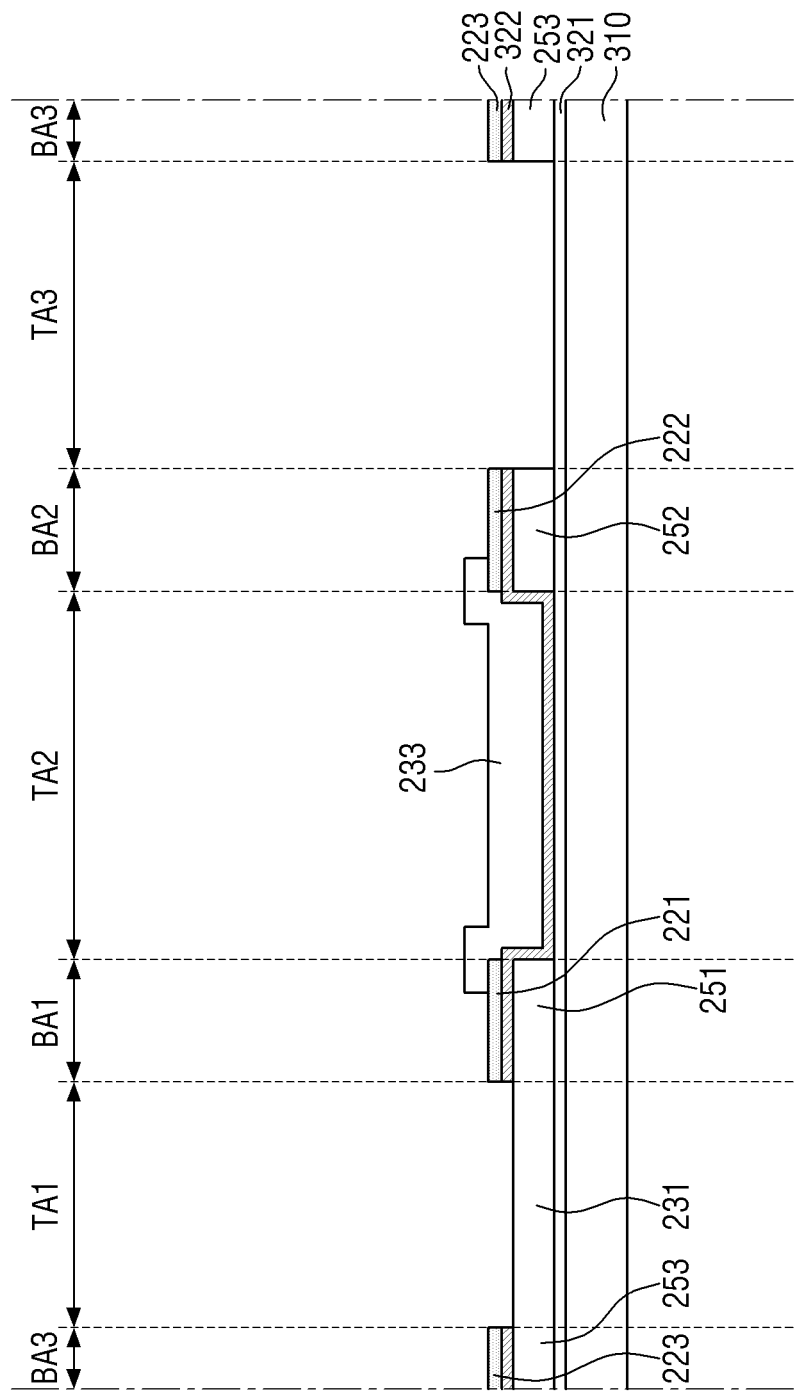

Next, referring to FIG. 36, a second stack 322 is formed by etching the second stack material layer 327 using the first light blocking member 221, the second light blocking member 222, the third light blocking member 223, and the second color filter 233 as a mask. The etching of the second stack material layer 327 may be performed by a dry etching process. The second stack 322 may be formed in the second light transmitting area TA2, the first light blocking area BA1, the second light blocking area BA2, and the third light blocking area BA3.

Figure 37:
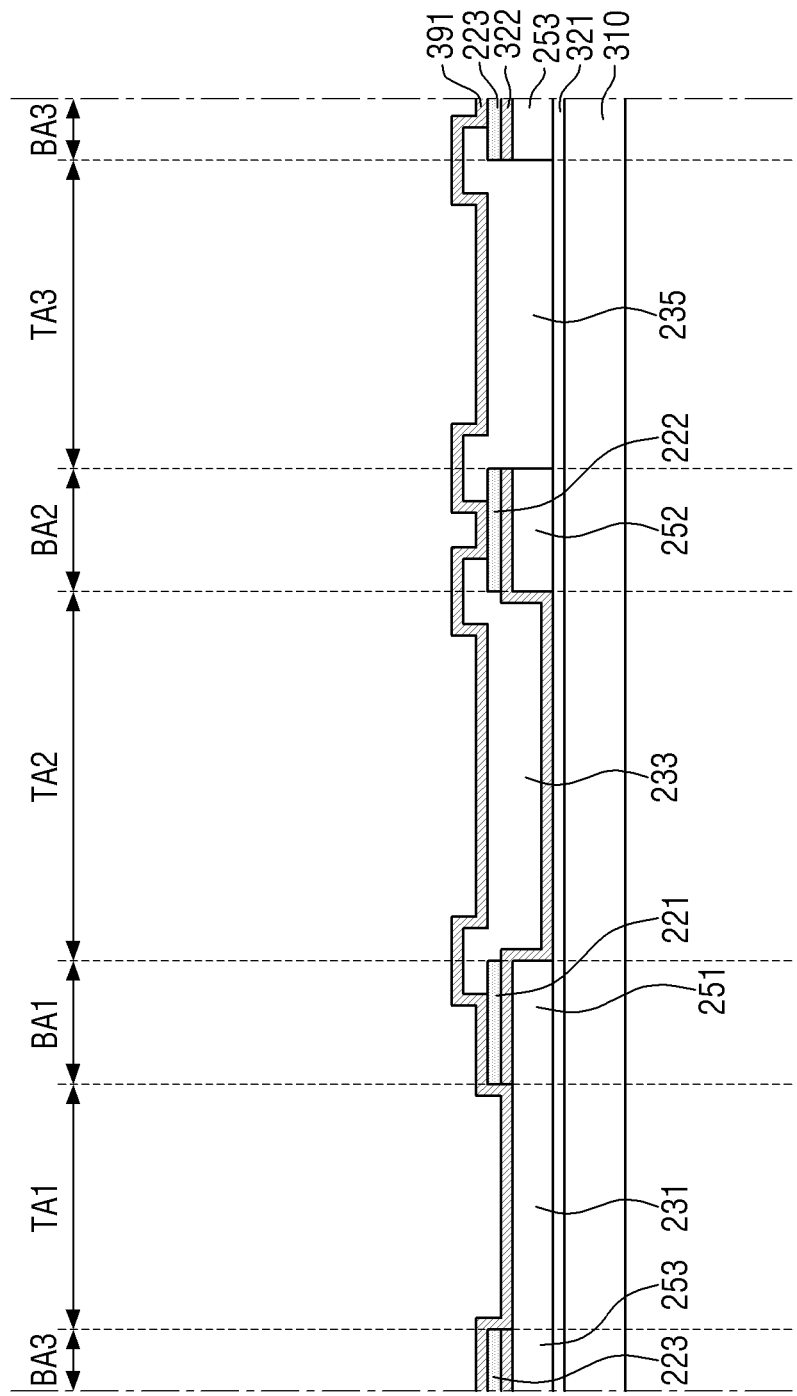

Subsequently, as illustrated in FIG. 37, a third color filter 235 is formed on the second substrate 310. The third color filter 235 may be formed through a photo process. In FIG. 37, for example, the third color filter 235 may be formed to overlap the third light transmitting area TA3, the second light blocking area BA2, and the third light blocking area BA3.

Next, a first capping layer 391 covering the first color filter 231, the second color filter 233, and the third color filter 235 is formed. The first capping layer 391 may be formed by a chemical vapor deposition method.

Figure 38:
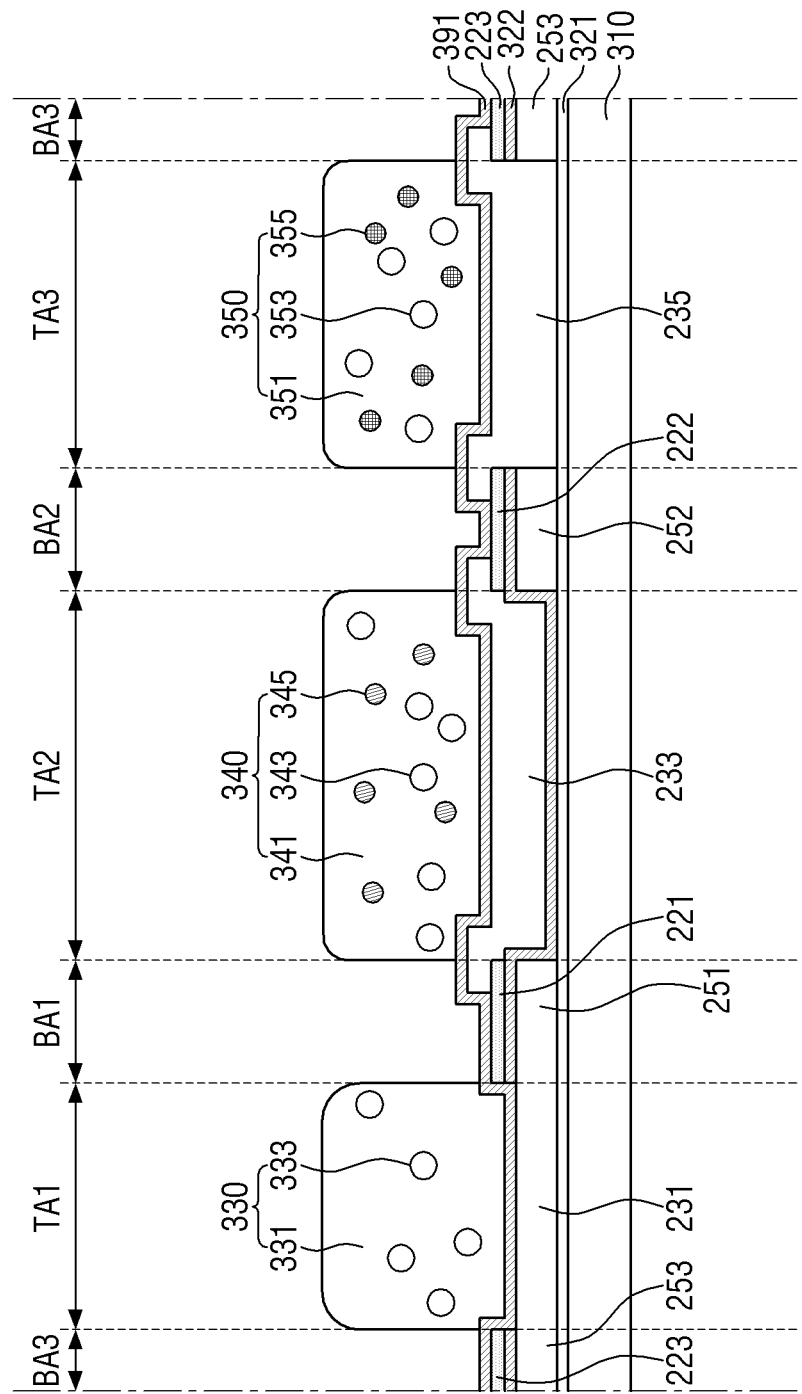

Subsequently, as illustrated in FIG. 38, a light transmission pattern 330 is formed on the first capping layer 391. The light transmission pattern 330 may be formed by a photo process, and may be formed to overlap the first color filter 231. Subsequently, a first wavelength conversion pattern 340 and a second wavelength conversion pattern 350 are formed on the second substrate 310. The first wavelength conversion pattern 340 may be formed to overlap the second color filter 233, and the second wavelength conversion pattern 350 may be formed to overlap the third color filter 235. Each of the first wavelength conversion pattern 340 and the second wavelength conversion pattern 350 may be formed through a photo process, but is not limited thereto.

Figure 39:
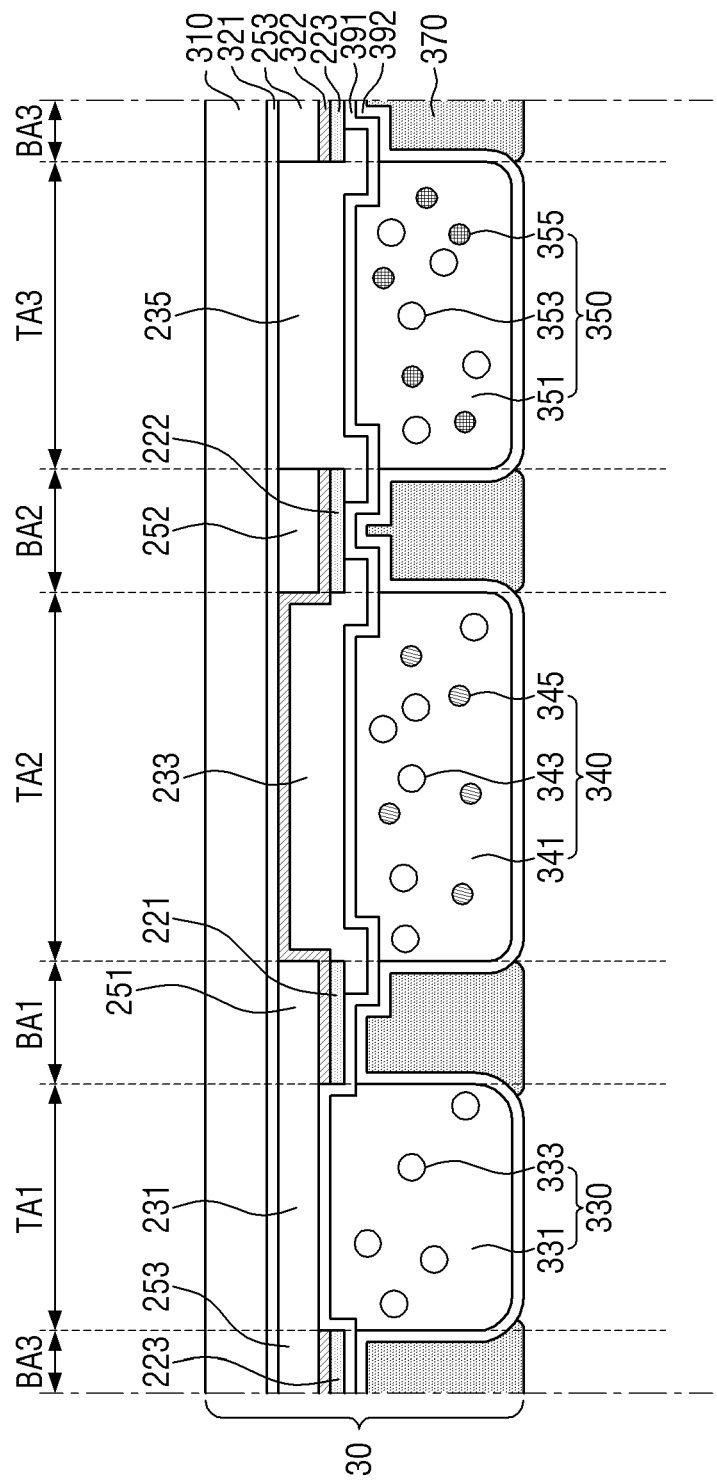

Subsequently, as illustrated in FIG. 39, a second capping layer 392 is formed on an entirety of a surface of the second substrate 310, and a color mixing preventing member 370 is formed on the second capping layer 392. The second capping layer 392 may be formed by a chemical vapor deposition method, and the color mixing preventing member 370 may be formed by a photo process. Through the above-described processes, the color conversion substrate 30 may be manufactured.

According to the method of manufacturing the color conversion substrate described above, since the second stack 322 may be selectively formed in the second light transmitting area TA2 without performing an additional photo process using a separate mask, the photo process may be reduced.

Figure 40:
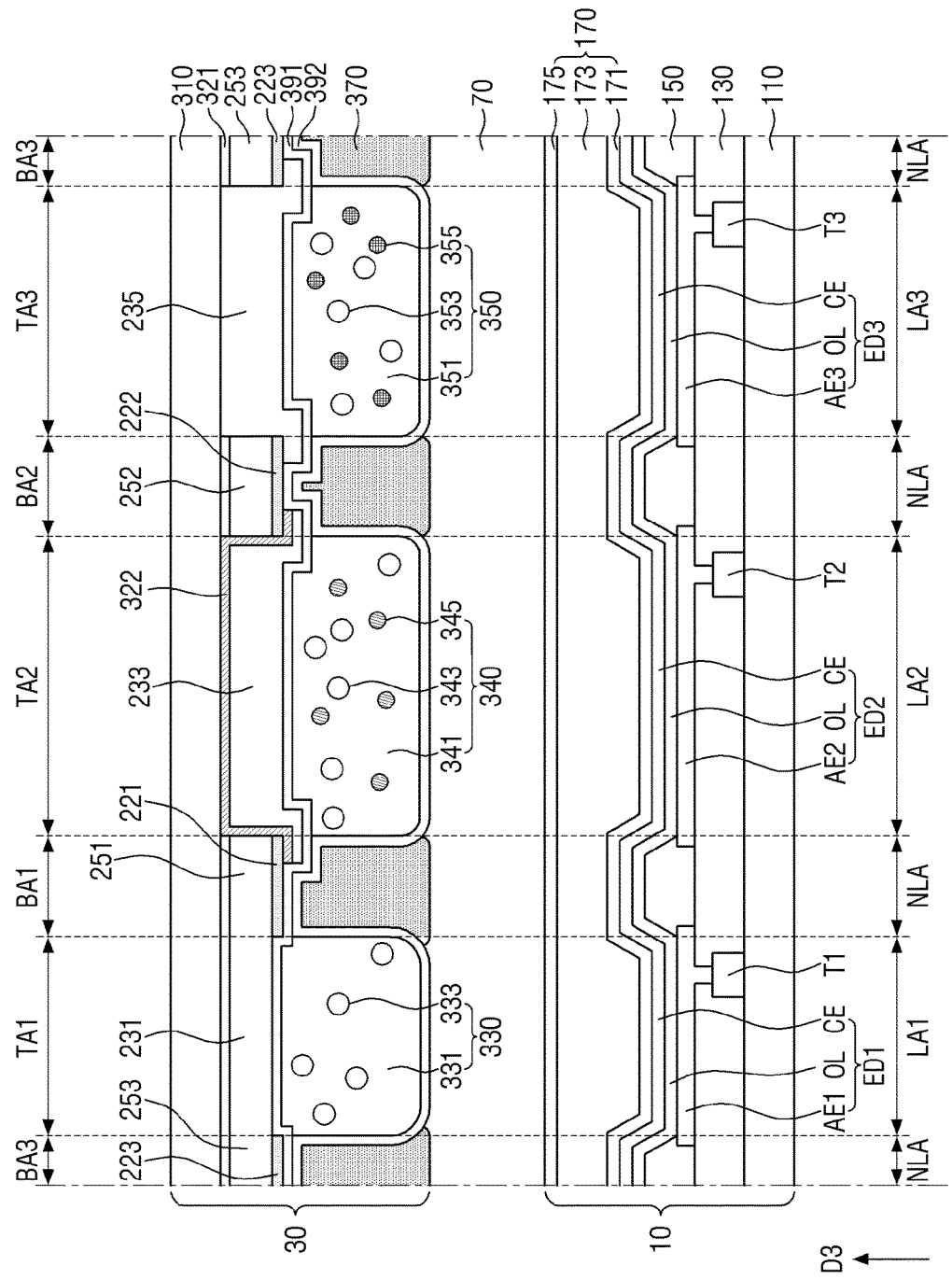
FIGS. 40 to 51 are cross-sectional views schematically illustrating a display device according to still another embodiment taken along line B-B' of FIGS. 3 and 4.
Figure 41:
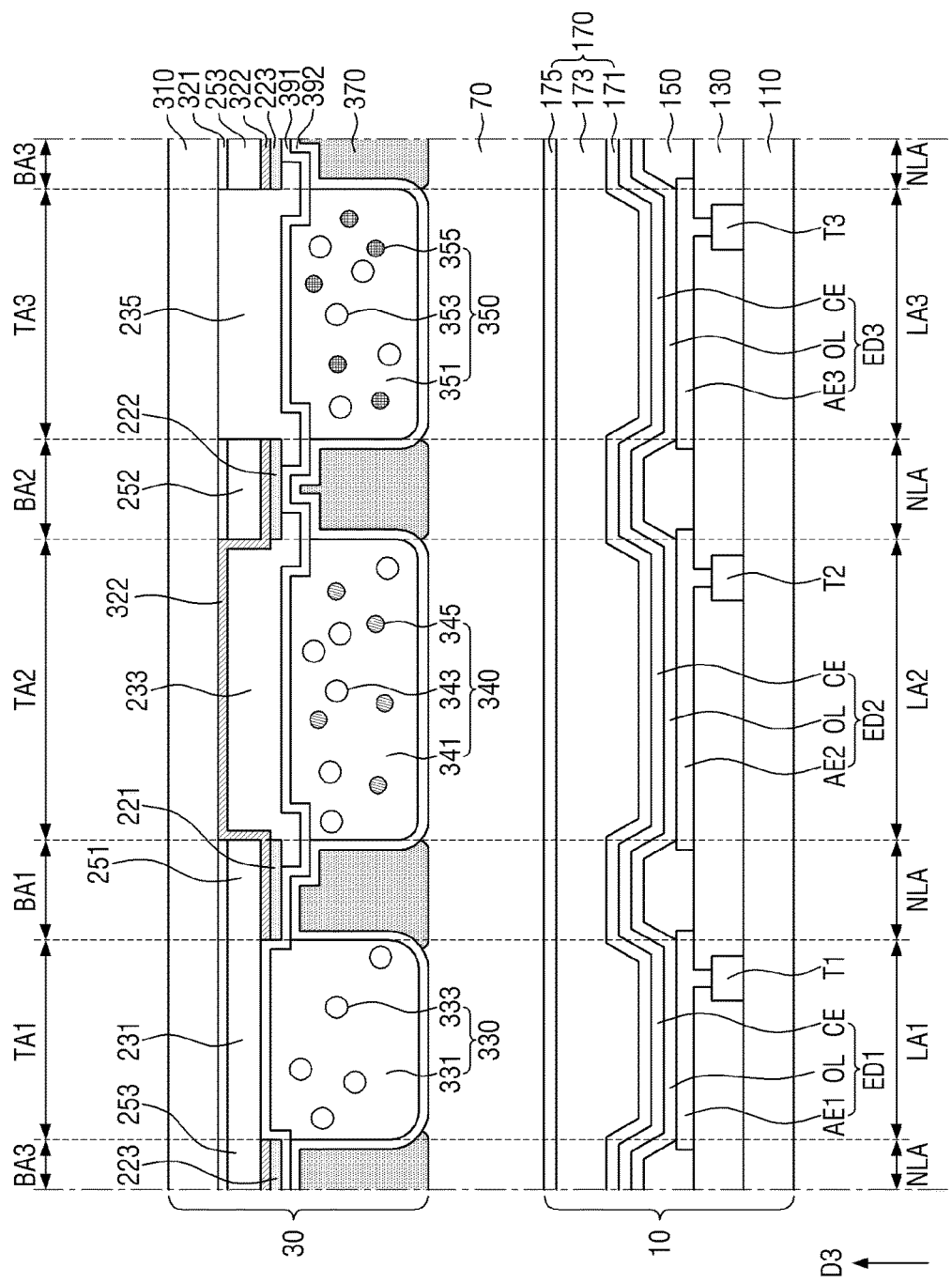

FIGS. 40 and 41 are cross-sectional views schematically illustrating a display device according to still another embodiment taken along line B-B' of FIGS. 3 and 4.

As illustrated in FIG. 40, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 40) of the second substrate 310 in the second light transmitting area TA2. The third color filter 235 may contact one surface (a lower surface in FIG. 40) of the second substrate 310 in the third light transmitting area TA3. The configurations other than the configuration of the first stack 321 are substantially the same as or similar to those of FIG. 30 described above, and thus detailed descriptions thereof will be omitted.

According to the illustrated embodiment, the reflectance of external light between the second color filter 233 and the second substrate 310 may be reduced by selectively disposing the second stack 322 between the second color filter 233 and the second substrate 310 in a pattern shape in the second light transmitting area TA2.

In addition, as illustrated in FIG. 41, the light blocking member 220 may be disposed on the second stack 322. Similarly to the position of the light blocking member 220 of FIG. 32 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 32, and thus a detailed description thereof will be omitted.

Figure 42:
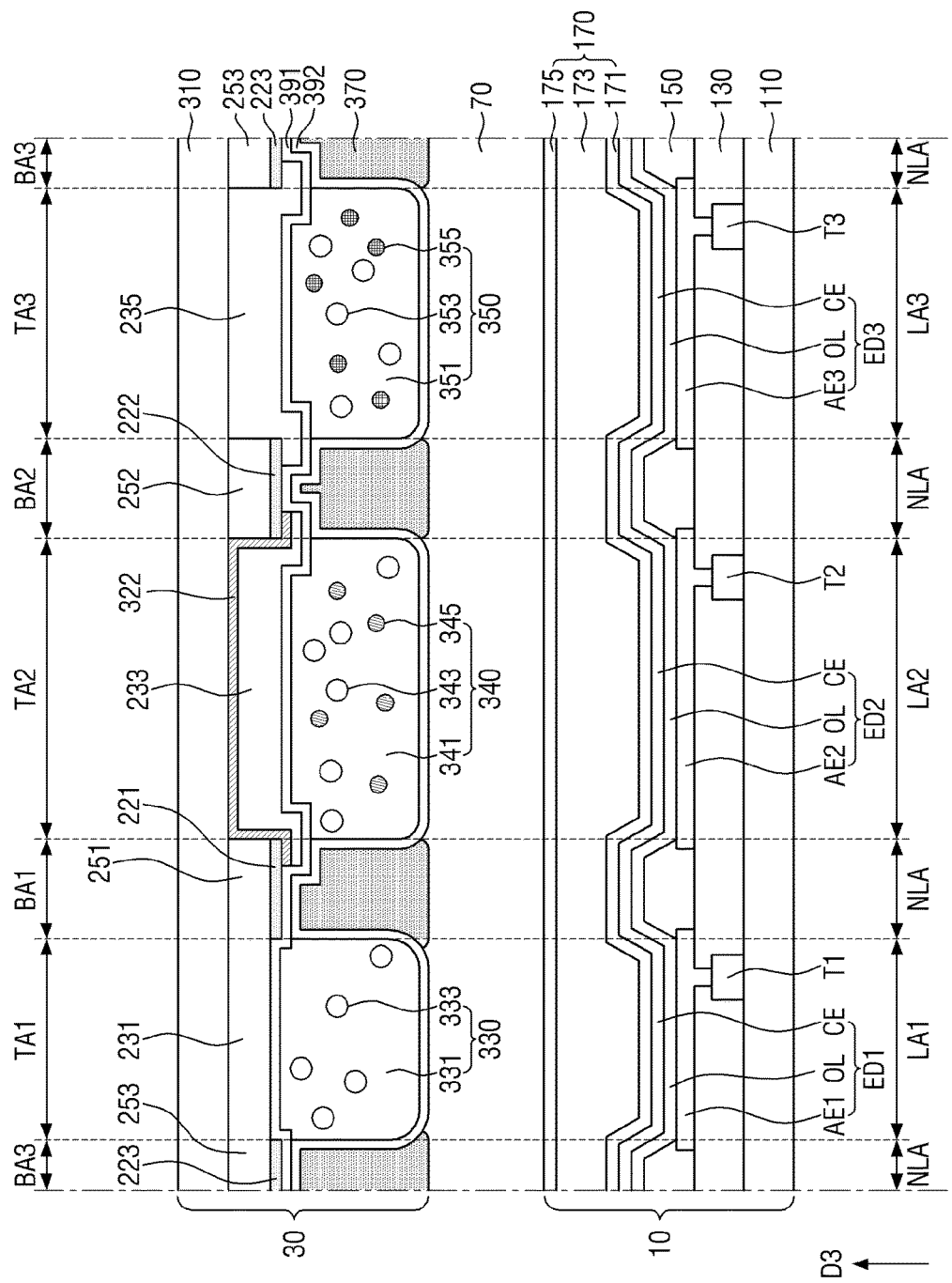
Figure 43:
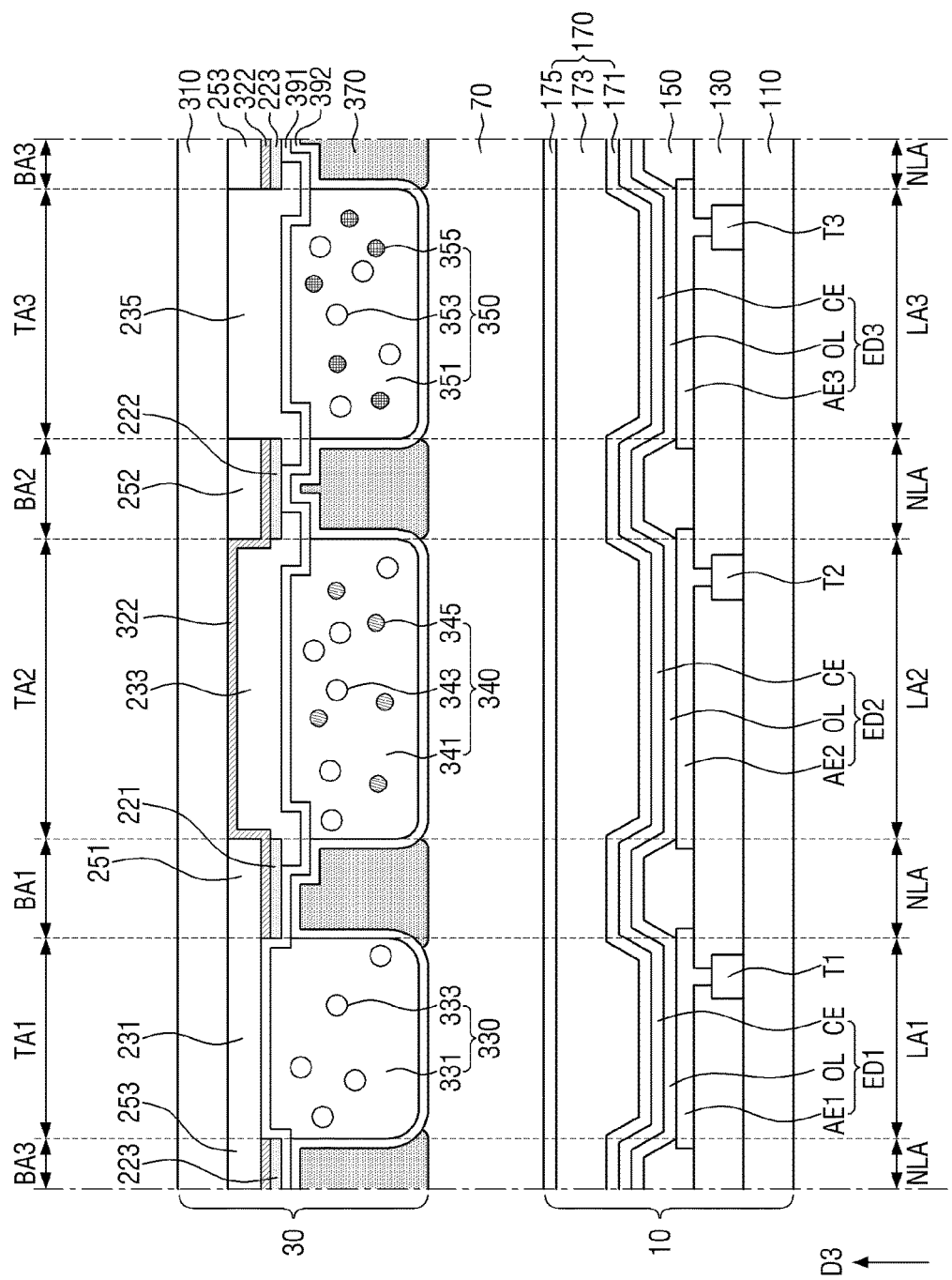

FIGS. 42 and 43 are cross-sectional views schematically illustrating a display device according to still another embodiment taken along line B-B' of FIGS. 3 and 4.

Referring to FIG. 42, the color conversion substrate 30 according to the illustrated embodiment may include the second substrate 310, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 30 described above in that the first stack 321 is omitted, and other configurations are substantially the same or similar. Therefore, a redundant description will be omitted and differences will be mainly described.

Referring to FIG. 42, the first color filter 231, the first color pattern 251, the second color pattern 252, and the third color pattern 253 may be disposed on one surface of the second substrate 310 facing the display substrate 10. The first color filter 231, the third color filter 235, the first color pattern 251, the second color pattern 252, and the third color pattern 253 may be in direct contact with one surface (a lower surface in FIG. 42) of the second substrate 310.

According to an embodiment, the second stack 322 may be disposed on the first light blocking member 221, the second light blocking member 222, and the second substrate 310. The second stack 322 may be in direct contact with one surface (a lower surface in FIG. 42) of the second color filter 233 overlapping the second light transmitting area TA2, and may be in direct contact with one surface (a lower surface in FIG. 42) of the second substrate 310 overlapping the second light transmitting area TA2. The second stack 322 may be in direct contact with one surface (a lower surface of FIG. 42) of each of the first light blocking member 221 and the second light blocking member 222.

According to the illustrated embodiment, the second stack 322 having a refractive index between the refractive index of the second color filter 233 and the refractive index of the second substrate 310 may be disposed between the second color filter 233 and the second substrate 310.

That is, by selectively forming the second stack 322 in a pattern shape in the area in which the second color filter 233 is disposed, the reflectance of external light at the interface between the second color filter 233 and the second substrate 310 may be reduced. Although the second stack 322 is described as an example in the illustrated embodiment, the disclosure is not limited thereto, and the first stack 321 may also be disposed instead of the second stack 322.

As illustrated in FIG. 43, the light blocking member 220 may be disposed on the second stack 322. Similarly to the position of the light blocking member 220 of FIG. 32 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 32, and thus a detailed description thereof will be omitted.

As illustrated in FIG. 43, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 44:
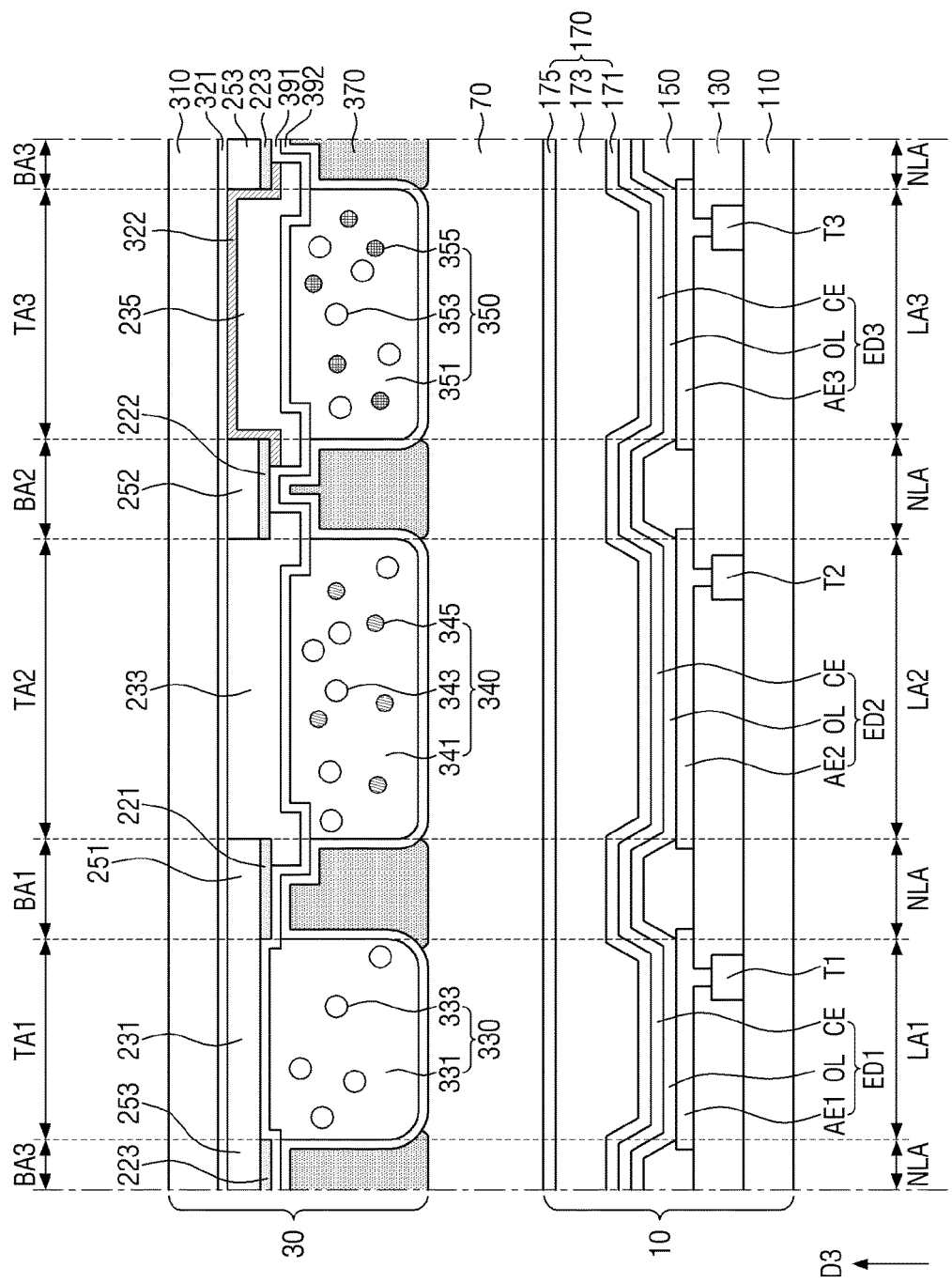

FIG. 44 is a cross-sectional view schematically illustrating a display device according to still another embodiment taken along line B-B' of FIGS. 3 and 4.

Referring to FIG. 44, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 30 described above in that a shape of the second stack 322 is different, and other configurations are substantially the same or similar. Therefore, a redundant description will be omitted and differences will be mainly described.

As illustrated in FIG. 44, the second stack 322 may be disposed on the first stack 321, the second color pattern 252, the third color pattern 253, the second light blocking member 222, and the third light blocking member 223.

The second stack 322 may be in direct contact with one surface (a lower surface in FIG. 44) of the second light blocking member 222 overlapping the second light blocking area BA2, and may be in direct contact with one surface (a lower surface in FIG. 44) of the third light blocking member 223 overlapping the third light blocking area BA3.

The second stack 322 may be in direct contact with one surface (a lower surface in FIG. 44) of the first stack 321 overlapping the third light transmitting area TA3. According to an embodiment, the third color filter 235 may be disposed in the third light transmitting area TA3. The second stack 322 may be in direct contact with one surface (an upper surface in FIG. 44) of the third color filter 235, and may be disposed between the first stack 321 and the third color filter 235.

The second stack 322 may be disposed between the first stack 321 and the third color filter 235 to reduce a reflectance of external light at the interface between the first stack 321 and the third color filter 235. The refractive index of the second stack 322 may have a value between the refractive index of the first stack 321 and the refractive index of the third color filter 235. The reflectance of external light incident on the color conversion substrate 30 and reflected may be reduced as the refractive index of the second stack 322 has the value between the refractive index of the first stack 321 and the refractive index of the third color filter 235.

The second stack 322 may not overlap the first light transmitting area TA1 and the second light transmitting area TA2. The second stack 322 may overlap the second light blocking area BA2 and the third light blocking area BA3. The second stack 322 may overlap the third light transmitting area TA3 and may be formed in a stripe shape. However, the disclosure is not limited thereto, and the second stack 322 may also be formed in the form of an island pattern spaced apart from each other.

The second color filter 233 may be disposed in the second light transmitting area TA2. The second color filter 233 may contact one surface (a lower surface in FIG. 44) of the first stack 321 in the second light transmitting area TA2. A portion of the second color filter 233 may contact one surface (a lower surface in FIG. 44) of the first light blocking member 221, and another portion thereof may contact one surface (a lower surface in FIG. 44) of the second light blocking member 222.

In the second light transmitting area TA2, the first stack 321 may be disposed between the second substrate 310 and the second color filter 233. The reflectance of external light incident on the color conversion substrate 30 and reflected may be reduced as the refractive index of the first stack 321 has the value between the refractive index of the second substrate 310 and the refractive index of the second color filter 233.

According to the illustrated embodiment, the reflectance of external light in the third light transmitting area TA3 overlapping the third color filter 235 may be reduced as the second stack 322 does not overlap the first light transmitting area TA1 and the second light transmitting area TA2, overlaps the third light transmitting area TA3, and is selectively disposed between the first stack 321 and the third color filter 235 as described above.

Figure 45:
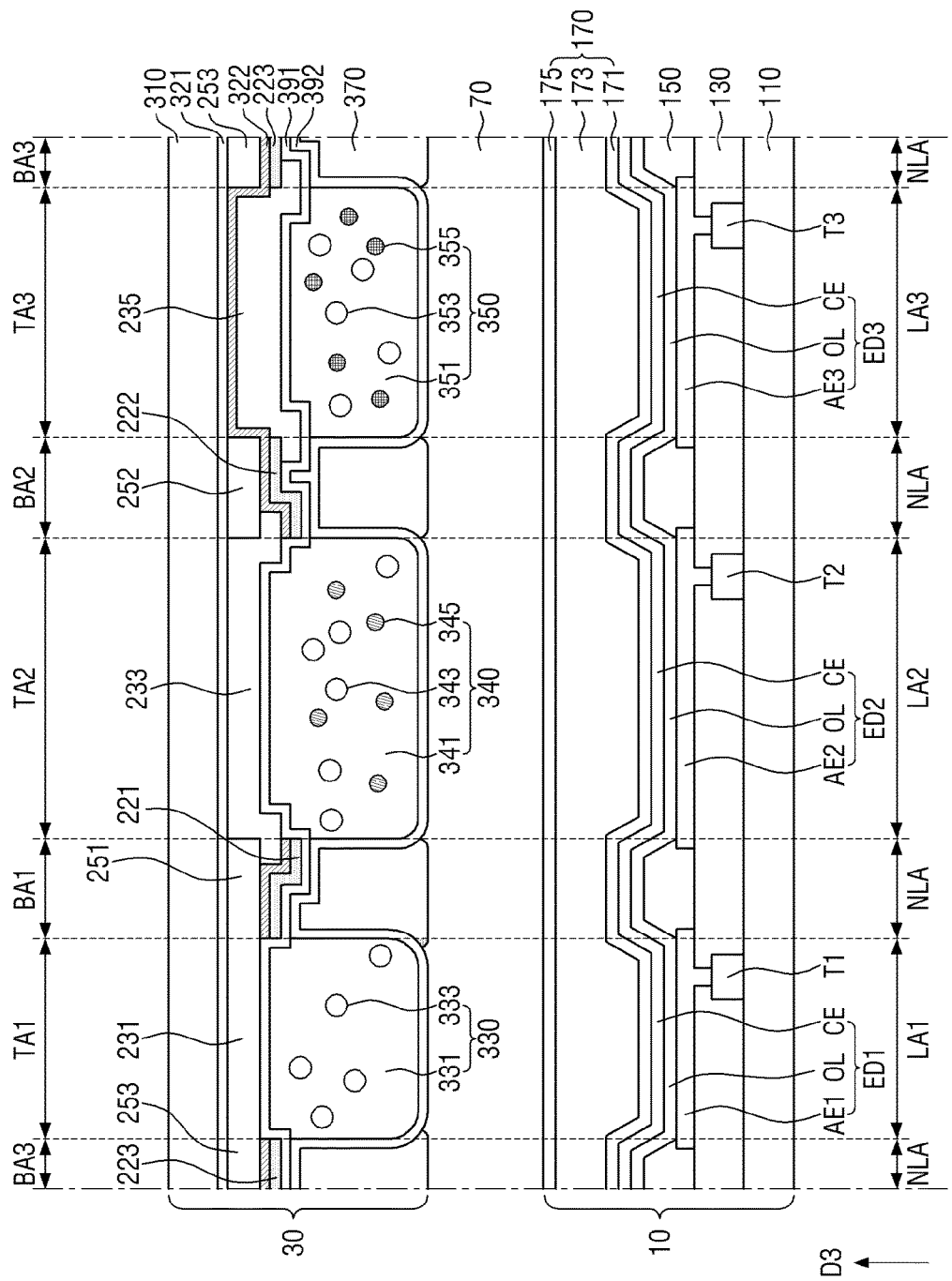

FIG. 45 is a cross-sectional view schematically illustrating a display device according to still another embodiment taken along line B-B' of FIGS. 3 and 4.

Referring to FIG. 45, the color conversion substrate 30 according to the illustrated embodiment may include the second substrate 310, the first stack 321, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 44 described above in that a shape of the second stack 322 and a position of the light blocking member 220 are different, and other configurations are substantially the same or similar. Therefore, a redundant description will be omitted and differences will be mainly described.

As illustrated in FIG. 45, the second stack 322 may be disposed on one surface of the second substrate 310 facing the display substrate 10.

Unlike FIG. 44 described above, the second stack 322 may overlap the first light blocking area BA1, the second light blocking area BA2, the third light blocking area BA3, and the third light transmitting area TA3. Specifically, the second stack 322 may overlap the entirety of the first light blocking area BA1, the second light blocking area BA2, the third light blocking area BA3, and the third light transmitting area TA3.

As illustrated in FIG. 45, the second stack 322 may overlap the first light blocking area BA1 and may contact one surface (a lower surface in FIG. 45) of the first color pattern 251. The second stack 322 may overlap the second light blocking area BA2 and may contact one surface (a lower surface in FIG. 45) of the second color pattern 252. The second stack 322 may overlap the third light blocking area BA3 and may contact one surface (a lower surface in FIG. 45) of the third color pattern 253. The second stack 322 may overlap the third light transmitting area TA3 and may contact one surface (a lower surface in FIG. 45) of the first stack 321 disposed in the third light transmitting area TA3. The second stack 322 may not overlap the first light transmitting area TA1 and the second light transmitting area TA2.

According to the illustrated embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

As illustrated in FIG. 45, the light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 45) of the second stack 322. The second light blocking member 222 may overlap the second light blocking area BA2 and may be disposed on the second stack 322. The second light blocking member 222 may contact one surface (a lower surface in FIG. 45) of the second stack 322. The third light blocking member 223 may overlap the third light blocking area BA3 and may be disposed on the second stack 322. The third light blocking member 223 may contact one surface (a lower surface in FIG. 45) of the second stack 322.

The first color filter 231 may not overlap the first light blocking member 221 and may be spaced apart from the first light blocking member 221. The third color filter 235 may contact one surface (a lower surface in FIG. 45) of the second stack 322, may overlap the second light blocking member 222 in the second light blocking area BA2, and may contact one surface (a lower surface of FIG. 45) of the second light blocking member 222. In addition, the third color filter 235 may overlap the third light blocking member 223 in the third light blocking area BA3 and may contact one surface (a lower surface in FIG. 45) of the third light blocking member 223.

The second color filter 233 may overlap the second stack 322 and the first light blocking member 221 in the first light blocking area BA1 and may contact one surface (a lower surface in FIG. 45) of the second stack 322. Similarly, the second color filter 233 may overlap the second stack 322 and the second light blocking member 222 in the second light blocking area BA2 and may contact one surface (a lower surface in FIG. 45) of the second stack 322.

The second stack 322 and the first light blocking member 221 may completely overlap each other in the first light blocking area BA1, the second stack 322 and the second light blocking member 222 may completely overlap each other in the second light blocking area BA2, and the second stack 322 and the third light blocking member 223 may completely overlap each other in the third light blocking area BA3. At least one side of the second stack 322 and at least one side of the first light blocking member 221 may be aligned with each other and coincide with each other in the first light blocking area BA1, at least one side of the second stack 322 and at least one side of the second light blocking member 221 may be aligned with each other and coincide with each other in the second light blocking area BA2, and at least one side of the second stack 322 and at least one side of the third light blocking member 221 may be aligned with each other and coincide with each other in the third light blocking area BA3.

The arrangement relationship between the second stack 322 and the light blocking members 221, 222, and 223 may be a result of etching the second stack 322 using the first to third light blocking members 221, 222, and 223 and the color filter as the mask as described above with reference to FIGS. 34 to 39.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 46:
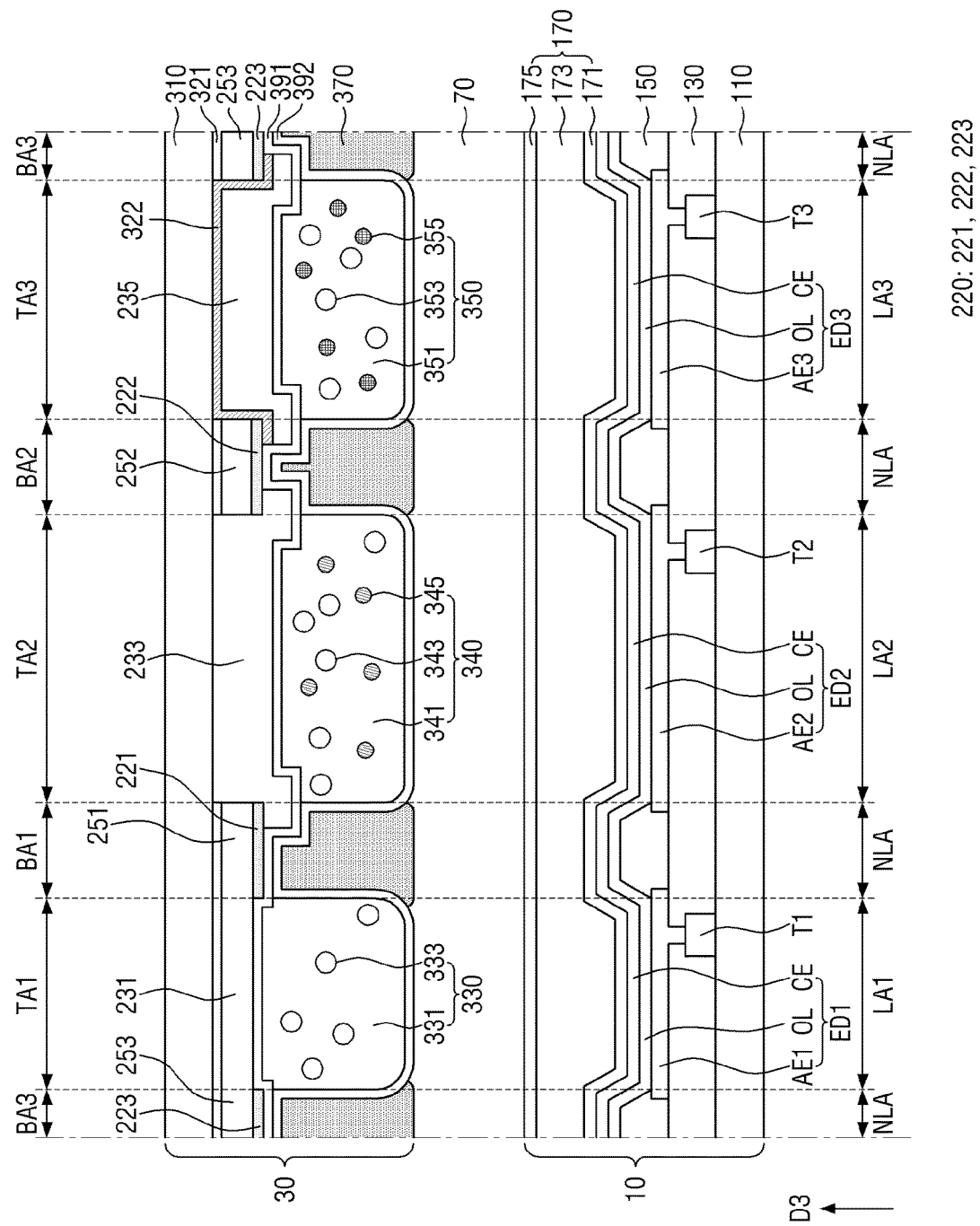
Figure 47:
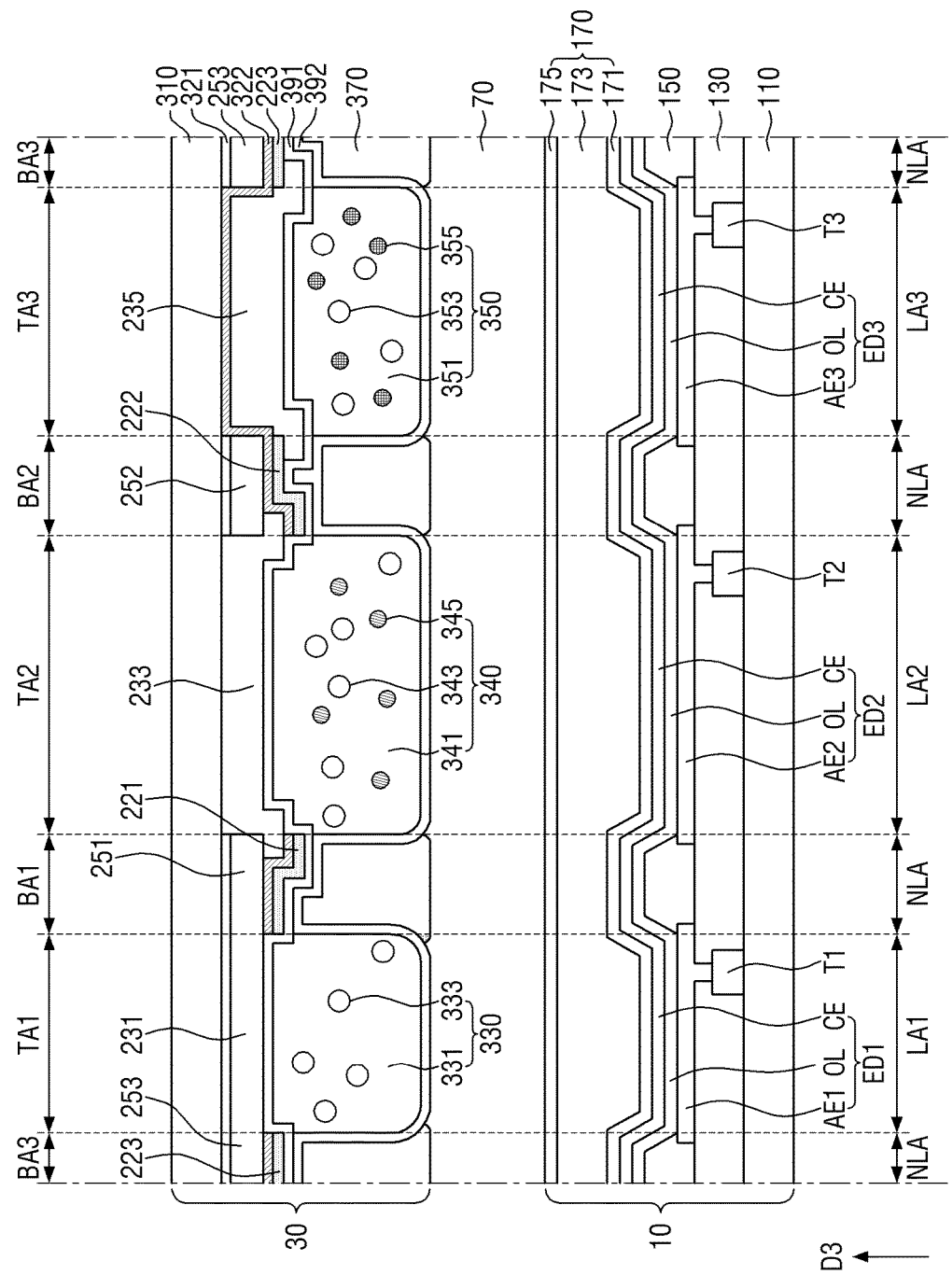

FIGS. 46 and 47 are cross-sectional views schematically illustrating a display device according to still another embodiment taken along line B-B' of FIGS. 3 and 4.

As illustrated in FIG. 46, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 46) of the second substrate 310 in the third light transmitting area TA3. The second color filter 233 may contact one surface (a lower surface in FIG. 46) of the second substrate 310 in the second light transmitting area TA2. The configurations other than the configuration of the first stack 321 are substantially the same as or similar to those of FIG. 44 described above, and thus detailed descriptions thereof will be omitted.

According to the illustrated embodiment, the reflectance of external light between the third color filter 235 and the second substrate 310 may be reduced by selectively disposing the second stack 322 in a pattern shape between the third color filter 235 and the second substrate 310 in the third light transmitting area TA3.

In addition, as illustrated in FIG. 47, the light blocking member 220 may be disposed on the second stack 322. Similarly to the position of the light blocking member 220 of FIG. 45 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 45, and thus a detailed description thereof will be omitted.

Figure 48:
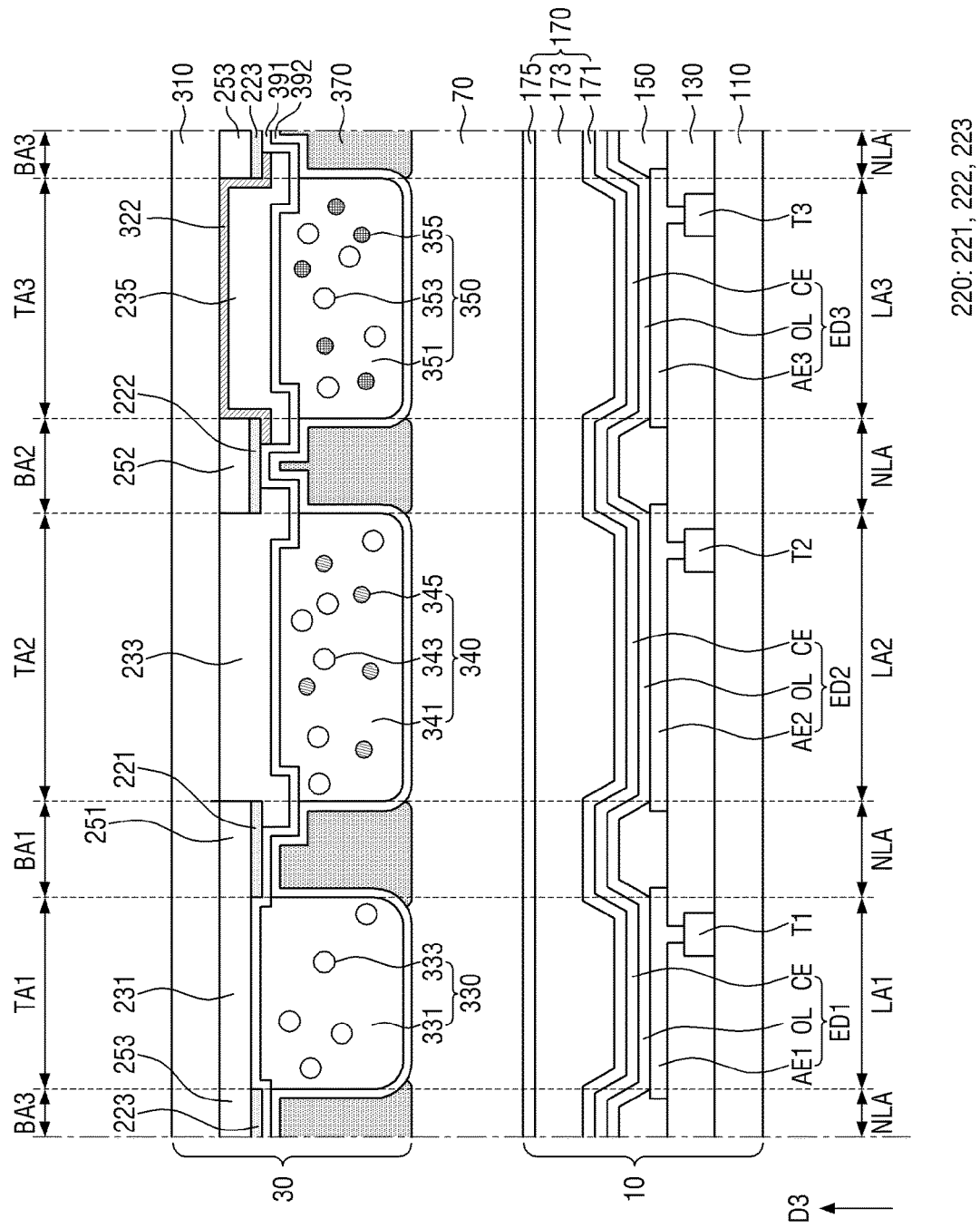
Figure 49:
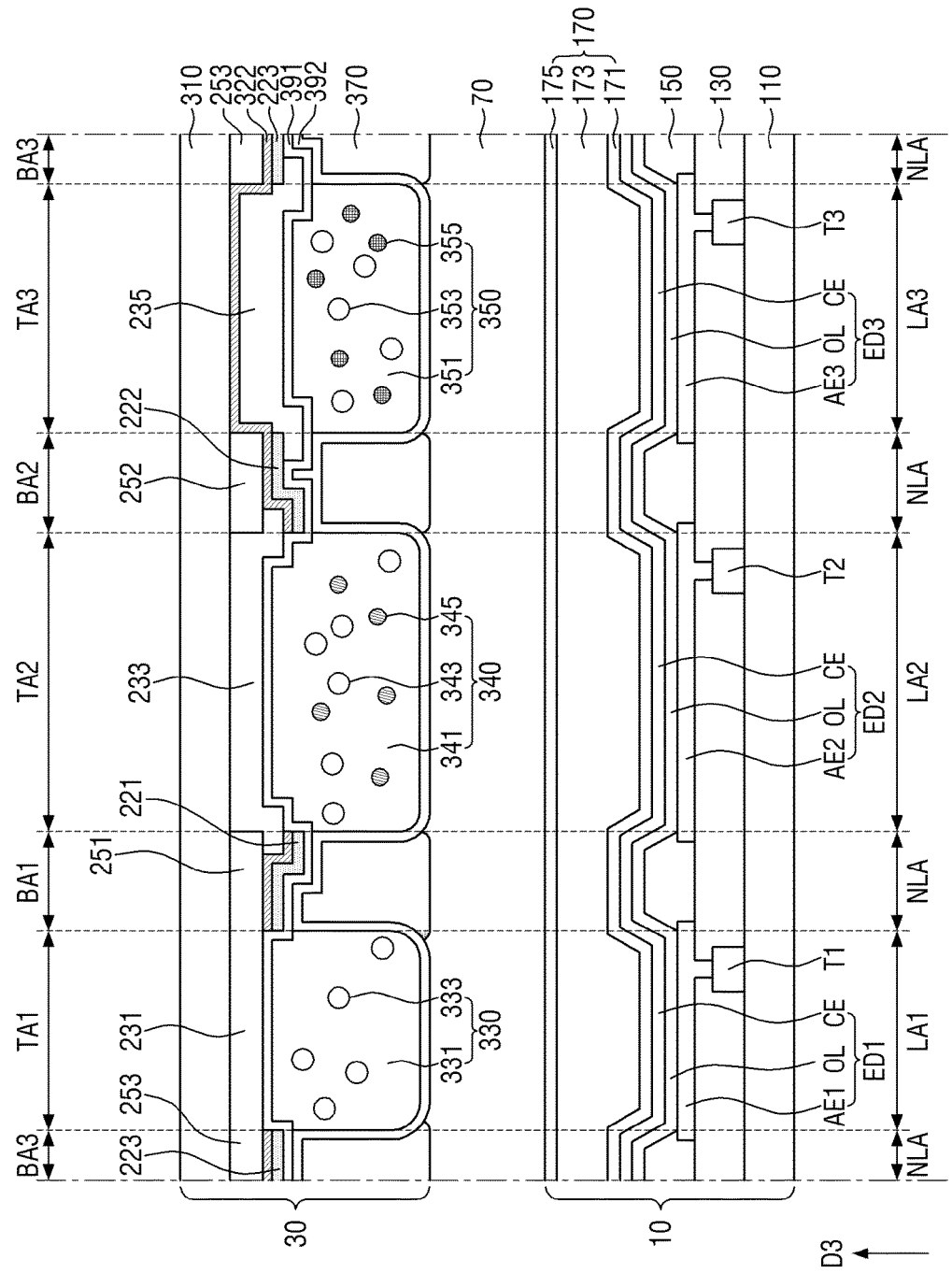

FIGS. 48 and 49 are cross-sectional views schematically illustrating a display device according to still another embodiment taken along line B-B' of FIGS. 3 and 4.

Referring to FIG. 48, the color conversion substrate 30 according to the illustrated embodiment may include the second substrate 310, the color filters 231, 233, and 235, the light blocking member 220, the second stack 322, the light transmission pattern 330, the first wavelength conversion pattern 340, and the second wavelength conversion pattern 350. In particular, the illustrated embodiment is different from the embodiment of FIG. 44 described above in that the first stack 321 is omitted, and other configurations are substantially the same or similar. Therefore, a redundant description will be omitted and differences will be mainly described.

Referring to FIG. 48, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 48) of the second substrate 310.

According to an embodiment, the second stack 322 may be disposed on the second light blocking member 222, the third light blocking member 223, and the second substrate 310. The second stack 322 may be in direct contact with one surface (an upper surface in FIG. 48) of the third color filter 235 overlapping the third light transmitting area TA3, and may be in direct contact with one surface (a lower surface in FIG. 48) of the second substrate 310 overlapping the third light transmitting area TA3. The second stack 322 may be in direct contact with one surface (a lower surface of FIG. 48) of each of the second light blocking member 222 and the third light blocking member 223. According to an embodiment, the second stack 322 may not overlap the first light transmitting area TA1, the second light transmitting area TA2, and the first light blocking area BA1.

According to the illustrated embodiment, the second stack 322 having a refractive index between the refractive index of the third color filter 235 and the refractive index of the second substrate 310 may be disposed between the third color filter 235 and the second substrate 310.

That is, by selectively forming the second stack 322 in a pattern shape in the area in which the third color filter 235 is disposed, the reflectance of external light at the interface between the third color filter 235 and the second substrate 310 may be reduced. Although the second stack 322 is described as an example in the illustrated embodiment, the disclosure is not limited thereto, and the first stack 321 may also be disposed instead of the second stack 322.

, as illustrated in FIG. 49, the light blocking member 220 may be disposed on the second stack 322. The first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 44, and thus a detailed description thereof will be omitted.

As illustrated in FIG. 49, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 50:
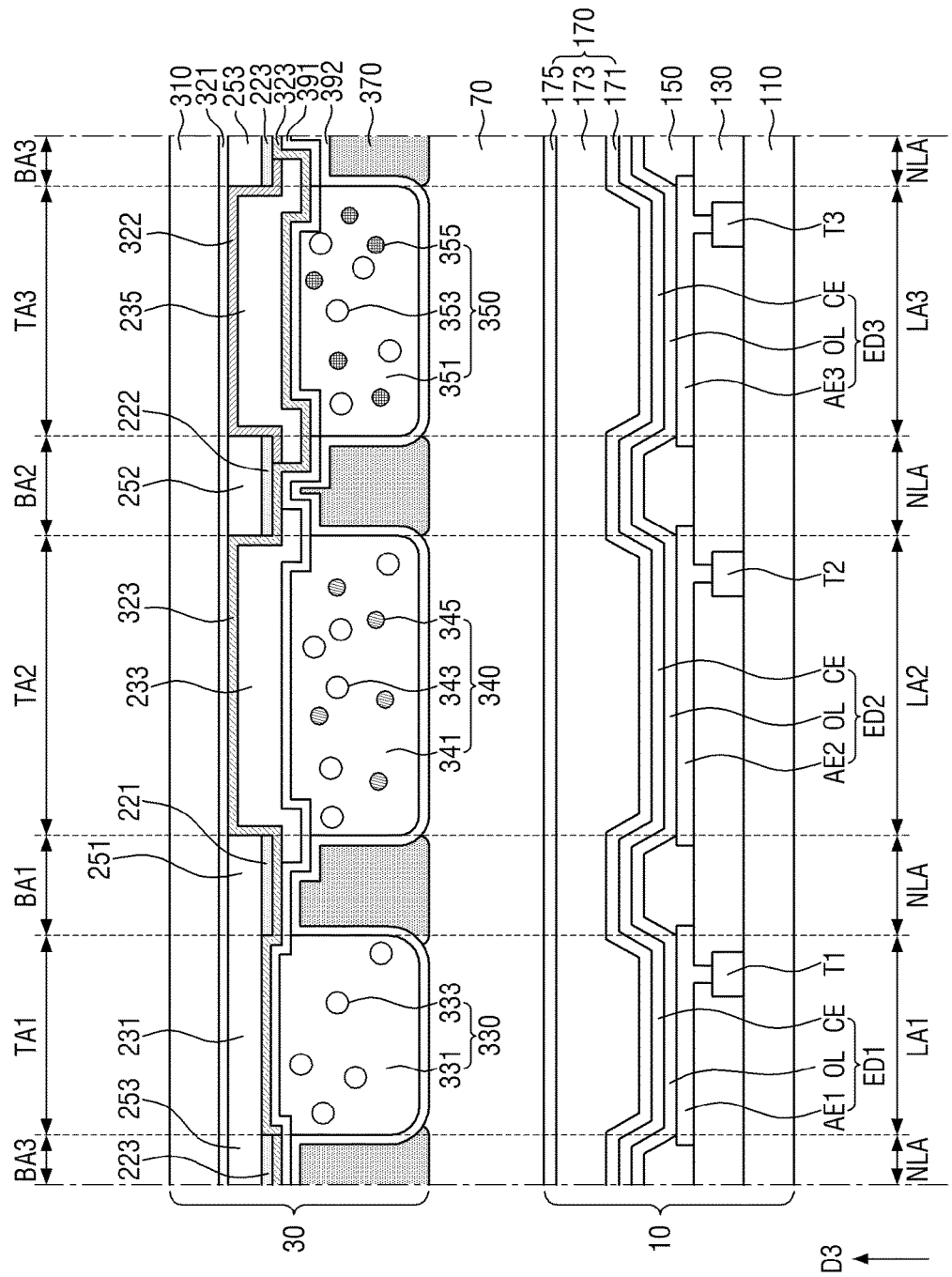

FIG. 50 is a cross-sectional view schematically illustrating a display device according to still another embodiment taken along line B-B' of FIGS. 3 and 4.

Referring to FIG. 50, the color conversion substrate 30 according to the illustrated embodiment may include the second substrate 310, the first stack 321, the color filters 231, 233, and 235, the light blocking member 220, the second stack 322, a third stack 323, the light transmission pattern 330, the first wavelength conversion pattern 340, and the second wavelength conversion pattern 350. In particular, the illustrated embodiment is different from the embodiment of FIG. 44 described above in that the third stack 323 is further disposed, and other configurations are substantially the same or similar. Therefore, a redundant description will be omitted and differences will be mainly described.

As illustrated in FIG. 50, the color conversion substrate 30 may further include the third stack 323 disposed on one surface of the second substrate 310. The third stack 323 may be disposed on the first stack 321, the first color filter 231, the third color filter 235, the first light blocking member 221, the second light blocking member 222, and the third light blocking member 223. The third stack 323 may overlap the entirety of the first stack 321.

The third stack 323 may overlap the first light transmitting area TA1 and may be in direct contact with one surface (a lower surface in FIG. 50) of the first color filter 231. The third stack 323 may overlap the first light blocking area BA1 and may contact one surface (a lower surface in FIG. 50) of the first light blocking member 221. The third stack 323 may overlap the second light transmitting area TA2 and may be in direct contact with one surface (a lower surface in FIG. 50) of the first stack 321 disposed in the second light transmitting area TA2. The third stack 323 may overlap the second light blocking area BA2 and may contact one surface (a lower surface in FIG. 50) of the second light blocking member 222. The third stack 323 may overlap the third light transmitting area TA3 and may be in direct contact with one surface (a lower surface in FIG. 50) of the third color filter 235 disposed in the third light transmitting area TA3. The third stack 323 may overlap the third light blocking area BA3 and may be in direct contact with one surface (a lower surface in FIG. 50) of the third light blocking member 223.

The third stack 323 may be in direct contact with the first stack 321 overlapping the second light transmitting area TA2. According to an embodiment, the second color filter 233 may be disposed in the second light transmitting area TA2. The third stack 323 may be in direct contact with one surface (an upper surface in FIG. 50) of the second color filter 233, and may be disposed between the first stack 321 and the second color filter 233.

The third stack 323 may be disposed between the first stack 321 and the second color filter 233 to reduce a reflectance of external light at the interface between the first stack 321 and the second color filter 233. The refractive index of the third stack 323 may have a value between the refractive index of the first stack 321 and the refractive index of the second color filter 233. The reflectance of external light incident on the color conversion substrate 30 and reflected may be reduced as the refractive index of the third stack 323 has the value between the refractive index of the first stack 321 and the refractive index of the second color filter 233.

According to the illustrated embodiment, as described above, the reflectance of external light in the second light transmitting area TA2 overlapping the second color filter 233 may be reduced as the third stack 323 overlaps the second light transmitting area TA2 and is selectively disposed between the first stack 321 and the second color filter 233.

Figure 51:
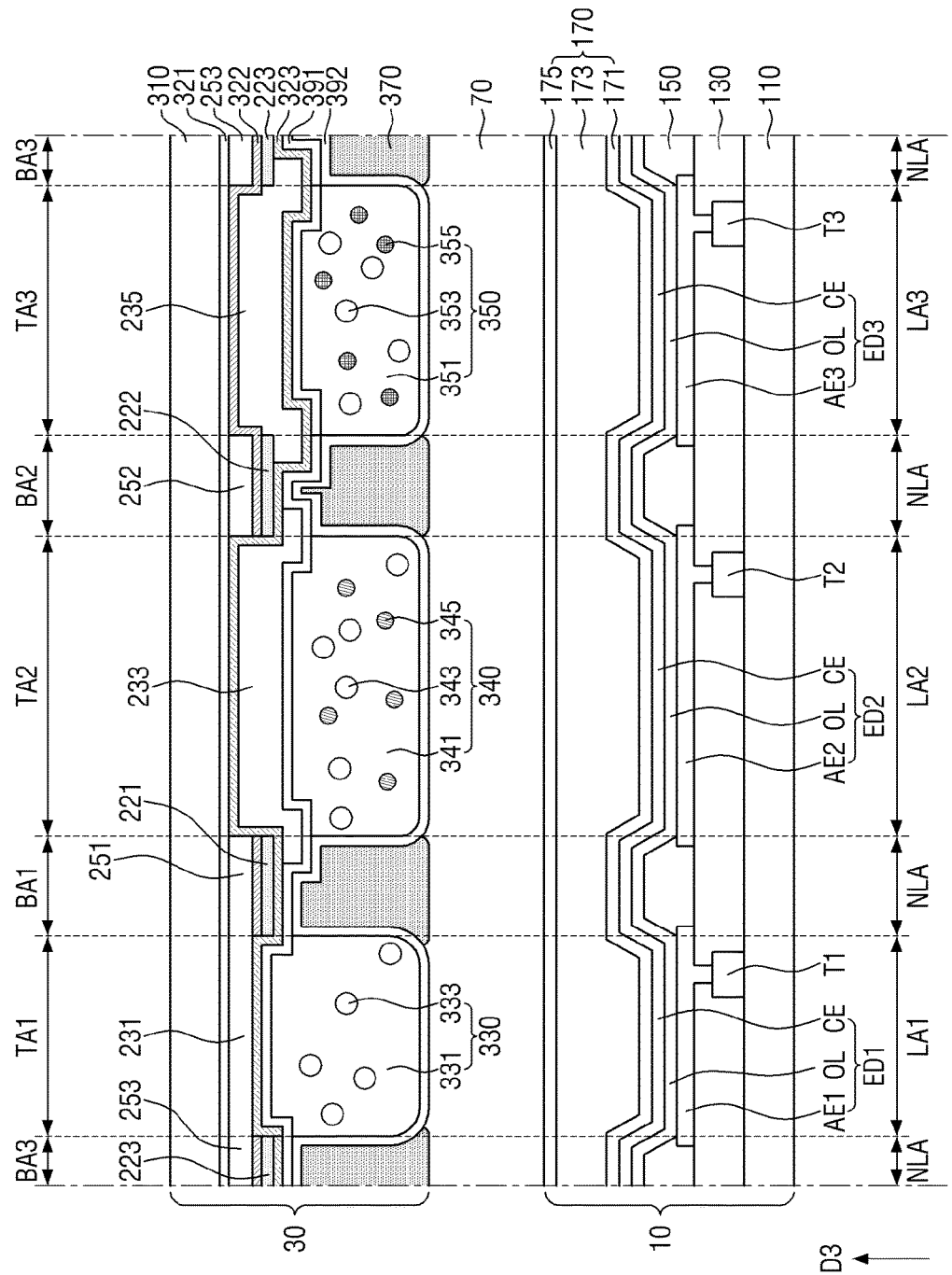

FIG. 51 is a cross-sectional view schematically illustrating a display device according to still another embodiment taken along line B-B' of FIGS. 3 and 4.

Referring to FIG. 51, the color conversion substrate 30 according to the illustrated embodiment may include the second substrate 310, the first stack 321, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 50 described above in that a shape of the second stack 322 and a position of the light blocking member 220 are different, and other configurations are substantially the same or similar. Therefore, a redundant description will be omitted and differences will be mainly described.

As illustrated in FIG. 51, the second stack 322 may be disposed on one surface of the second substrate 310 facing the display substrate 10.

Unlike FIG. 50 described above, the second stack 322 may overlap the first light blocking area BA1, the second light blocking area BA2, the third light blocking area BA3, and the third light transmitting area TA3. Specifically, the second stack 322 may overlap the entirety of the first light blocking area BA1, the second light blocking area BA2, the third light blocking area BA3, and the third light transmitting area TA3.

As illustrated in FIG. 51, the second stack 322 may overlap the first light blocking area BA1 and may contact one surface (a lower surface in FIG. 51) of the first color pattern 251. The second stack 322 may overlap the second light blocking area BA2 and may contact one surface (a lower surface in FIG. 51) of the second color pattern 252. The second stack 322 may overlap the third light blocking area BA3 and may contact one surface (a lower surface in FIG. 51) of the third color pattern 253. The second stack 322 may overlap the third light transmitting area TA3 and may contact one surface (a lower surface in FIG. 51) of the first stack 321 disposed in the third light transmitting area TA3. The second stack 322 may not overlap the first light transmitting area TA1 and the second light transmitting area TA2.

According to the illustrated embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

As illustrated in FIG. 51, the light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 51) of the second stack 322. The second light blocking member 222 may overlap the second light blocking area BA2 and may be disposed on the second stack 322. The second light blocking member 222 may contact one surface (a lower surface in FIG. 51) of the second stack 322. The third light blocking member 223 may overlap the third light blocking area BA3 and may be disposed on the second stack 322. The third light blocking member 223 may contact one surface (a lower surface in FIG. 51) of the second stack 322.

The first color filter 231 may not overlap the first light blocking member 221 and may be spaced apart from the first light blocking member 221. The third color filter 235 may contact one surface (a lower surface in FIG. 51) of the second stack 322, may overlap the second light blocking member 222 in the second light blocking area BA2, and may contact one surface (a lower surface of FIG. 51) of the second light blocking member 222. In addition, the third color filter 235 may overlap the third light blocking member 223 in the third light blocking area BA3 and may contact one surface (a lower surface in FIG. 51) of the third light blocking member 223.

Similarly to FIG. 50 described above, the third stack 323 may cover the first stack 321, the first color filter 231, the third color filter 235, the first light blocking member 221, the second light blocking member 222, and the third light blocking member 223.

The second color filter 233 may be disposed on the third stack 323 and may contact one surface (a lower surface of FIG. 51) of the third stack 323. The second color filter 233 may overlap the third stack 323 and the first light blocking member 221 in the first light blocking area BA1 and may contact one surface (a lower surface in FIG. 51) of the third stack 322. Similarly, the second color filter 233 may overlap the third stack 323 and the second light blocking member 222 in the second light blocking area BA2 and may contact one surface (a lower surface in FIG. 51) of the third stack 323.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 52:
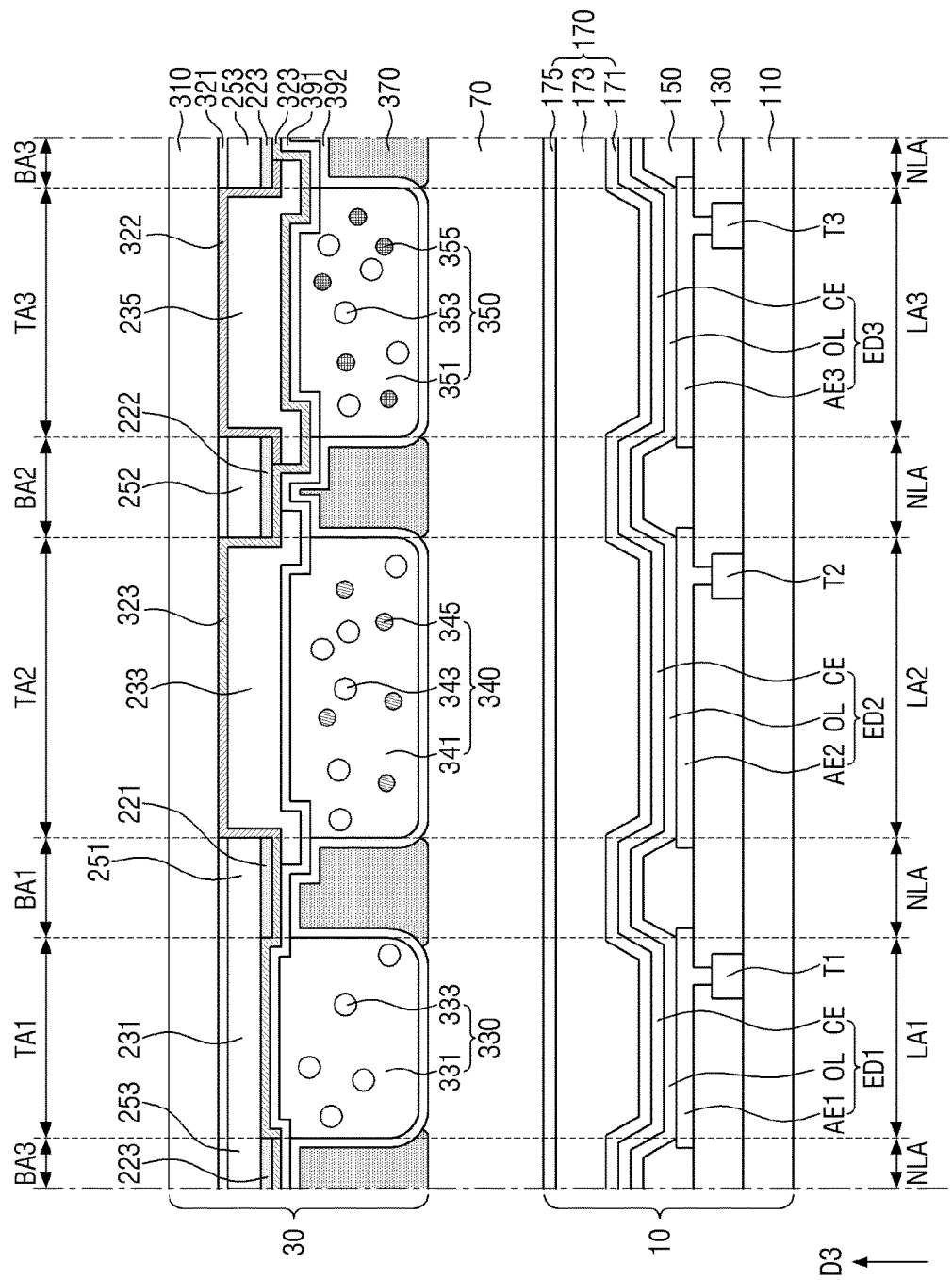
FIGS. 52 to 61 are cross-sectional views schematically illustrating a display device according to still another embodiment taken along line B-B' of FIGS. 3 and 4.
Figure 53:
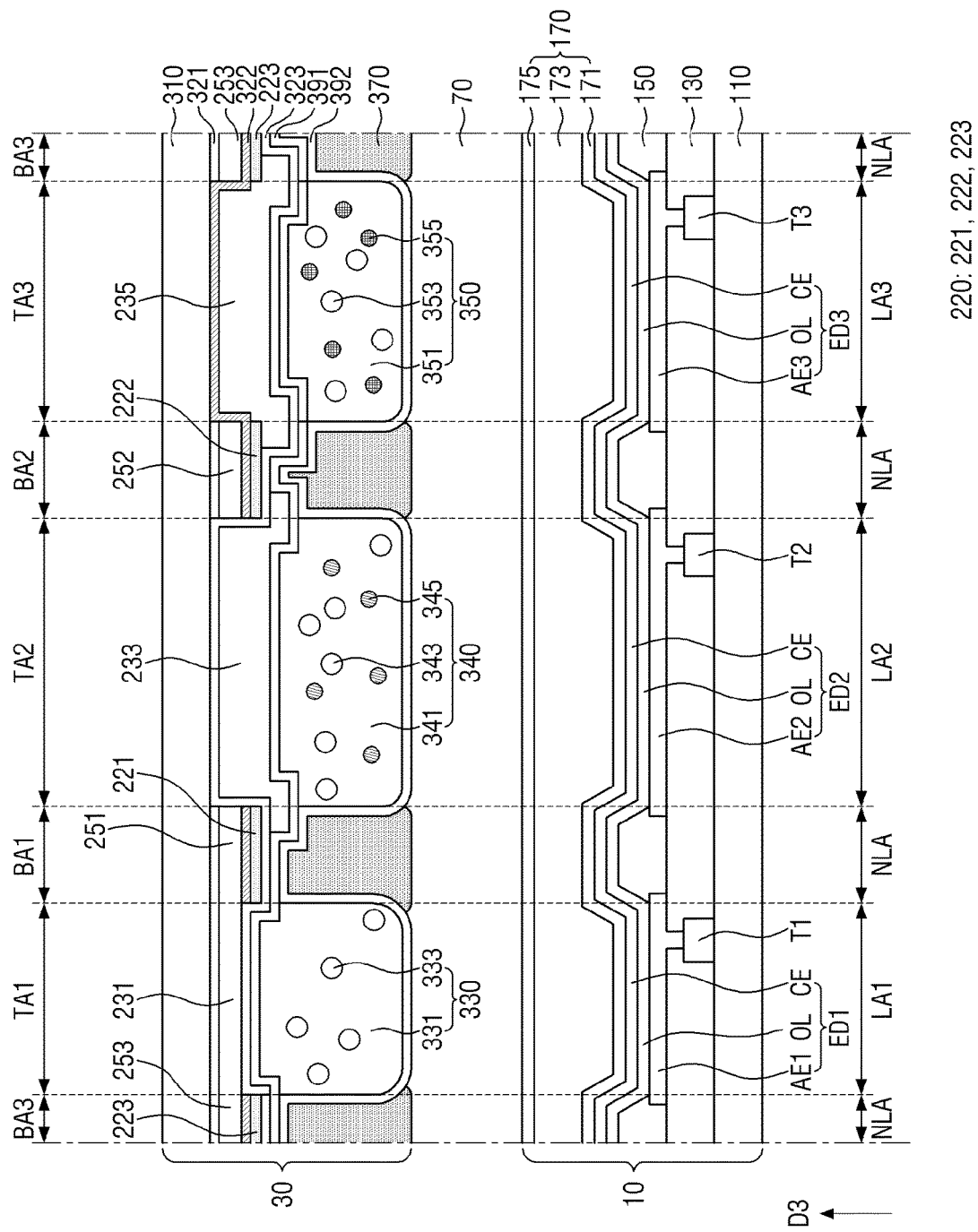

FIGS. 52 and 53 are cross-sectional views schematically illustrating a display device according to still another embodiment taken along line B-B' of FIGS. 3 and 4.

As illustrated in FIG. 52, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 52) of the second substrate 310 in the third light transmitting area TA3. The third stack 323 may be in direct contact with one surface (a lower surface in FIG. 52) of the second substrate 310 in the second light transmitting area TA2. The configurations other than the configuration of the first stack 321 are substantially the same as or similar to those of FIG. 50 described above, and thus detailed descriptions thereof will be omitted.

According to the illustrated embodiment, the reflectance of external light between the third color filter 235 and the second substrate 310 may be reduced by selectively disposing the second stack 322 in a pattern shape between the third color filter 235 and the second substrate 310 in the third light transmitting area TA3. In addition, the reflectance of external light between the second color filter 233 and the second substrate 310 may be reduced by selectively disposing the third stack 323 between the second color filter 233 and the second substrate 310 in the second light transmitting area TA2.

In addition, as illustrated in FIG. 53, the light blocking member 220 may be disposed on the second stack 322. Similarly to the position of the light blocking member 220 of FIG. 51 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 51, and thus a detailed description thereof will be omitted.

Figure 54:
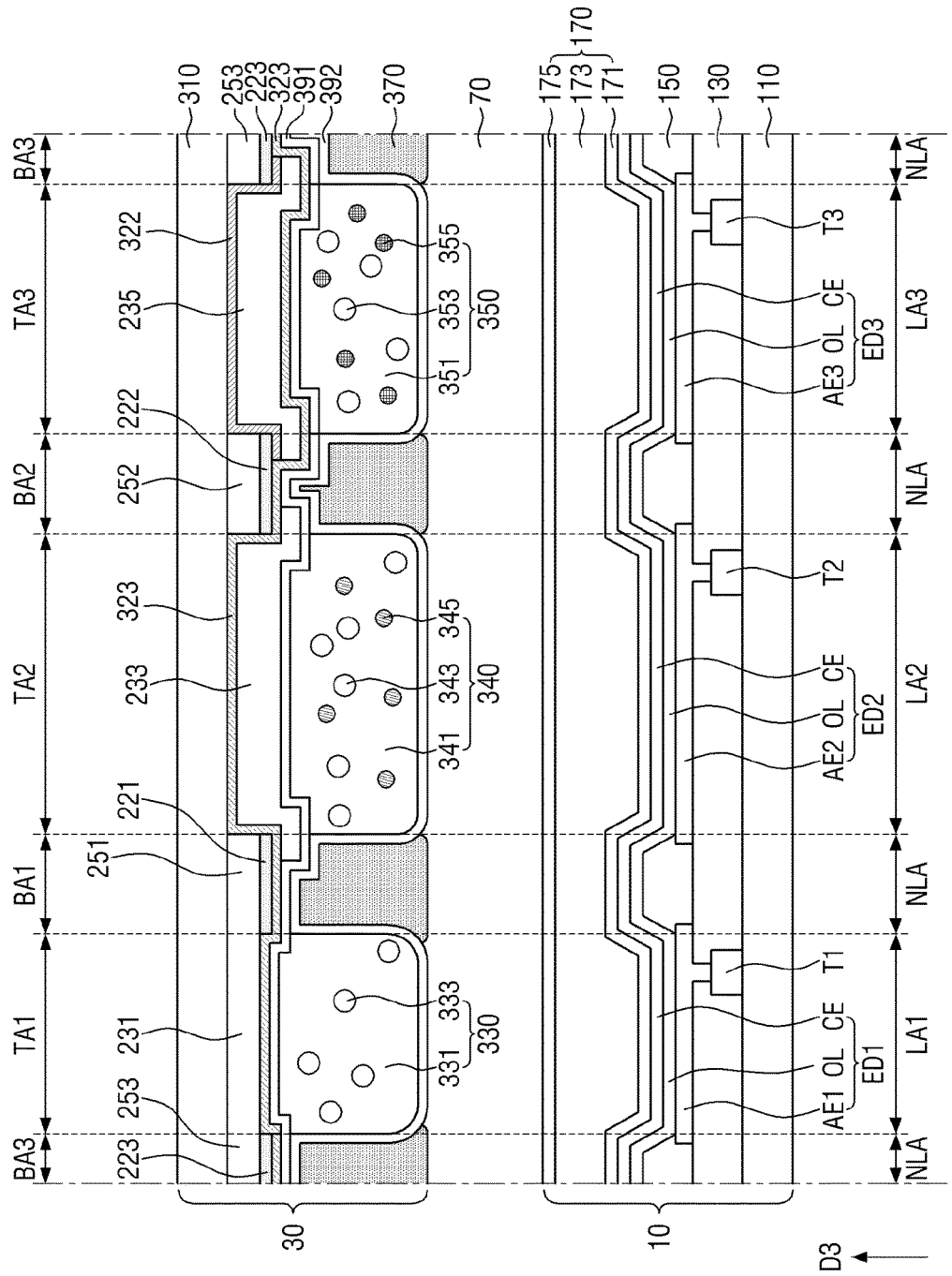
Figure 55:
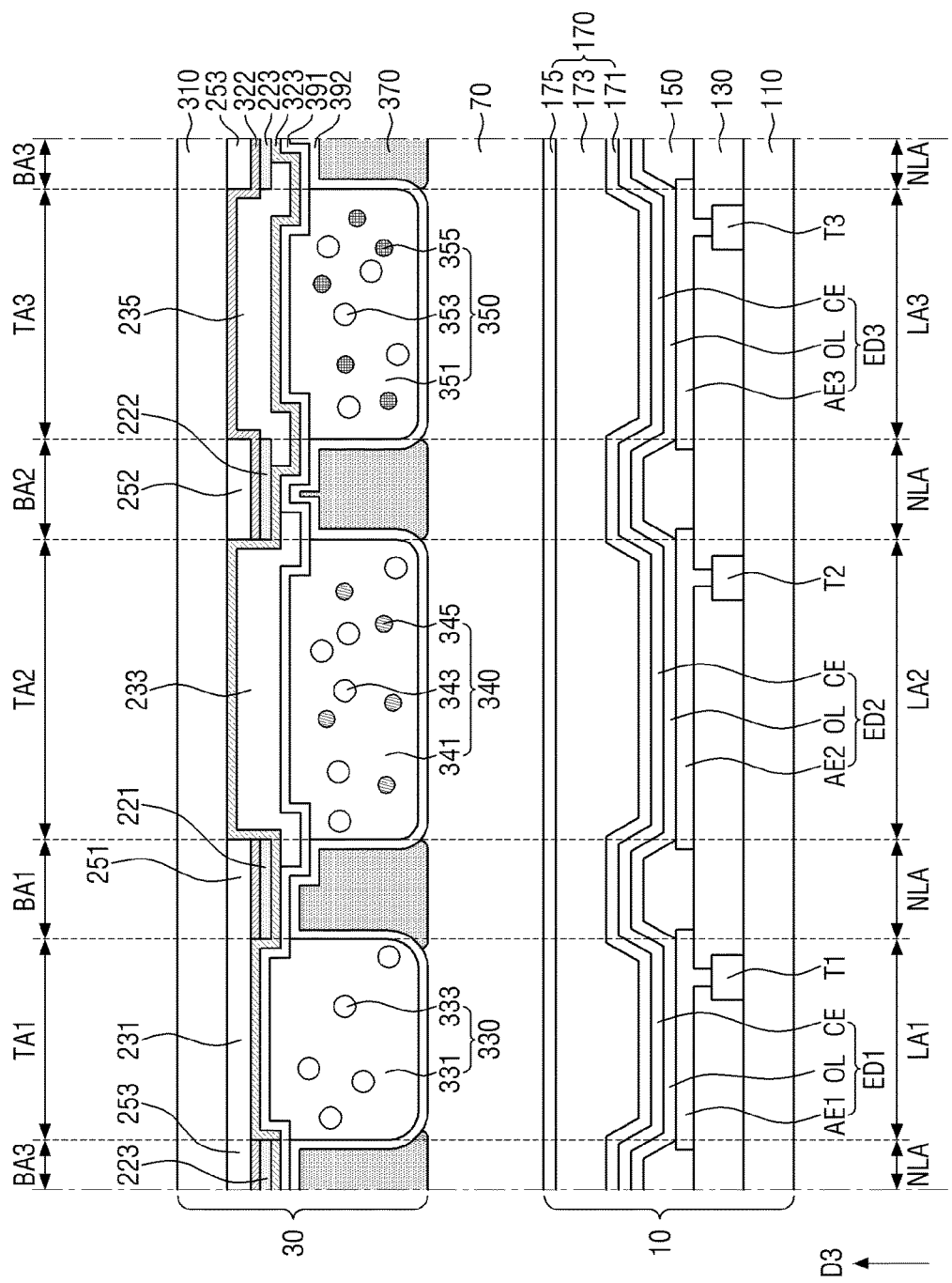

FIGS. 54 and 55 are cross-sectional views schematically illustrating a display device according to still another embodiment taken along line B-B' of FIGS. 3 and 4.

Referring to FIG. 54, the color conversion substrate 30 according to the illustrated embodiment may include the second substrate 310, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 50 described above in that the first stack 321 is omitted, and other configurations are substantially the same or similar. Therefore, a redundant description will be omitted and differences will be mainly described.

Referring to FIG. 54, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 54) of the second substrate 310.

According to an embodiment, the second stack 322 may be in direct contact with one surface (an upper surface in FIG. 54) of the third color filter 235 overlapping the third light transmitting area TA3, and may be in direct contact with one surface (a lower surface in FIG. 54) of the second substrate 310 overlapping the third light transmitting area TA3. The second stack 322 may be in direct contact with one surface (a lower surface of FIG. 54) of each of the second light blocking member 222 and the third light blocking member 223. According to an embodiment, the second stack 322 may not overlap the first light transmitting area TA1, the second light transmitting area TA2, and the first light blocking area BA1.

According to an embodiment, the third stack 323 may be in direct contact with one surface (an upper surface in FIG. 54) of the second color filter 233 overlapping the second light transmitting area TA2, and may be in direct contact with one surface (a lower surface in FIG. 54) of the second substrate 310 overlapping the second light transmitting area TA2. According to an embodiment, the third stack 323 may overlap the first to third light transmitting areas TA1 to TA3 and the first to third light blocking areas BA1 to BA3.

According to the illustrated embodiment, the second stack 322 having a refractive index between the refractive index of the third color filter 235 and the refractive index of the second substrate 310 may be disposed between the third color filter 235 and the second substrate 310. In addition, the third stack 323 having a refractive index between the refractive index of the second color filter 233 and the refractive index of the second substrate 310 may be disposed between the second color filter 233 and the second substrate 310.

That is, the reflectance of external light at the interface between the second color filter 233 and the second substrate 310 and at the interface between the third color filter 235 and the second substrate 310 may be reduced by forming the third stack 323 in a plate shape between the second color filter 233 and the second substrate 310 and selectively forming the second stack 322 in a pattern shape between the third color filter 235 and the second substrate 310. According to the illustrated embodiment, the positions of the second stack 322 and the third stack 323 may be changed from each other.

As illustrated in FIG. 55, the light blocking member 220 may be disposed on the second stack 322. The first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 51, and thus a detailed description thereof will be omitted.

As illustrated in FIG. 55, the light blocking member 220 may be disposed between the second stack 322 and the first capping layer 391. The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 56:
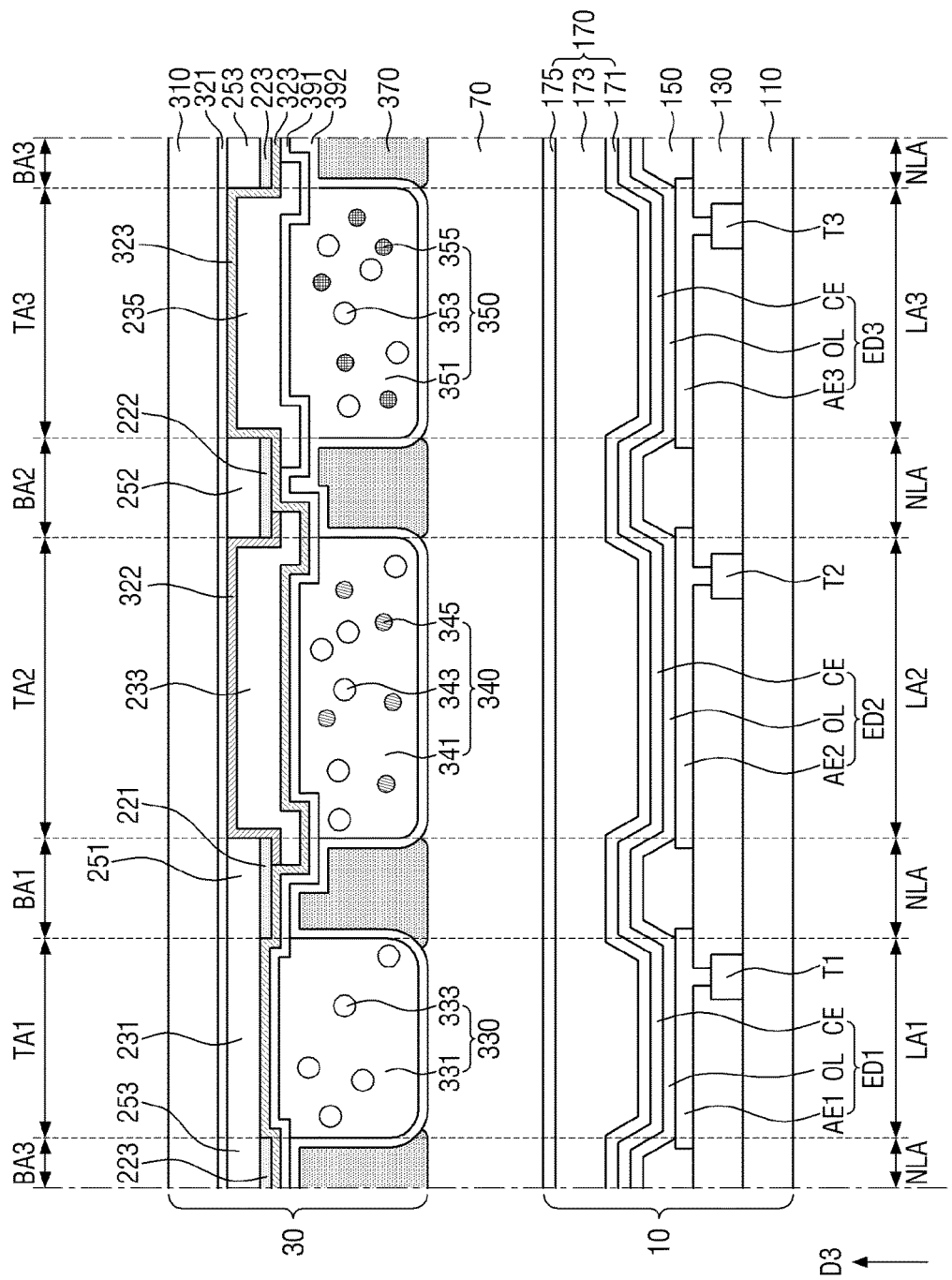

FIG. 56 is a cross-sectional view schematically illustrating a display device according to still another embodiment taken along line B-B' of FIGS. 3 and 4.

Referring to FIG. 56, the color conversion substrate 30 according to the illustrated embodiment may include the second substrate 310, the first stack 321, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 32 described above in that the third stack 323 is further included, and other configurations are substantially the same or similar. Therefore, a redundant description will be omitted and differences will be mainly described.

As illustrated in FIG. 56, the color conversion substrate 30 may further include the third stack 323 disposed on one surface of the second substrate 310. The third stack 323 may be disposed on the first stack 321, the first color filter 231, the second color filter 233, the first light blocking member 221, the second light blocking member 222, and the third light blocking member 223. The third stack 323 may overlap the entirety of the first stack 321.

The third stack 323 may overlap the first light transmitting area TA1 and may be in direct contact with one surface (a lower surface in FIG. 56) of the first color filter 231. The third stack 323 may overlap the first light blocking area BA1 and may contact one surface (a lower surface in FIG. 56) of the first light blocking member 221. The third stack 323 may overlap the third light transmitting area TA3 and may be in direct contact with one surface (a lower surface in FIG. 56) of the first stack 321 disposed in the third light transmitting area TA3. The third stack 323 may overlap the second light blocking area BA2 and may contact one surface (a lower surface in FIG. 56) of the second light blocking member 222. The third stack 323 may overlap the second light transmitting area TA2 and may be in direct contact with one surface (a lower surface in FIG. 56) of the second color filter 233 disposed in the second light transmitting area TA2. The third stack 323 may overlap the third light blocking area BA3 and may be in direct contact with one surface (a lower surface in FIG. 56) of the third light blocking member 223.

The third stack 323 may be in direct contact with one surface (a lower surface in FIG. 56) of the first stack 321 overlapping the third light transmitting area TA3. According to an embodiment, the third color filter 235 may be disposed in the third light transmitting area TA3. The third stack 323 may be in direct contact with one surface (an upper surface in FIG. 56) of the third color filter 235, and may be disposed between the first stack 321 and the third color filter 235.

The third stack 323 may be disposed between the first stack 321 and the third color filter 235 to reduce a reflectance of external light at the interface between the first stack 321 and the third color filter 235. The refractive index of the third stack 323 may have a value between the refractive index of the first stack 321 and the refractive index of the third color filter 235. The reflectance of external light incident on the color conversion substrate 30 and reflected may be reduced as the refractive index of the third stack 323 has the value between the refractive index of the first stack 321 and the refractive index of the third color filter 235.

According to the illustrated embodiment, the reflectance of external light in the third light transmitting area TA3 overlapping the third color filter 235 may be reduced as the third stack 323 overlaps the third light transmitting area TA3 and is selectively disposed between the first stack 321 and the third color filter 235 as described above.

Figure 57:
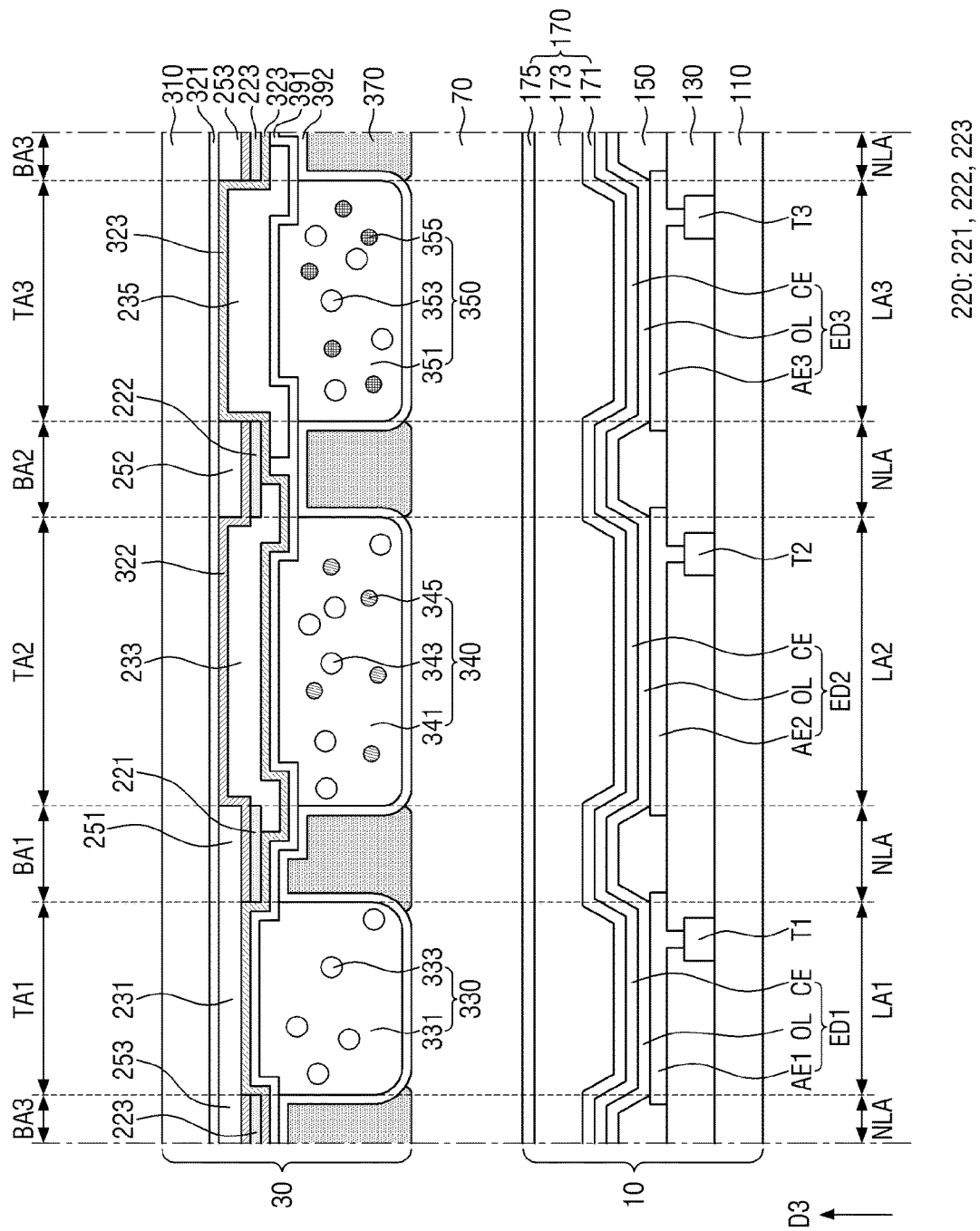

FIG. 57 is a cross-sectional view schematically illustrating a display device according to still another embodiment taken along line B-B' of FIGS. 3 and 4.

Referring to FIG. 57, the color conversion substrate 30 according to the illustrated embodiment may include the second substrate 310, the first stack 321, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 56 described above in that a shape of the second stack 322 and a position of the light blocking member 220 are different, and other configurations are substantially the same or similar. Therefore, a redundant description will be omitted and differences will be mainly described.

As illustrated in FIG. 57, the second stack 322 may be disposed on one surface of the second substrate 310 facing the display substrate 10.

Unlike FIG. 56 described above, the second stack 322 may overlap the first light blocking area BA1, the second light blocking area BA2, the third light blocking area BA3, and the second light transmitting area TA2. Specifically, the second stack 322 may overlap the entirety of the first light blocking area BA1, the second light blocking area BA2, the third light blocking area BA3, and the second light transmitting area TA2.

As illustrated in FIG. 57, the second stack 322 may overlap the first light blocking area BA1 and may contact one surface (a lower surface in FIG. 57) of the first color pattern 251. The second stack 322 may overlap the second light blocking area BA2 and may contact one surface (a lower surface in FIG. 57) of the second color pattern 252. The second stack 322 may overlap the third light blocking area BA3 and may contact one surface (a lower surface in FIG. 57) of the third color pattern 253. The second stack 322 may overlap the second light transmitting area TA2 and may contact one surface (a lower surface in FIG. 57) of the first stack 321 disposed in the second light transmitting area TA2. The second stack 322 may not overlap the first light transmitting area TA1 and the third light transmitting area TA3.

According to the illustrated embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

As illustrated in FIG. 57, the light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 57) of the second stack 322. The second light blocking member 222 may overlap the second light blocking area BA2 and may be disposed on the second stack 322. The second light blocking member 222 may contact one surface (a lower surface in FIG. 57) of the second stack 322. The third light blocking member 223 may overlap the third light blocking area BA3 and may be disposed on the second stack 322. The third light blocking member 223 may contact one surface (a lower surface in FIG. 57) of the second stack 322.

The first color filter 231 may not overlap the first light blocking member 221 and may be spaced apart from the first light blocking member 221. The second color filter 233 may contact one surface (a lower surface in FIG. 57) of the second stack 322, may overlap the first light blocking member 221 in the first light blocking area BA1, and may contact one surface (a lower surface of FIG. 57) of the first light blocking member 221. In addition, the second color filter 233 may overlap the second light blocking member 222 in the second light blocking area BA2 and may contact one surface (a lower surface in FIG. 57) of the second light blocking member 222.

Similarly to FIG. 56 described above, the third stack 323 may cover the first stack 321, the first color filter 231, the second color filter 233, the first light blocking member 221, the second light blocking member 222, and the third light blocking member 223.

The third color filter 235 may be disposed on the third stack 323 and may contact one surface (a lower surface of FIG. 57) of the third stack 323. The third color filter 235 may overlap the third stack 323 and the second light blocking member 222 in the second light blocking area BA2 and may contact one surface (a lower surface in FIG. 57) of the third stack 323. Similarly, the third color filter 235 may overlap the third stack 323 and the third light blocking member 223 in the third light blocking area BA3 and may contact one surface (a lower surface in FIG. 57) of the third stack 323.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 58:
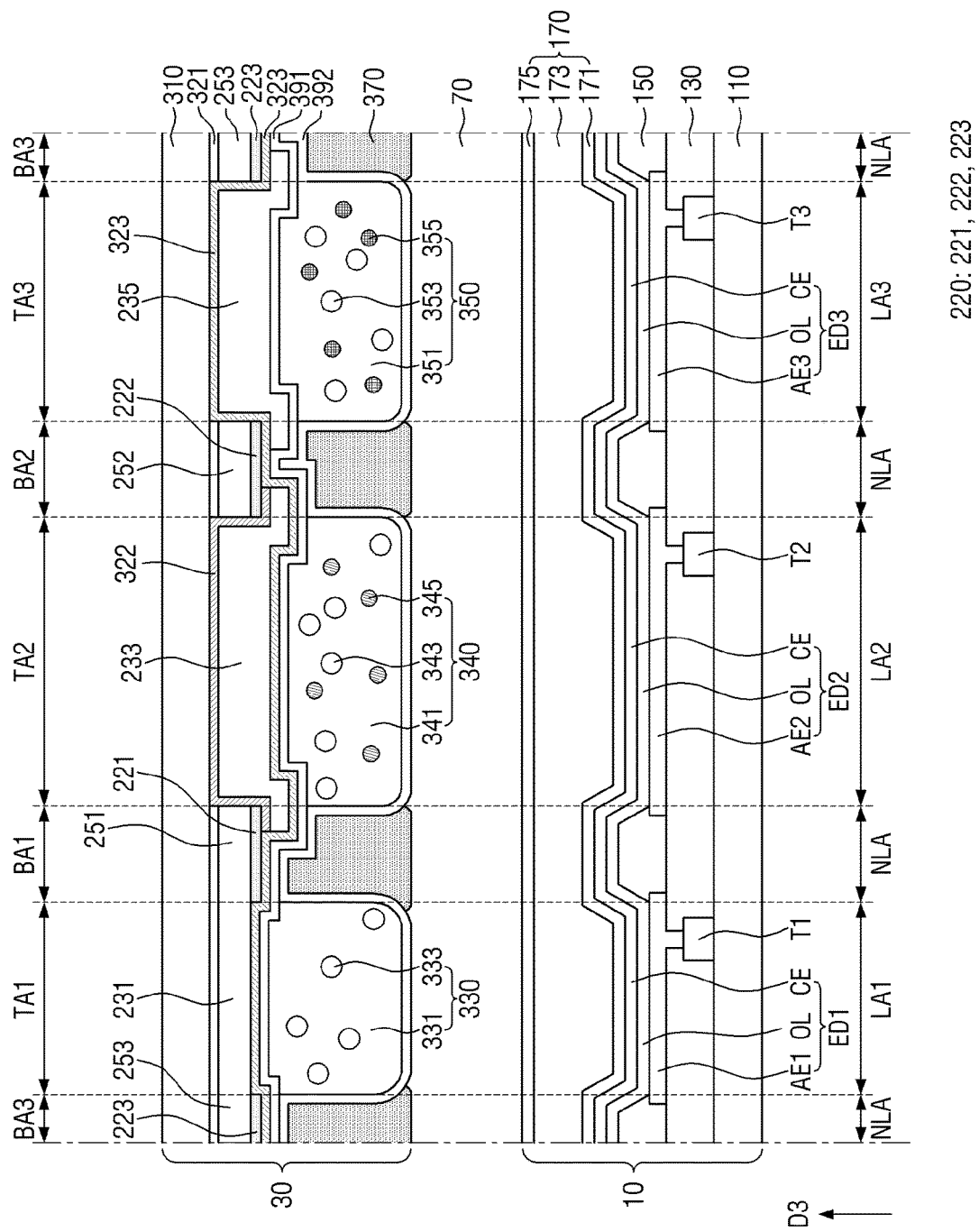
Figure 59:
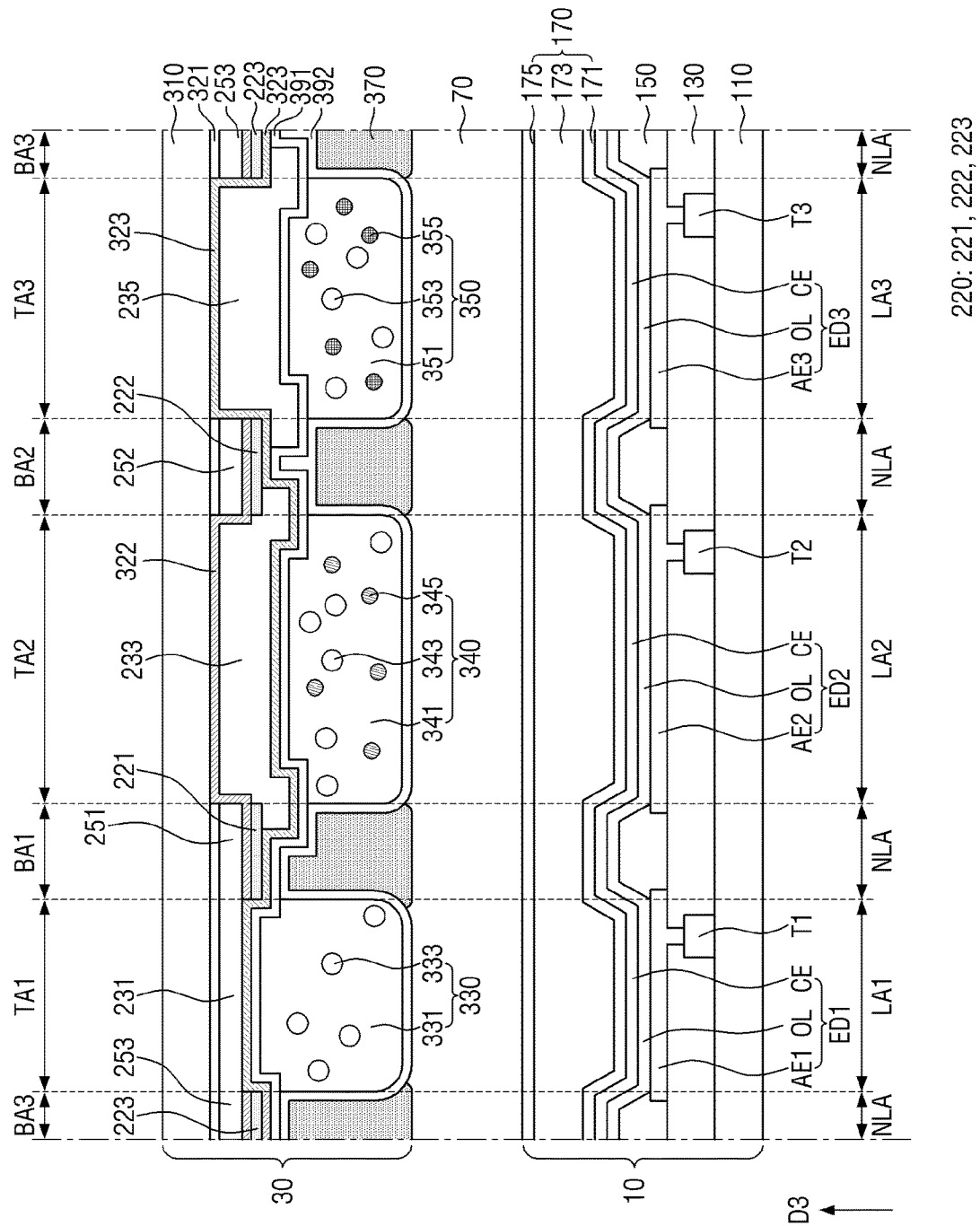

FIGS. 58 and 59 are cross-sectional views schematically illustrating a display device according to still another embodiment taken along line B-B' of FIGS. 3 and 4.

As illustrated in FIG. 58, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 58) of the second substrate 310 in the second light transmitting area TA2. The third stack 323 may contact one surface (a lower surface in FIG. 58) of the second substrate 310 in the third light transmitting area TA3. The configurations other than the configuration of the first stack 321 are substantially the same as or similar to those of FIG. 56 described above, and thus detailed descriptions thereof will be omitted.

According to the illustrated embodiment, the reflectance of external light between the second color filter 233 and the second substrate 310 may be reduced by selectively disposing the second stack 322 between the second color filter 233 and the second substrate 310 in a pattern shape in the second light transmitting area TA2. In addition, the reflectance of external light between the third color filter 235 and the second substrate 310 may be reduced by selectively disposing the third stack 323 between the third color filter 235 and the second substrate 310 in the third light transmitting area TA3.

In addition, as illustrated in FIG. 59, the light blocking member 220 may be disposed on the second stack 322. Similarly to the position of the light blocking member 220 of FIG. 57 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 57, and thus a detailed description thereof will be omitted.

Figure 60:
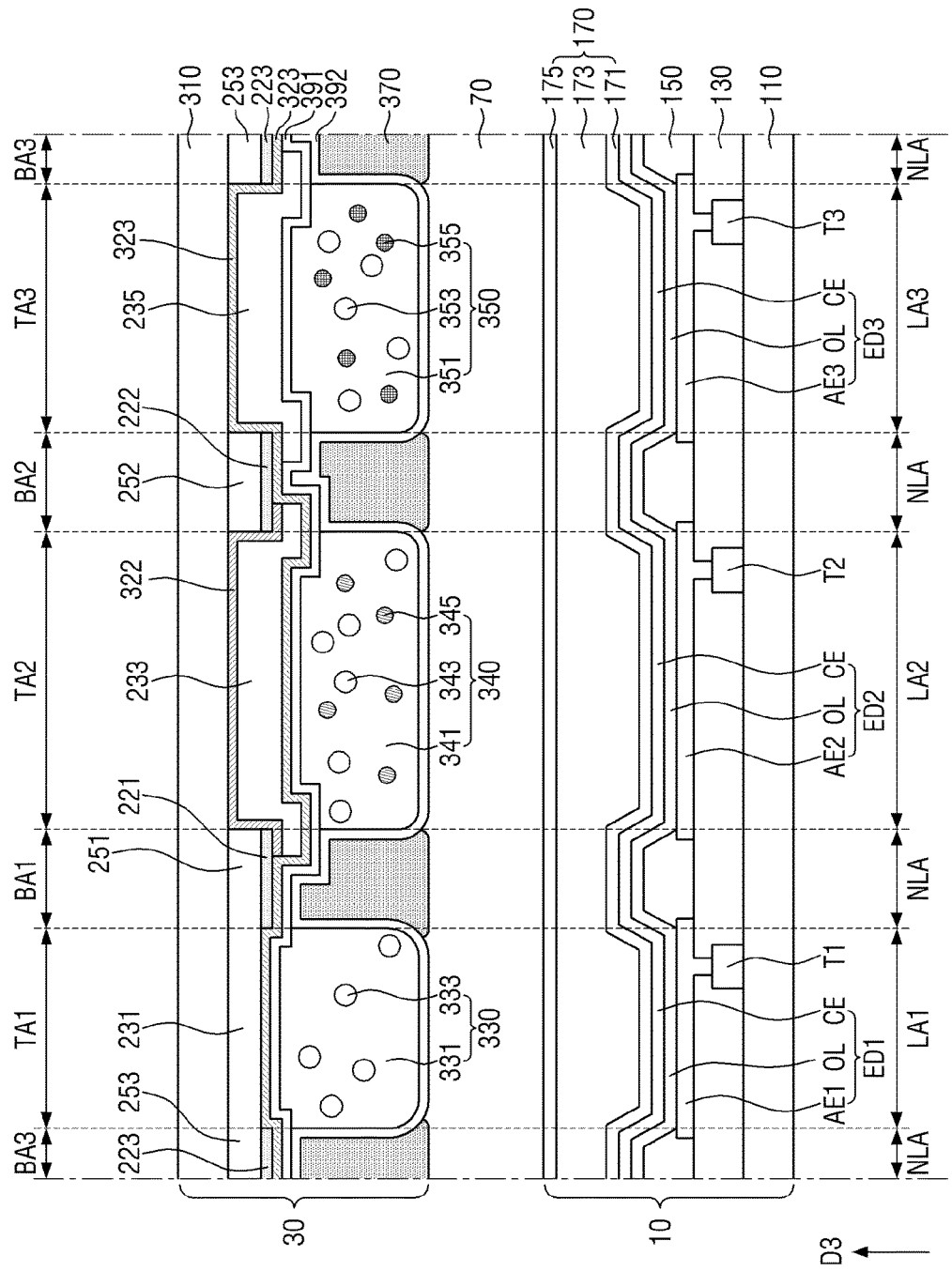
Figure 61:
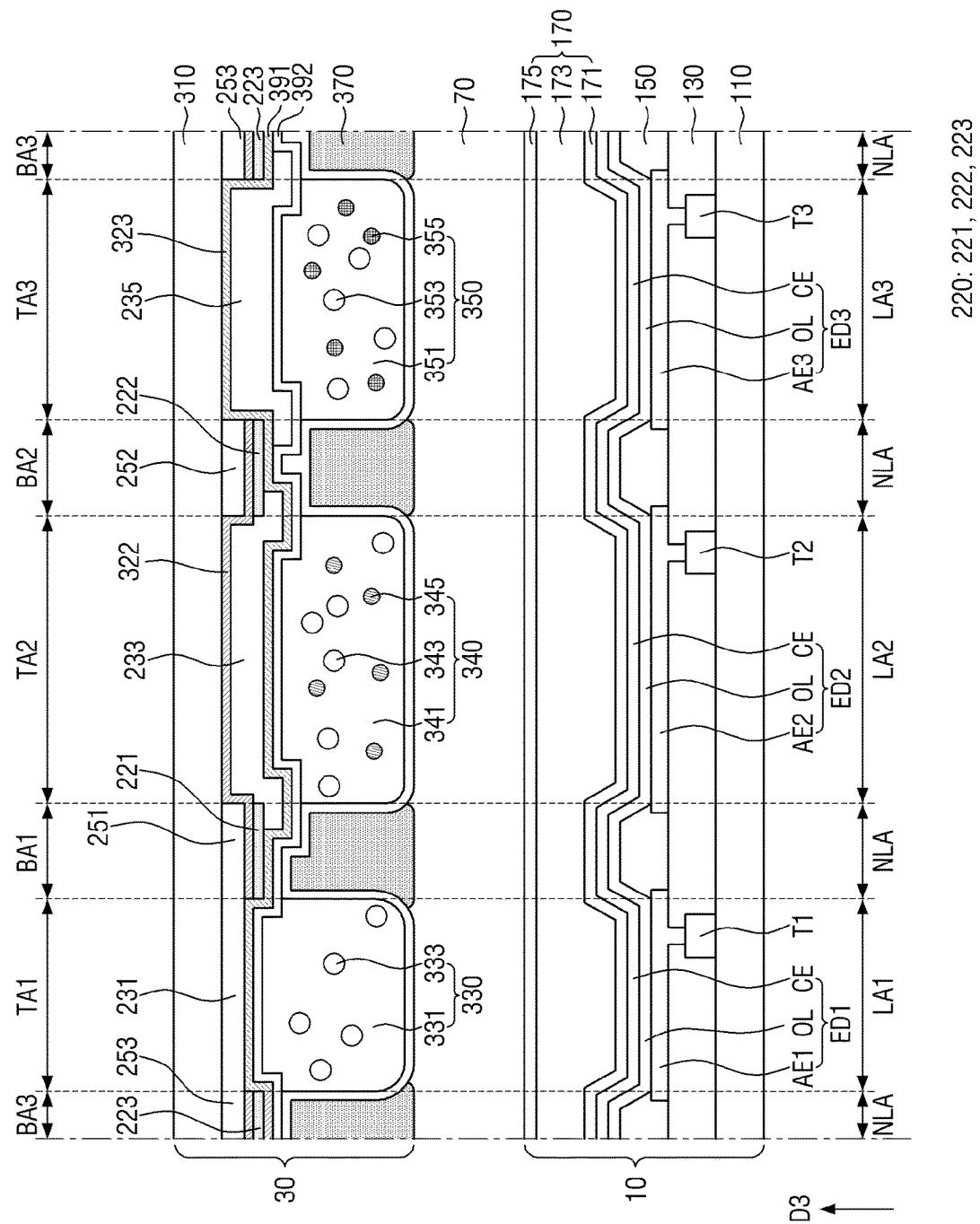

FIGS. 60 and 61 are cross-sectional views schematically illustrating a display device according to still another embodiment taken along line B-B' of FIGS. 3 and 4.

Referring to FIG. 60, the color conversion substrate 30 according to the illustrated embodiment may include the second substrate 310, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 56 described above in that the first stack 321 is omitted, and other configurations are substantially the same or similar. Therefore, a redundant description will be omitted and differences will be mainly described.

Referring to FIG. 60, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 60) of the second substrate 310.

According to an embodiment, the second stack 322 may be in direct contact with one surface (an upper surface in FIG. 60) of the second color filter 233 overlapping the second light transmitting area TA2, and may be in direct contact with one surface (a lower surface in FIG. 60) of the second substrate 310 overlapping the second light transmitting area TA2. The second stack 322 may be in direct contact with one surface (a lower surface of FIG. 60) of each of the first light blocking member 221 and the second light blocking member 222. According to an embodiment, the second stack 322 may not overlap the first light transmitting area TA1, the third light transmitting area TA3, and the third light blocking area BA3.

According to an embodiment, the third stack 323 may be in direct contact with one surface (an upper surface in FIG. 60) of the third color filter 235 overlapping the third light transmitting area TA3, and may be in direct contact with one surface (a lower surface in FIG. 60) of the second substrate 310 overlapping the third light transmitting area TA3. According to an embodiment, the third stack 323 may overlap the first to third light transmitting areas TA1 to TA3 and the first to third light blocking areas BA1 to BA3.

According to the illustrated embodiment, the second stack 322 having a refractive index between the refractive index of the second color filter 233 and the refractive index of the second substrate 310 may be disposed between the second color filter 233 and the second substrate 310. In addition, the third stack 323 having a refractive index between the refractive index of the third color filter 235 and the refractive index of the second substrate 310 may be disposed between the third color filter 235 and the second substrate 310.

That is, the reflectance of external light at the interface between the second color filter 233 and the second substrate 310 and at the interface between the third color filter 235 and the second substrate 310 may be reduced by forming the third stack 323 in a plate shape between the third color filter 235 and the second substrate 310 and selectively forming the second stack 322 in a pattern shape between the second color filter 233 and the second substrate 310. According to the illustrated embodiment, the positions of the second stack 322 and the third stack 323 may be changed from each other.

As illustrated in FIG. 61, the light blocking member 220 may be disposed on the second stack 322. The first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 57, and thus a detailed description thereof will be omitted.

Figure 62:
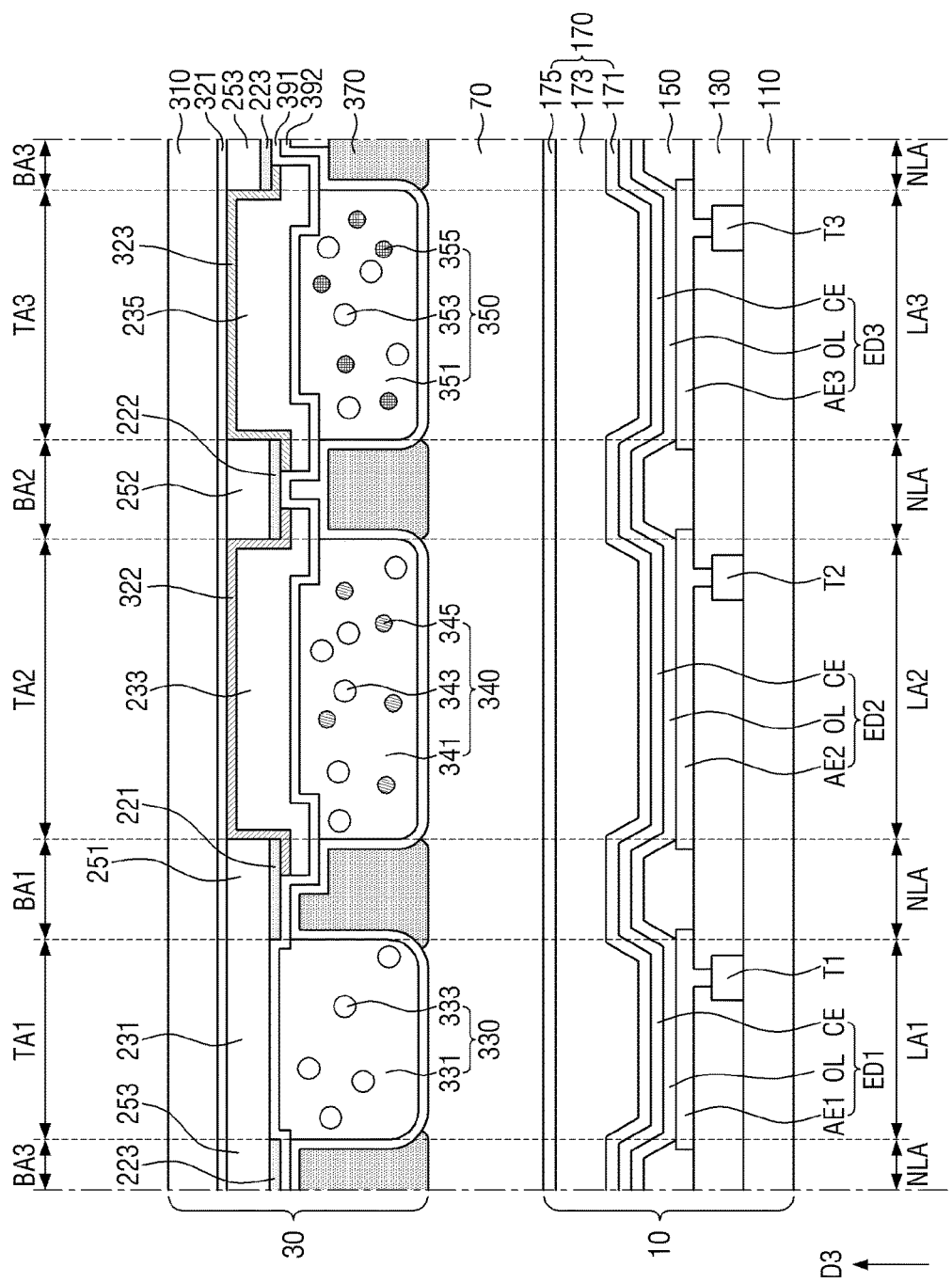
FIGS. 62 to 68 are cross-sectional views schematically illustrating a display device according to still another embodiment taken along line B-B' of FIGS. 3 and 4.

FIG. 62 is a cross-sectional view schematically illustrating a display device according to still another embodiment taken along line B-B' of FIGS. 3 and 4.

Referring to FIG. 62, the color conversion substrate 30 according to the illustrated embodiment may include the second substrate 310, the first stack 321, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 56 described above in that the third stack 323 is patterned, and other configurations are substantially the same or similar. Therefore, a redundant description will be omitted and differences will be mainly described.

As illustrated in FIG. 62, the third stack 323 may be disposed on the first stack 321, the second light blocking member 222, and the third light blocking member 223. The third stack 323 may overlap the first stack 321 disposed in the third light transmitting area TA3.

The third stack 323 may overlap the third light transmitting area TA3 and may be in direct contact with one surface (an upper surface in FIG. 62) of the third color filter 235. The third stack 323 may overlap the second light blocking area BA2 and may contact one surface (a lower surface in FIG. 62) of the second light blocking member 222. The third stack 323 may overlap the third light blocking area BA3 and may be in direct contact with one surface (a lower surface in FIG. 62) of the third light blocking member 223. The third stack 323 may not overlap the first light transmitting area TA1 and the second light transmitting area TA2.

The third stack 323 may be disposed between the first stack 321 and the third color filter 235 to reduce a reflectance of external light at the interface between the first stack 321 and the third color filter 235. The refractive index of the third stack 323 may have a value between the refractive index of the first stack 321 and the refractive index of the third color filter 235. The reflectance of external light incident on the color conversion substrate 30 and reflected may be reduced as the refractive index of the third stack 323 has the value between the refractive index of the first stack 321 and the refractive index of the third color filter 235.

According to the illustrated embodiment, the reflectance of external light in the third light transmitting area TA3 overlapping the third color filter 235 may be reduced as the third stack 323 overlaps the third light transmitting area TA3 and is selectively disposed between the first stack 321 and the third color filter 235 as described above.

Figure 63:
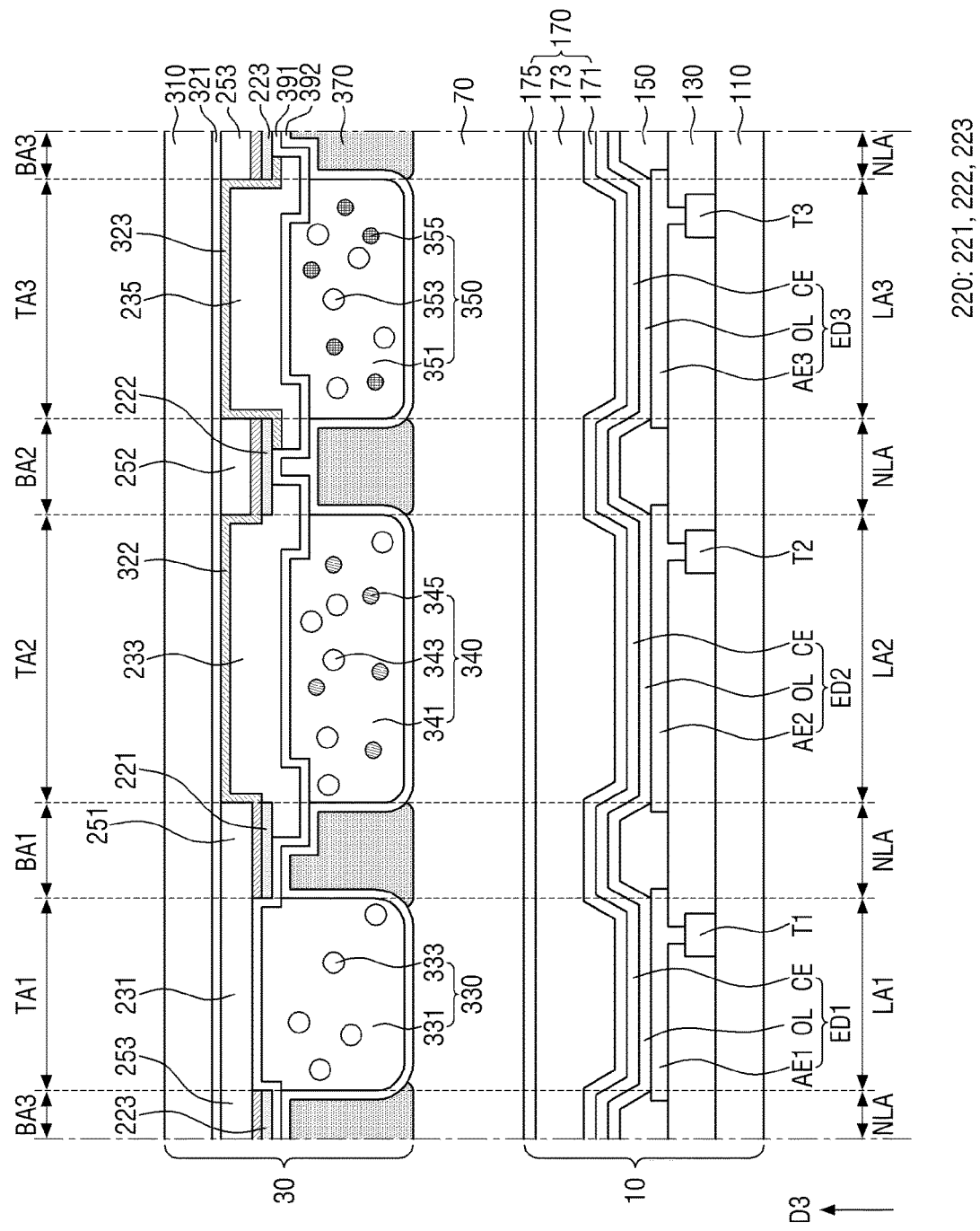

FIG. 63 is a cross-sectional view schematically illustrating a display device according to still another embodiment taken along line B-B' of FIGS. 3 and 4.

Referring to FIG. 63, the color conversion substrate 30 according to the illustrated embodiment may include the second substrate 310, the first stack 321, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 62 described above in that a shape of the third stack 323 and a position of the light blocking member 220 are different, and other configurations are substantially the same or similar. Therefore, a redundant description will be omitted and differences will be mainly described.

As illustrated in FIG. 63, the third stack 323 may be disposed on one surface of the second substrate 310 facing the display substrate 10.

Unlike FIG. 62 described above, the second stack 322 may overlap the first light blocking area BA1, the second light blocking area BA2, the third light blocking area BA3, and the second light transmitting area TA2. Specifically, the third stack 323 may overlap the entirety of the first light blocking area BA1, the second light blocking area BA2, the third light blocking area BA3, and the second light transmitting area TA2.

As illustrated in FIG. 63, the third stack 323 may overlap the second light blocking area BA2 and may contact one surface (a lower surface in FIG. 63) of the second light blocking member 222. The third stack 323 may overlap the third light blocking area BA3 and may contact one surface (a lower surface in FIG. 63) of the third light blocking member 223. The third stack 323 may overlap the third light transmitting area TA3 and may contact one surface (a lower surface in FIG. 63) of the first stack 321 disposed in the third light transmitting area TA3.

According to the illustrated embodiment, the light blocking member 220 may include the first light blocking member 221 overlapping the first light blocking area BA1, the second light blocking member 222 overlapping the second light blocking area BA2, and the third light blocking member 223 overlapping the third light blocking area BA3.

As illustrated in FIG. 63, the light blocking member 220 may be disposed on the second stack 322. Specifically, the first light blocking member 221 may overlap the first light blocking area BA1 and may be disposed on the second stack 322. The first light blocking member 221 may contact one surface (a lower surface in FIG. 63) of the second stack 322. The second light blocking member 222 may overlap the second light blocking area BA2 and may be disposed on the second stack 322. The second light blocking member 222 may contact one surface (a lower surface in FIG. 63) of the second stack 322. The third light blocking member 223 may overlap the third light blocking area BA3 and may be disposed on the second stack 322. The third light blocking member 223 may contact one surface (a lower surface in FIG. 63) of the second stack 322.

The second light blocking member 222 may overlap the second light blocking area BA2 and may be disposed between the second stack 322 and the third stack 323. The second light blocking member 222 may contact one surface (an upper surface in FIG. 63) of the third stack 323. The third light blocking member 223 may overlap the third light blocking area BA3 and may be disposed between the second stack 322 and the third stack 323. The third light blocking member 223 may contact one surface (an upper surface in FIG. 63) of the third stack 323.

The light blocking member 220 may overlap the light blocking area BA to block transmission of light. According to the illustrated embodiment, the light blocking member 220 may be disposed on the second substrate 310 to be more adjacent to the display substrate 10 from which light is emitted, thereby preventing an occurrence of color mixing due to permeation of light between adjacent light transmitting areas, and accordingly, a color reproduction rate may be further improved.

Figure 64:
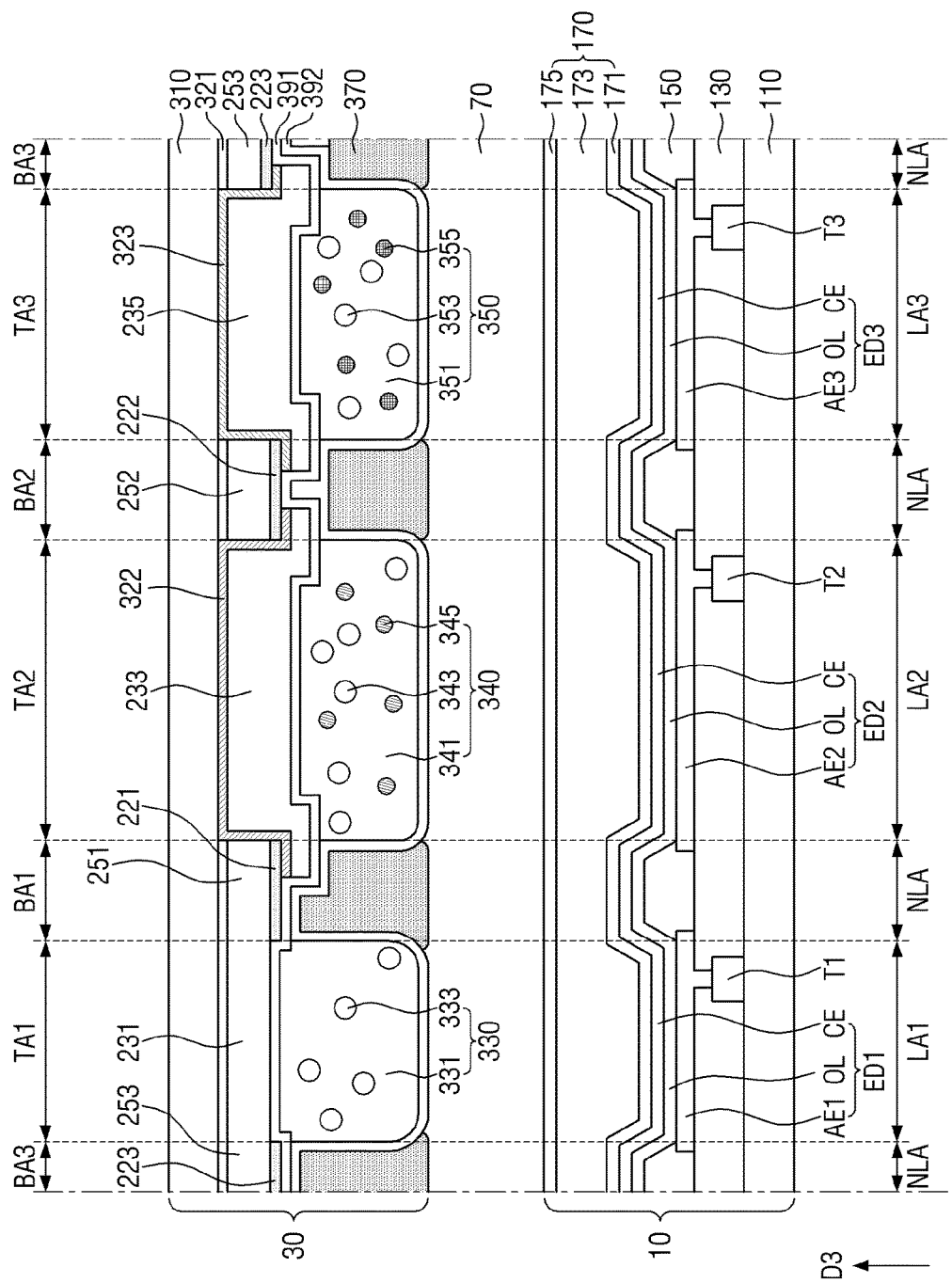
Figure 65:
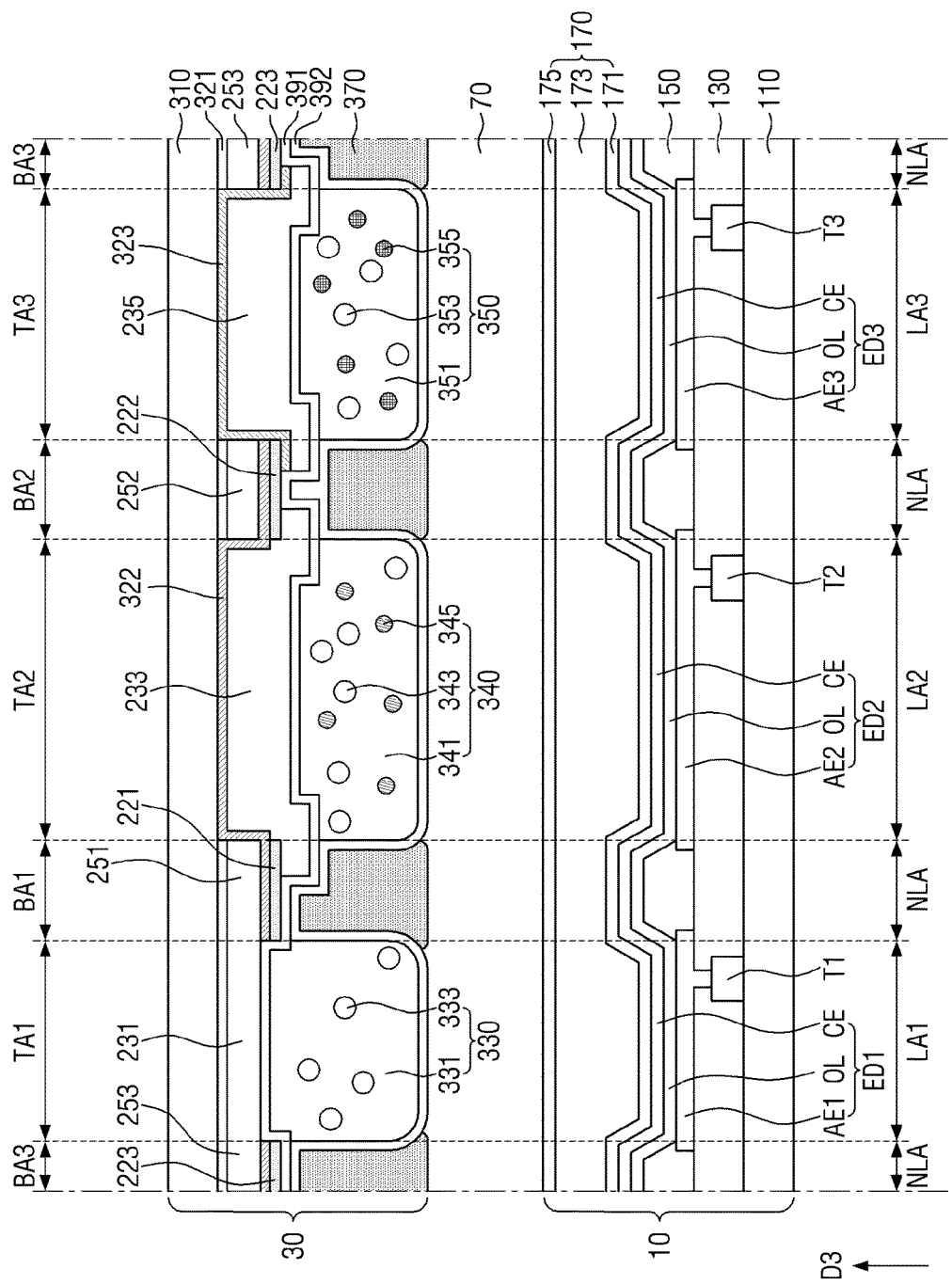

FIGS. 64 and 65 are cross-sectional views schematically illustrating a display device according to still another embodiment taken along line B-B' of FIGS. 3 and 4.

As illustrated in FIG. 64, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The second stack 322 may be in direct contact with one surface (a lower surface in FIG. 64) of the second substrate 310 in the second light transmitting area TA2. The third stack 323 may contact one surface (a lower surface in FIG. 64) of the second substrate 310 in the third light transmitting area TA3. The configurations other than the configuration of the first stack 321 are substantially the same as or similar to those of FIG. 62 described above, and thus detailed descriptions thereof will be omitted.

According to the illustrated embodiment, the reflectance of external light between the second color filter 233 and the second substrate 310 may be reduced by selectively disposing the second stack 322 between the second color filter 233 and the second substrate 310 in a pattern shape in the second light transmitting area TA2. In addition, the reflectance of external light between the third color filter 235 and the second substrate 310 may be reduced by selectively disposing the third stack 323 between the third color filter 235 and the second substrate 310 in the third light transmitting area TA3.

In addition, as illustrated in FIG. 65, the light blocking member 220 may be disposed on the second stack 322. Similarly to the position of the light blocking member 220 of FIG. 63 described above, the first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 63, and thus a detailed description thereof will be omitted.

Figure 66:
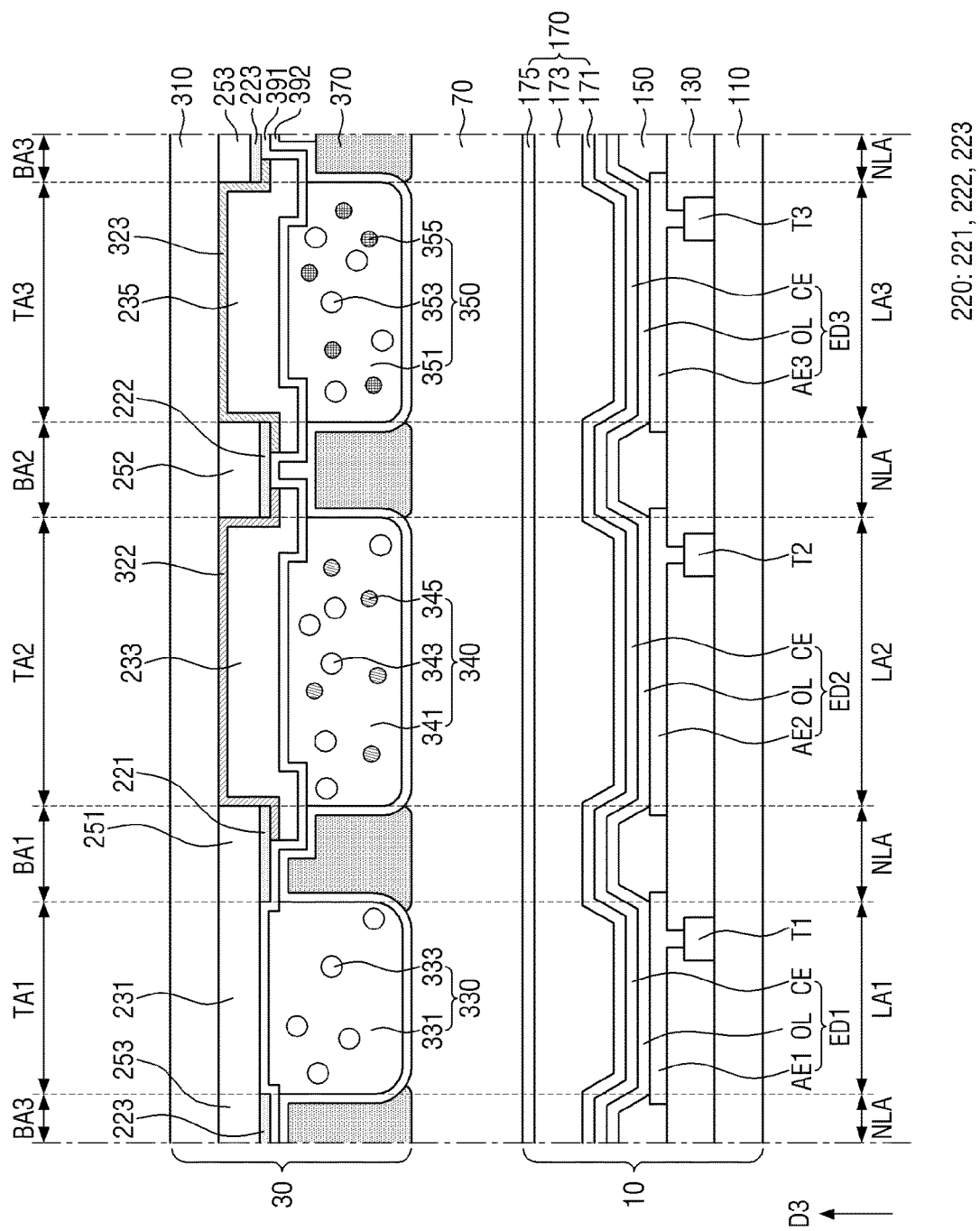
Figure 67:
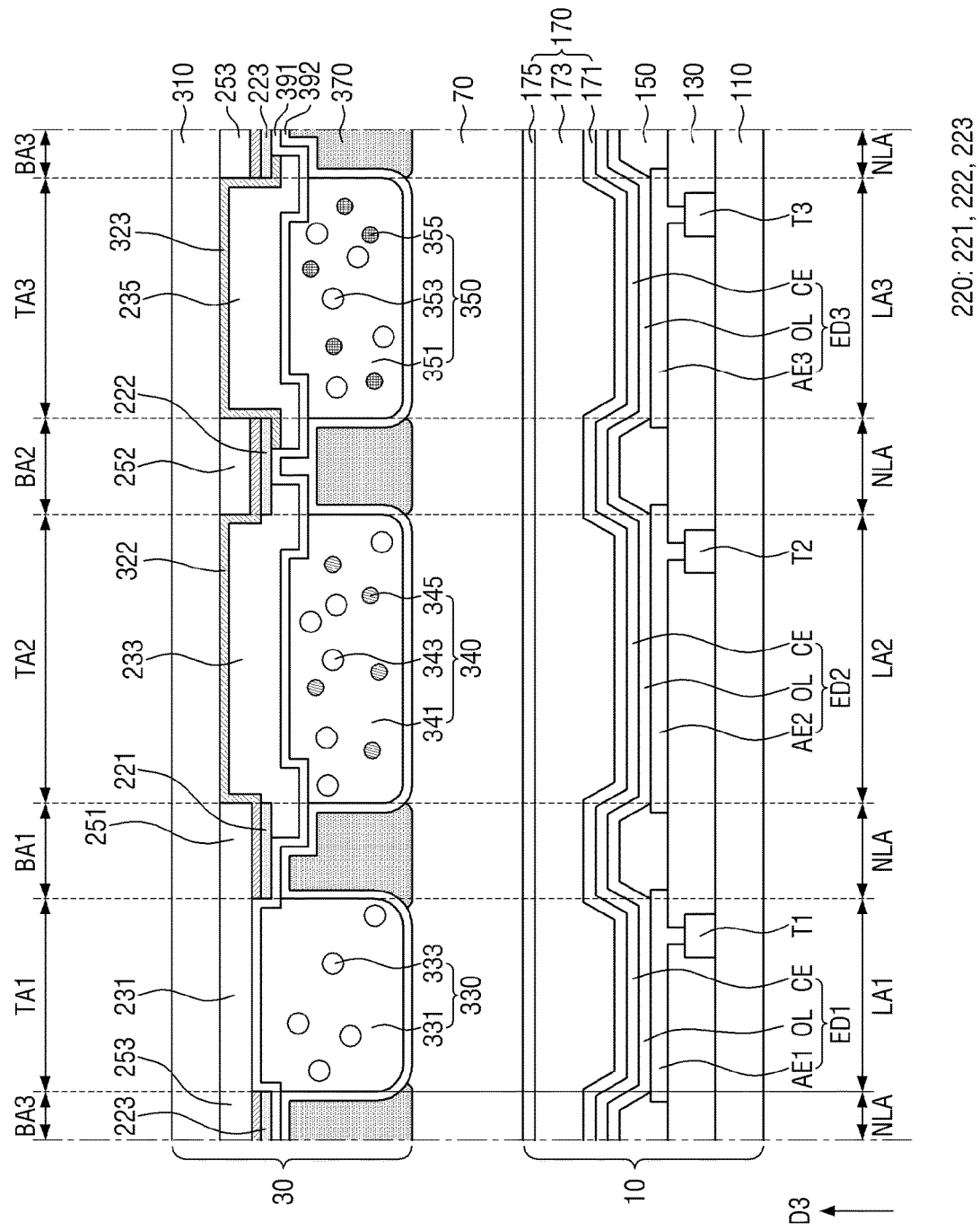

FIGS. 66 and 67 are cross-sectional views schematically illustrating a display device according to still another embodiment taken along line B-B' of FIGS. 3 and 4.

Referring to FIG. 66, the color conversion substrate 30 according to the illustrated embodiment may include the second substrate 310, the color filters 231, 233, and 235, the light blocking member 220, the second stack 322, the third stack 323, the light transmission pattern 330, the first wavelength conversion pattern 340, and the second wavelength conversion pattern 350. In particular, the illustrated embodiment is different from the embodiment of FIG. 62 described above in that the first stack 321 is omitted, and other configurations are substantially the same or similar. Therefore, a redundant description will be omitted and differences will be mainly described.

Referring to FIG. 66, the first color filter 231, the first color pattern 251, the second color pattern 252, and the third color pattern 253 may be disposed on one surface of the second substrate 310 facing the display substrate 10. The first color filter 231, the first color pattern 251, the second color pattern 252, and the third color pattern 253 may be in direct contact with one surface (a lower surface in FIG. 66) of the second substrate 310.

According to an embodiment, the second stack 322 may be in direct contact with one surface (an upper surface in FIG. 66) of the second color filter 233 overlapping the second light transmitting area TA2, and may be in direct contact with one surface (a lower surface in FIG. 66) of the second substrate 310 overlapping the second light transmitting area TA2. The second stack 322 may be in direct contact with one surface (a lower surface of FIG. 66) of each of the first light blocking member 221 and the second light blocking member 222. According to an embodiment, the second stack 322 may not overlap the first light transmitting area TA1, the third light transmitting area TA3, and the third light blocking area BA3.

According to an embodiment, the third stack 323 may be in direct contact with one surface (an upper surface in FIG.

66) of the third color filter 235 overlapping the third light transmitting area TA3, and may be in direct contact with one surface (a lower surface in FIG. 66) of the second substrate 310 overlapping the third light transmitting area TA3. According to an embodiment, the third stack 323 may not overlap the first light transmitting area TA1, the second light transmitting area TA2, and the first light blocking area BA1.

According to the illustrated embodiment, the second stack 322 having a refractive index between the refractive index of the second color filter 233 and the refractive index of the second substrate 310 may be disposed between the second color filter 233 and the second substrate 310. In addition, the third stack 323 having a refractive index between the refractive index of the third color filter 235 and the refractive index of the second substrate 310 may be disposed between the third color filter 235 and the second substrate 310.

That is, the reflectance of external light at the interface between the second color filter 233 and the second substrate 310 and at the interface between the third color filter 235 and the second substrate 310 may be reduced by selectively forming the third stack 323 in a pattern shape between the third color filter 235 and the second substrate 310 and selectively forming the second stack 322 in a pattern shape between the second color filter 233 and the second substrate 310. According to the illustrated embodiment, the positions of the second stack 322 and the third stack 323 may be changed from each other.

As illustrated in FIG. 67, the light blocking member 220 may be disposed on the second stack 322. The first light blocking member 221 may overlap the first light blocking area BA1 and may be disposed on the second stack 322, the second light blocking member 222 may overlap the second light blocking area BA2 and may be disposed on the second stack 322, and the third light blocking member 223 may overlap the third light blocking area BA3 and may be disposed on the second stack 322. The position and configuration of the light blocking member 220 is substantially the same as or similar to the description of FIG. 63, and thus a detailed description thereof will be omitted.

Figure 68:
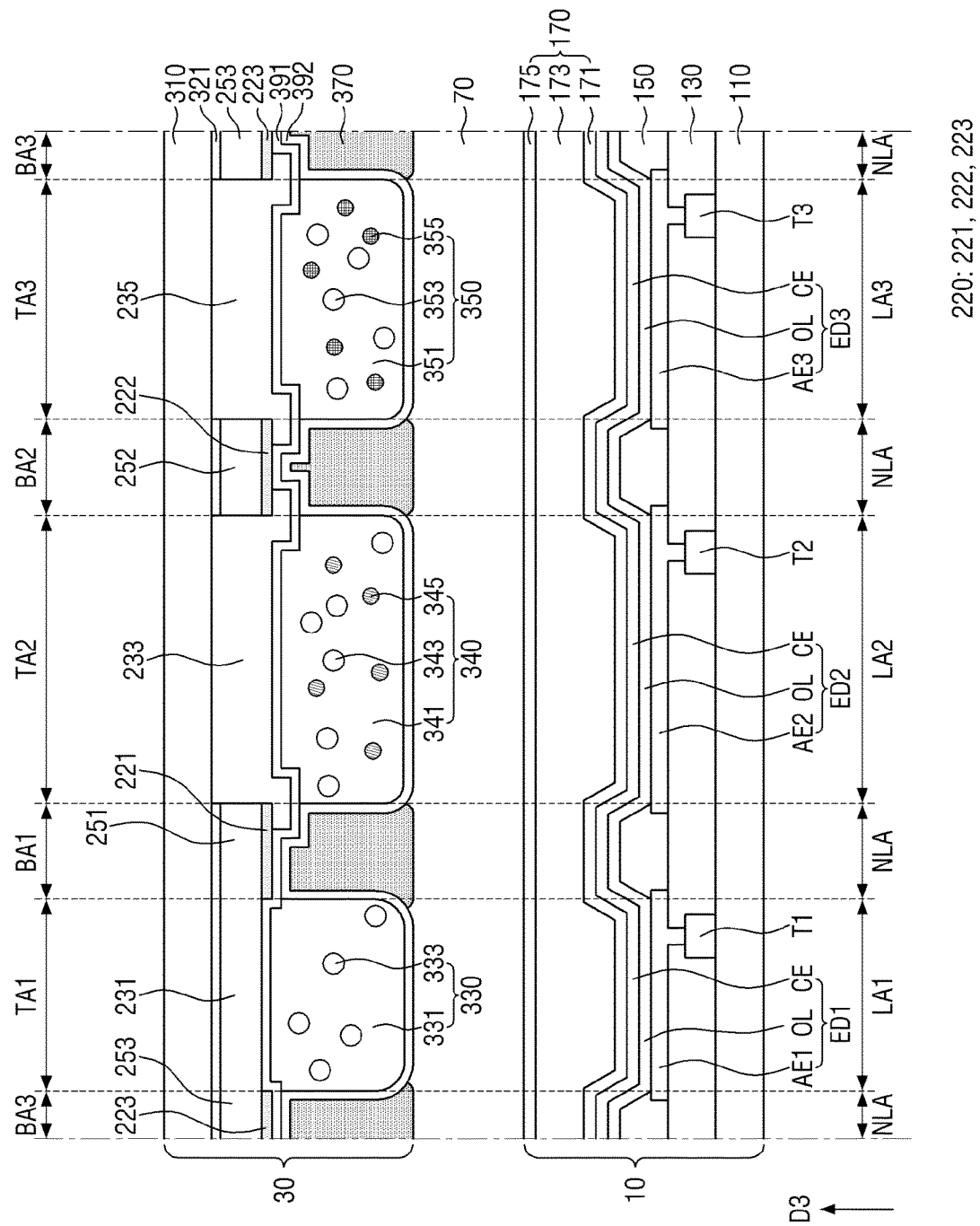

FIG. 68 is a cross-sectional view schematically illustrating a display device according to still another embodiment taken along line B-B' of FIGS. 3 and 4.

As illustrated in FIG. 68, the first stack 321 may be disposed in the remaining areas other than the second light transmitting area TA2 and the third light transmitting area TA3, that is, the first light transmitting area TA1, the first light blocking area BA1, the second light blocking area BA2, and the third light blocking area BA3. The color conversion substrate 30 illustrated in FIG. 68 is different from the color conversion substrate 30 of FIG. 13 in that the second stack 322 is omitted from the color conversion substrate 30 of FIG. 13. Therefore, the configurations other than the second stack 322 in the color conversion substrate 30 of FIG. 13 are substantially the same as or similar to those of FIG. 13, and thus detailed description thereof will be omitted.

As illustrated in FIG. 68, the second color filter 233 may be disposed between the second substrate 310 and the first capping layer 391 in the second light transmitting area TA2. The second color filter 233 may be in direct contact with one surface (a lower surface in FIG. 68) of the second substrate 310 in the second light transmitting area TA2 and may be in direct contact with one surface (an upper surface in FIG. 68) of the first capping layer 391.

According to an embodiment, the second color filter 233 may contact one surface (a lower surface in FIG. 68) of the first light blocking member 221 overlapping the first light blocking area BA1, and may contact one surface (a lower surface in FIG. 68) of the second light blocking member 222 overlapping the second light blocking area BA2.

The third color filter 235 may be disposed between the second substrate 310 and the first capping layer 391 in the third light transmitting area TA3. The third color filter 235 may be in direct contact with one surface (a lower surface in FIG. 68) of the second substrate 310 in the third light transmitting area TA3 and may be in direct contact with one surface (an upper surface in FIG. 68) of the first capping layer 391.

According to an embodiment, the third color filter 235 may contact one surface (a lower surface in FIG. 68) of the second light blocking member 222 overlapping the second light blocking area BA2, and may contact one surface (a lower surface in FIG. 68) of the third light blocking member 223 overlapping the third light blocking area BA3.

The second color filter 233 and the third color filter 235 may be respectively formed in a pattern shape and may not overlap each other. The second color filter 233 may not overlap the first light transmitting area TA1 and the third light transmitting area TA3. The third color filter 235 may not overlap the first light transmitting area TA1 and the second light transmitting area TA2.

According to the illustrated embodiment, the reflectance of external light between the first light transmitting area TA1 and the second substrate 310, between the first color pattern 251 and the second substrate 310, between the second color pattern 252 and the second substrate 310, and between the third color pattern 253 and the second substrate 310 may be reduced by forming the first stack 321 between each of the first light transmitting area TA1, the first color pattern 251, the second color pattern 252, and the third color pattern 253 and the second substrate 310.

Figure 69:
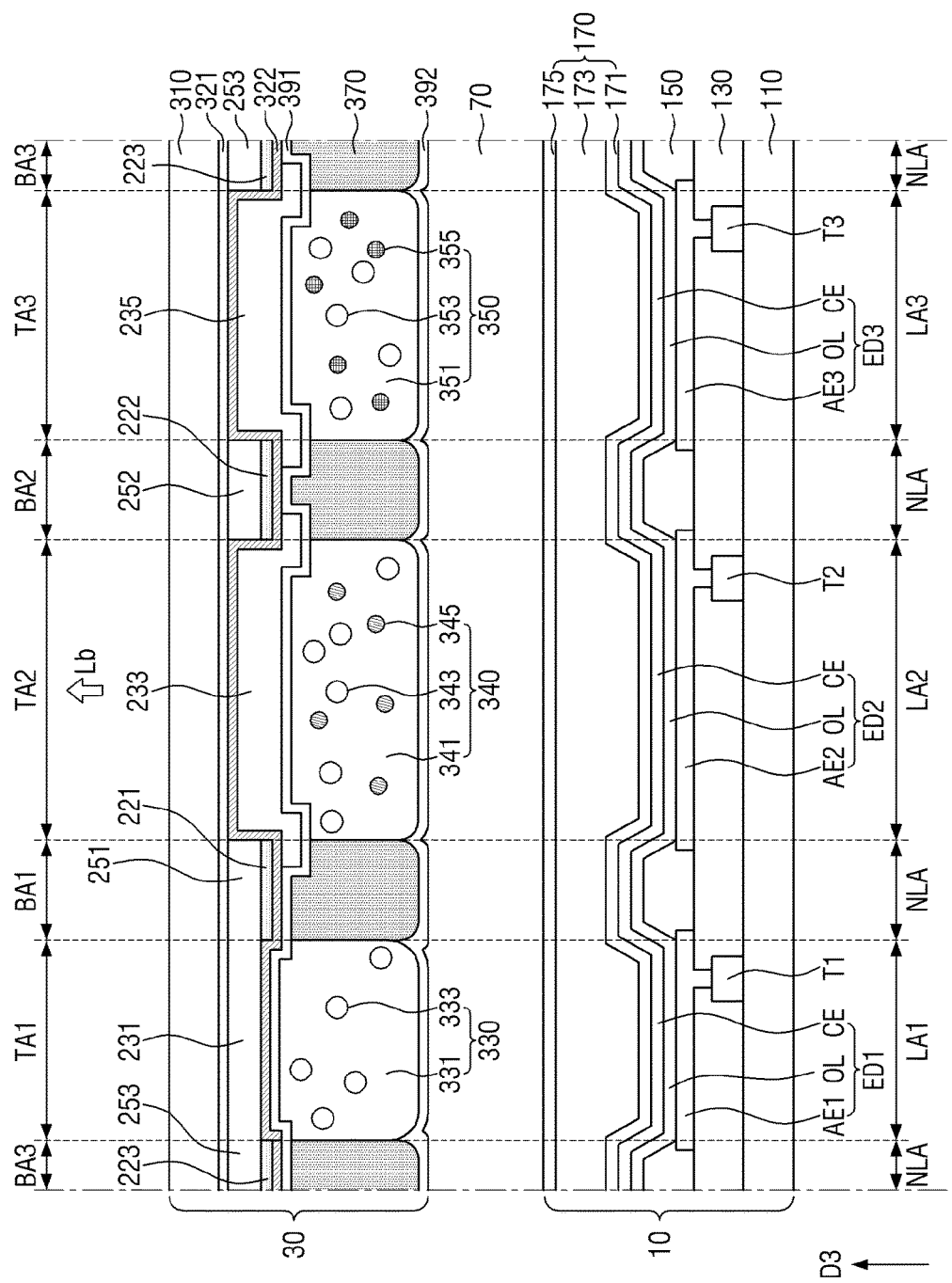
FIG. 69 is a cross-sectional view schematically illustrating a display device according to still another embodiment taken along line B-B' of FIGS. 3 and 4.

FIG. 69 is a cross-sectional view schematically illustrating a display device according to still another embodiment taken along line B-B' of FIGS. 3 and 4.

An embodiment of FIG. 69 is different from the embodiment of FIG. 11 in that the arrangement of the light transmission pattern 330, the first wavelength conversion pattern 340, the second wavelength conversion pattern 350, the color mixing preventing member 370, and the second capping layer 392 is different.

Referring to FIG. 69, the light transmission pattern 330, the first wavelength conversion pattern 340, and the second wavelength conversion pattern 350 may be disposed on the first capping layer 391. The light transmission pattern 330, the first wavelength conversion pattern 340, and the second wavelength conversion pattern 350 may be disposed to contact one surface (a lower surface in FIG. 69) of the first capping layer 391. The color mixing preventing member 370 may be disposed on the first capping layer 391. The color mixing preventing member 370 may be disposed on the same plane as the light transmission pattern 330, the first wavelength conversion pattern 340, and the second wavelength conversion pattern 350. According to an embodiment, the color mixing preventing member 370 may be disposed to contact a lower surface of the first capping layer 391.

The second capping layer 392 may be disposed on the first wavelength conversion pattern 340, the second wavelength conversion pattern 350, and the color mixing preventing member 370. The second capping layer 392 may cover one surface (a lower surface in FIG. 69) of each of the light transmission pattern 330, the first wavelength conversion pattern 340, the second wavelength conversion pattern 350, and the color mixing preventing member 370.

In the color conversion substrate 30 according to an embodiment, the light transmission pattern 330, the first wavelength conversion pattern 340, and the second wavelength conversion pattern 350 may be formed by an inkjet process. In an embodiment, after the color mixing preventing members 370 are patterned and formed on the color conversion substrate 30 on which the first capping layer 391 is disposed, each of the light transmission pattern 330, the first wavelength conversion pattern 340, and the second wavelength conversion pattern 350 may be formed in the first light transmitting area TA1, the second light transmitting area TA2, and the third light transmitting area TA3 defined between the color mixing preventing members 370 by an inkjet process, for example. Thereafter, the color conversion substrate 30 may be manufactured by forming the second capping layer 392. The embodiment of FIG. 69 is not limited thereto, and may be applied to each of the above-described embodiments.

Figure 70:
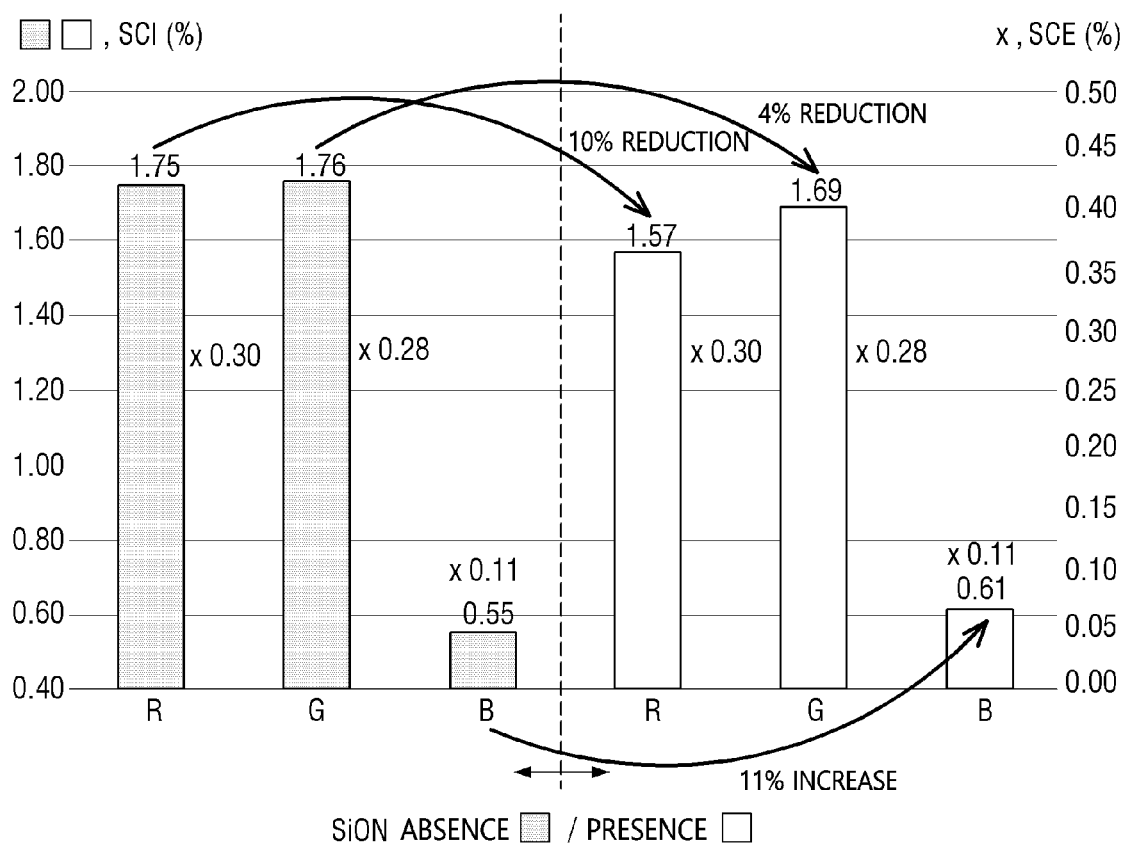
FIG. 70 is a graph illustrating SCI and SCE according to whether or not the color conversion substrate includes a SiON film.

FIG. 70 is a graph illustrating SCI and SCE according to whether or not the color conversion substrate includes a SiON film.

The color conversion substrate used in FIG. 70 is the color conversion substrate illustrated in FIG. 16 described above, and includes a SiON film as the second stack 322. An anti-reflection film was attached to an outer surface of the second substrate of the color conversion substrate. The reflectance was measured using a CA-3700 reflectance measuring instrument. SCI (specular component included) is a reflectance including specular light, and SCE (specular component excluded) is a reflectance from which specular light is removed. An SCI value was indicated on an upper side of a bar, and an SCE value was indicated by adding an x in front of the number on the bar.

Referring to FIG. 70, when the SiON film, which is the second stack, was not provided, an SCI value was measured to be 1.75% and an SCE value was measured to be 0.30% in an R color filter region. In a G color filter region, the SCI value was measured to be 1.76% and the SCE value was measured to be 0.28%. In a B color filter region, the SCI value was measured to be 0.55% and the SCE value was measured to be 0.11%.

When the SiON film, which is the second stack, is provided, the SCI value was measured to be 1.57% and the SCE value was measured to be 0.30% in the R color filter region, and the SCI value was reduced by about 10%. In the G color filter region, the SCI value was measured to be 1.69% and the SCE value was measured to be 0.28%, and the SCI value was reduced by about 4%. Here, in the B color filter region in which the SiON film is not provided, the SCI value was measured to be 0.61% and the SCE value was measured to be 0.11%, and the SCI value was increased by about 11%.

Through this, it may be confirmed that the SCI value was reduced in the R and G color filter regions in which the SiON layer is provided between the color filter and the second substrate.

As described above, the color conversion substrate according to the embodiments has an advantage of reducing the reflectance of external light.

What is claimed is:

1. A color conversion substrate comprising:
   a substrate on which a first light transmitting area, a second light transmitting area, and a third light transmitting area are defined;
   a first stack disposed on the substrate and overlapping the first light transmitting area, the second light transmitting area, and the third light transmitting area;
   a first color filter, a second color filter, and a third color filter disposed on the first stack, the first color filter overlapping the first light transmitting area, the second color filter overlapping the second light transmitting area, and the third color filter overlapping the third light transmitting area; and
   a second stack disposed between at least one of the second color filter and the third color filter and the first stack,
   a refractive index of the first stack has a value between a refractive index of the substrate and a refractive index of the first color filter, and
   the refractive index of the first stack is smaller than a refractive index of the second stack.

2. The color conversion substrate of claim 1, wherein the second stack extends from at least one of the second light transmitting area and the third light transmitting area and overlaps the first light transmitting area.

3. The color conversion substrate of claim 1, wherein the second stack is disposed between the first stack and the second color filter in the second light transmitting area, and is disposed between the first stack and the third color filter in the third light transmitting area.

4. The color conversion substrate of claim 1, wherein the second stack is disposed between the first stack and the second color filter in the second light transmitting area, and does not overlap the first light transmitting area and the third light transmitting area.

5. The color conversion substrate of claim 4, further comprising a third stack disposed on the first stack,
   wherein the third stack is disposed between the first stack and the third color filter in the third light transmitting area.

6. The color conversion substrate of claim 5, wherein the third stack extends from the third light transmitting area and overlaps the first light transmitting area and the second light transmitting area.

7. The color conversion substrate of claim 6, wherein a refractive index of the third stack has a value between the refractive index of the first stack and a refractive index of the third color filter.

8. A color conversion substrate comprising:
   a substrate on which a first light transmitting area, a second light transmitting area, and a third light transmitting area are defined;
   a first color filter disposed on the substrate and overlapping the first light transmitting area, a second color filter disposed on the substrate and overlapping the second light transmitting area, and a third color filter disposed on the substrate and overlapping the third light transmitting area; and
   a second stack disposed between at least one of the second color filter and the third color filter and the substrate,
   wherein a refractive index of the second stack has a value between a refractive index of the substrate and a refractive index of at least one of the second color filter and the third color filter.

9. The color conversion substrate of claim 8, further comprising a first stack overlapping the first light transmitting area, disposed between the substrate and the first color filter, and non-overlapping the second light transmitting area and the third light transmitting area.

10. The color conversion substrate of claim 9, wherein the second stack extends from at least one of the second light transmitting area and the third light transmitting area and overlaps the first light transmitting area.

11. The color conversion substrate of claim 10, wherein a refractive index of the first stack has a value between the refractive index of the substrate and a refractive index of the first color filter, and the refractive index of the first stack is smaller than the refractive index of the second stack.

12. The color conversion substrate of claim 10, wherein the second stack is disposed between the substrate and the second color filter in the second light transmitting area, and is disposed between the substrate and the third color filter in the third light transmitting area.

13. The color conversion substrate of claim 8, wherein the second stack is disposed between the substrate and the second color filter in the second light transmitting area, and does not overlap the first light transmitting area and the third light transmitting area.

14. The color conversion substrate of claim 13, further comprising a third stack disposed on the substrate, wherein the third stack is disposed between the substrate and the third color filter in the third light transmitting area.

15. The color conversion substrate of claim 14, wherein the third stack extends from the third light transmitting area and overlaps the first light transmitting area and the second light transmitting area.

16. The color conversion substrate of claim 15, wherein a refractive index of the third stack has a value between the refractive index of the substrate and a refractive index of the third color filter.

17. A display device comprising:
a substrate on which a first light transmitting area, a second light transmitting area, and a third light transmitting area are defined;
a first color filter, a second color filter, and a third color filter disposed on the substrate, the first color filter overlapping the first light transmitting area, the second color filter overlapping the second light transmitting area, and the third color filter overlapping the third light transmitting area;
a second stack disposed between at least one of the first color filter, the second color filter, and the third color filter and the substrate; and
a first stack disposed between the substrate and the second stack and overlapping the first light transmitting area, the second light transmitting area, and the third light transmitting area,
a refractive index of the first stack has a value between a refractive index of the substrate and a refractive index of the first color filter, and
the refractive index of the first stack is smaller than a refractive index of the second stack.

18. The display device of claim 17, further comprising a third stack disposed on the substrate,
wherein the third stack is disposed between the substrate and the third color filter in the third light transmitting area.

19. The display device of claim 18, wherein the third stack extends from the third light transmitting area and overlaps the first light transmitting area and the second light transmitting area.

20. The display device of claim 19, wherein a refractive index of the third stack has a value between the refractive index of the substrate and a refractive index of the third color filter.

21. The display device of claim 17, further comprising:
a light transmission pattern disposed on the first color filter and overlapping the first light transmitting area;
a first wavelength conversion pattern disposed on the second color filter and overlapping the second light transmitting area; and
a second wavelength conversion pattern disposed on the third color filter and overlapping the third light transmitting area.

22. The display device of claim 21, wherein the first wavelength conversion pattern and the second wavelength conversion pattern include a base resin, and a wavelength shifter and a scatterer dispersed in the base resin, and
the wavelength shifter is a quantum dot.

* * * * *